US012675048B2

(12) United States Patent
Fisher et al.

(10) Patent No.: US 12,675,048 B2
(45) Date of Patent: Jul. 7, 2026

(54) FLOW CELLS AND METHODS FOR MAKING THE SAME

(71) Applicant: ILLUMINA, INC., San Deigo, CA (US)

(72) Inventors: Jeffrey S. Fisher, San Diego, CA (US); Tanmay Ghonge, San Diego, CA (US); Sahngki Hong, San Diego, CA (US); Lewis J Kraft, San Diego, CA (US)

(73) Assignee: Illumina, Inc., San Diego, CA (US)

( * ) Notice: Subject to any disclaimer, the term of this patent is extended or adjusted under 35 U.S.C. 154(b) by 858 days.

(21) Appl. No.: 18/068,229

(22) Filed: Dec. 19, 2022

(65) Prior Publication Data

US 2023/0259034 A1 Aug. 17, 2023

Related U.S. Application Data

(60) Provisional application No. 63/292,340, filed on Dec. 21, 2021.

(51) Int. Cl.
*G03F 7/20* (2006.01)
*B29C 59/02* (2006.01)
*G03F 7/00* (2006.01)

(52) U.S. Cl.
CPC .......... *G03F 7/2026* (2013.01); *G03F 7/0002* (2013.01); *G03F 7/0035* (2013.01); *B29C 59/026* (2013.01)

(58) Field of Classification Search
CPC .... G03F 7/0002; G03F 7/0035; G03F 7/2022; G03F 7/2026
See application file for complete search history.

(56) References Cited

U.S. PATENT DOCUMENTS

| | | | |
|---|---|---|---|
| 9,982,294 | B2 | 5/2018 | Fabani et al. |
| 2015/0111256 | A1 | 4/2015 | Church et al. |
| 2018/0030529 | A1 | 2/2018 | Nashtaali et al. |

(Continued)

FOREIGN PATENT DOCUMENTS

| | | | |
|---|---|---|---|
| WO | 2017201198 A1 | | 11/2017 |
| WO | 2020005503 A1 | | 1/2020 |
| WO | WO 2020-005503 | * | 1/2020 |

(Continued)

*Primary Examiner* — Brittany L Raymond
(74) *Attorney, Agent, or Firm* — Dierker & Kavanaugh, P.C.

(57) ABSTRACT

In a method, a resin layer of a stack (e.g., resin layer over sacrificial layer over transparent substrate) is imprinted to form a convex region including first region with first height and second region with second height <first height. Stack portions are etched around the convex region to expose a substrate portion. The stack is utilized to develop a curable layer to define a cured layer over the exposed substrate portion. The convex region and cured layer are etched. The resin layer and a sacrificial layer portion underlying the second region are removed. A second substrate portion is exposed and a third substrate portion remains covered by a remaining sacrificial layer portion. The cured layer is substantially co-planar with the remaining sacrificial layer portion. A depression is formed extending to the second substrate portion. The remaining sacrificial layer portion is utilized to define functionalized layers over different depression regions.

8 Claims, 14 Drawing Sheets

Specification includes a Sequence Listing.

(56) References Cited

U.S. PATENT DOCUMENTS

2018/0371535 A1 12/2018 Bowen et al.

FOREIGN PATENT DOCUMENTS

| | | | |
|---|---|---|---|
| WO | 2021127357 | A2 | 6/2021 |
| WO | WO 2021-127357 | * | 6/2021 |
| WO | 2022072274 | A1 | 4/2022 |
| WO | 2022072275 | A1 | 4/2022 |

* cited by examiner

FLOW CELLS AND METHODS FOR MAKING THE SAME

CROSS REFERENCE TO RELATED APPLICATION

This application claims the benefit of U.S. Provisional Application Ser. No. 63/292,340, filed Dec. 21, 2021, the contents of which is incorporated by reference herein in its entirety.

REFERENCE TO SEQUENCE LISTING

The Sequence Listing submitted herewith is hereby incorporated by reference in its entirety. The name of the file is ILI227B_IP-2236-US_Sequence_Listing.xml, the size of the file is 2,782 bytes, and the date of creation of the file is Dec. 7, 2022.

BACKGROUND

Some available platforms for sequencing nucleic acids utilize a sequencing-by-synthesis approach. With this approach, a nascent strand is synthesized, and the addition of each monomer (e.g., nucleotide) to the growing strand is detected optically and/or electronically. Because a template strand directs synthesis of the nascent strand, one can infer the sequence of the template DNA from the series of nucleotide monomers that were added to the growing strand during the synthesis. In some examples, sequential paired-end sequencing may be used, where forward strands are sequenced and removed, and then reverse strands are constructed and sequenced. In other examples, simultaneous paired-end sequencing may be used, where forward strands and reverse strands are sequenced at the same time.

SUMMARY

For simultaneous paired-end sequencing, different primer sets are attached to different regions within each depression and/or on each protrusion of a flow cell surface. These primer sets are attached through polymeric hydrogel(s). Several example methods are described herein to place the primer sets in the desired regions such that, during optical imaging, the signals from one region do not deleteriously affect the signals from another region. In particular, the methods reduce or eliminate the occurrence of one region and primer set surrounding another region and primer set in a padlock like conformation or configuration. It has been found that by reducing the padlock like conformation, signal resolution from each of the regions is improved.

In one aspect, there is provided a method comprising:

imprinting a resin layer of a multi-layer stack to form a multi-height convex region including a first region with a first height and a second region with a second height that is smaller than the first height, wherein the multi-layer stack includes the resin layer over a sacrificial layer over a transparent substrate;

selectively etching portions of the multi-layer stack around the multi-height convex region to expose a portion of the transparent substrate;

utilizing the multi-layer stack to develop a curable layer through the transparent substrate to define a cured layer over the exposed portion of the transparent substrate;

etching i) the multi-height convex region to remove the resin layer and a portion of the sacrificial layer underlying the second region of the multi-height convex region, thereby exposing a second portion of the transparent substrate and whereby a third portion of the transparent substrate remains covered by a remaining portion of the sacrificial layer, and ii) the cured layer such that it is substantially co-planar with the remaining portion of the sacrificial layer, thereby forming a depression extending to the second portion of the transparent substrate; and utilizing the remaining portion of the sacrificial layer to define first and second functionalized layers over different regions of the depression.

In another aspect, there is provided a method comprising:

imprinting a resin layer of a multi-layer stack to form a multi-height convex region including a first region with a first height and a second region with a second height that is smaller than the first height, wherein the multi-layer stack includes the resin layer over a base support that does not include surface groups that can react with a first functionalized layer or a second functionalized layer;

utilizing the resin layer to define the first functionalized layer over a first portion of the resin layer or over a first portion of a second resin layer positioned between the resin layer and the base support; and applying the second functionalized layer over a second portion of the resin layer or over a second portion of the second resin layer positioned between the resin layer and the base support.

In still another aspect, there is provided a method comprising:

imprinting a resin layer of a multi-layer stack to form a patterned resin layer including a concave region having a deep portion and a shallow portion defined by a step portion, wherein the multi-layer stack includes the resin layer positioned over a sacrificial layer positioned over a transparent base support;

etching the patterned resin layer, thereby extending the deep portion into the transparent base support to create a depression portion, removing the step portion to expose a portion of the sacrificial layer, and forming interstitial regions of the patterned resin layer that surround the depression portion and the portion of the sacrificial layer;

utilizing the multi-layer stack to develop a negative photoresist through the transparent base support to define an insoluble negative photoresist over the depression portion;

utilizing the insoluble negative photoresist to create a second depression portion adjacent to the depression portion, to define a first functionalized layer over one of the depression portion or the second depression portion, and to define a region of the transparent base support where a second functionalized layer is to be defined, wherein the region corresponds with the other of second depression portion or the depression portion; and applying the second functionalized layer over the region.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIG. 3A through FIG. 3J are schematic views that illustrate an example of a method to generate the flow cell architecture shown in FIG. 1B, where FIG. 3A depicts a multi-layer structure, FIG. 3B depicts a multi-height convex region formed in the multi-layer structure of FIG. 3A, FIG. 3C depicts multi-height convex region of FIG. 3B after selective etching, FIG. 3D depicts a curable layer over the depicts multi-height convex region of FIG. 3C, FIG. 3E depicts development of the curable layer, FIG. 3F depicts the cured portion and the re-exposed multi-height convex region after the development of the curable layer, FIG. 3G depicts the multi-layer stack of FIG. 3F after additional etching, FIG. 3H depicts the multi-layer stack of FIG. 3G after a first functionalized layer is deposited, FIG. 3I depicts a portion of a sacrificial layer removed from the multi-layer stack of FIG. 3H to expose a portion of a transparent substrate, and FIG. 3J depicts first and second functionalized layers in a depression of the multi-layer stack and not on interstitial regions surrounding the depression;

FIG. 3A through FIG. 3H and FIG. 3K through FIG. 3O are schematic views that illustrate another example of a method to generate the flow cell architecture shown in FIG. 1B, where FIG. 3A depicts a multi-layer structure, FIG. 3B depicts a multi-height convex region formed in the multi-layer structure of FIG. 3A, FIG. 3C depicts multi-height convex region of FIG. 3B after selective etching, FIG. 3D depicts a curable layer over the depicts multi-height convex region of FIG. 3C, FIG. 3E depicts development of the curable layer, FIG. 3F depicts the cured portion and the re-exposed multi-height convex region after the development of the curable layer, FIG. 3G depicts the multi-layer stack of FIG. 3F after additional etching, FIG. 3H depicts the multi-layer stack of FIG. 3G after a first functionalized layer is deposited, FIG. 3K depicts the development of a negative photoresist over the multi-layer stack of FIG. 3H, FIG. 3L depicts the insoluble negative photoresist after development of the negative photoresist, FIG. 3M depicts a portion of a sacrificial layer removed from the multi-layer stack of FIG. 3L to expose a portion of a transparent substrate, FIG. 3N depicts the multi-layer stack of FIG. 3G after a second functionalized layer is deposited, and FIG. 3O depicts first and second functionalized layers in a depression of the multi-layer stack and not on interstitial regions surrounding the depression;

FIG. 4A depicts a multi-height convex region formed in a multi-layer stack, FIG. 4B depicts exposed transparent base support around the multi-height convex region after etching, FIG. 4C depicts the development of a negative photoresist over the transparent base support and the multi-height convex region of FIG. 4B, FIG. 4D depicts the insoluble negative photoresist after development of the negative photoresist, FIG. 4E depicts a first functionalized layer deposited over the insoluble negative photoresist and an exposed portion of the multi-height convex region, FIG. 4F depicts the multi-height convex region after the insoluble negative photoresist is removed, and FIG. 4G depicts the multi-height convex region after a second functionalized layer is applied over exposed portions;

FIG. 5A depicts a multi-height convex region formed in a multi-layer stack, FIG. 5B depicts an exposed base support around the multi-height convex region after etching, FIG. 5C depicts a first functionalized layer applied to the multi-height convex region and not to the base support, FIG. 5D depicts removal of a portion of the multi-height convex region to form a protrusion, and FIG. 5E depicts a second functionalized layer applied over a portion of the protrusion;

FIG. 6A depicts a multi-depth concave region formed in a multi-layer stack, FIG. 6B depicts a deep portion of the multi-depth concave region extended into a transparent base support after etching, FIG. 6C depicts a first functionalized layer applied over the structure of FIG. 6B, FIG. 6D depicts the development of a negative photoresist through the transparent base support, FIG. 6E depicts the insoluble negative photoresist in the deep portion, FIG. 6F depicts removal of a sacrificial layer and layers thereon from the transparent base support, FIG. 6G depicts the application of a second functionalized layer, FIG. 6H depicts removal of the insoluble negative photoresist, and FIG. 6I depicts the first and second functionalized layers in a depression of the transparent base support and not on interstitial regions surrounding the depression;

FIG. 6A through FIG. 6E and FIG. 6J through FIG. 6M are schematic views that illustrate another example of a method to generate the flow cell architecture shown in FIG. 1B, where FIG. 6A depicts a multi-depth concave region formed in a multi-layer stack, FIG. 6B depicts a deep portion of the multi-depth concave region extended into a transparent base support after etching, FIG. 6C depicts a first functionalized layer applied over the structure of FIG. 6B, FIG. 6D depicts the development of a negative photoresist through the transparent base support, FIG. 6E depicts the insoluble negative photoresist in the deep portion, FIG. 6J depicts removal of a sacrificial layer and layers thereon from the transparent base support, FIG. 6K depicts removal of the insoluble negative photoresist, FIG. 6L depicts the application of a second functionalized layer over the transparent base support but not over the first functionalized layer, and FIG. 6M depicts the first and second functionalized layers in a depression of the transparent base support and not on interstitial regions surrounding the depression;

FIG. 6A through FIG. 6E and FIG. 6N through FIG. 6R are schematic views that illustrate another example of a method to generate the flow cell architecture shown in FIG. 1B, where FIG. 6A depicts a multi-depth concave region formed in a multi-layer stack, FIG. 6B depicts a deep portion of the multi-depth concave region extended into a transparent base support after etching, FIG. 6C depicts a first functionalized layer applied over the structure of FIG. 6B, FIG. 6D depicts the development of a negative photoresist through the transparent base support, FIG. 6E depicts the insoluble negative photoresist in the deep portion, FIG. 6N depicts a depression portion formed adjacent to the insoluble negative photoresist via dry etching, FIG. 6O depicts the application of a second functionalized layer over the structure of FIG. 6N, FIG. 6P depicts the removal of the insoluble negative photoresist, FIG. 6Q depicts the removal of the sacrificial layer, and FIG. 6R depicts the first and second functionalized layers in a depression of the transparent base support and not on interstitial regions surrounding the depression;

FIG. 7A depicts a multi-depth concave region formed in a multi-layer stack, FIG. 7B depicts a deep portion of the multi-depth concave region extended into a transparent base support after etching, FIG. 7C depicts the development of a negative photoresist through the transparent base support, FIG. 7D the insoluble negative photoresist in the deep portion, FIG. 7E depicts the formation of a depression portion in the transparent base support adjacent to the insoluble negative photoresist and the removal of a sacrificial layer, FIG. 7F depicts a first functionalized layer applied over the structure of FIG. 7E, FIG. 7G depicts the removal of the insoluble photoresist to expose another depression portion, FIG. 7H depicts a second functionalized layer applied over the exposed depression portion, and FIG. 7I depicts the first and second functionalized layers in a depression of the transparent base support and not on interstitial regions surrounding the depression;

FIG. 7A through FIG. 7D and FIG. 7J through FIG. 7O are schematic views that another example of a method to generate the flow cell architecture shown in FIG. 1B, where FIG. 7A depicts a multi-depth concave region formed in a multi-layer stack, FIG. 7B depicts a deep portion of the multi-depth concave region extended into a transparent base support after etching, FIG. 7C depicts the development of a negative photoresist through the transparent base support, FIG. 7D the insoluble negative photoresist in the deep portion, FIG. 7J depicts the formation of a depression portion in the transparent base support adjacent to the insoluble negative photoresist and remaining portions of a sacrificial layer, FIG. 7K depicts a first functionalized layer applied over the structure of FIG. 7J, FIG. 7L depicts the removal of the insoluble photoresist to expose another depression portion, FIG. 7M depicts a second functionalized layer applied over the exposed depression portion, FIG. 7N depicts the removal of the sacrificial layer and layer(s) applied thereon, and FIG. 7O depicts the first and second functionalized layers in a depression of the transparent base support and not on interstitial regions surrounding the depression;

DETAILED DESCRIPTION

Examples of the flow cells disclosed herein may be used for sequencing, an example of which may include simultaneous paired-end nucleic acid sequencing. These flow cells include different primer sets attached to different regions of a patterned structure of a flow cell. In these examples, the primer sets may be controlled so that the cleaving (linearization) chemistry is orthogonal in the different regions. Orthogonal cleaving chemistry may be realized through identical cleavage sites that are attached to different primers in the different sets, or through different cleavage sites that are attached to different primers in the different sets. This enables a cluster of forward strands to be generated in one region of the patterned structure and a cluster of reverse strands to be generated in another region of the patterned structure. In an example, the regions are directly adjacent to one another. In another example, any space between the regions is small enough that clustering can span the two regions. With some of the flow cell configurations disclosed herein, the forward and reverse strands are spatially separate, which separates the fluorescence signals from both reads while allowing for simultaneous base calling of each read. As such, some examples of the flow cells disclosed herein enable simultaneous paired-end reads to be obtained. Several example methods are described to generate these flow cells.

Figure 8A:
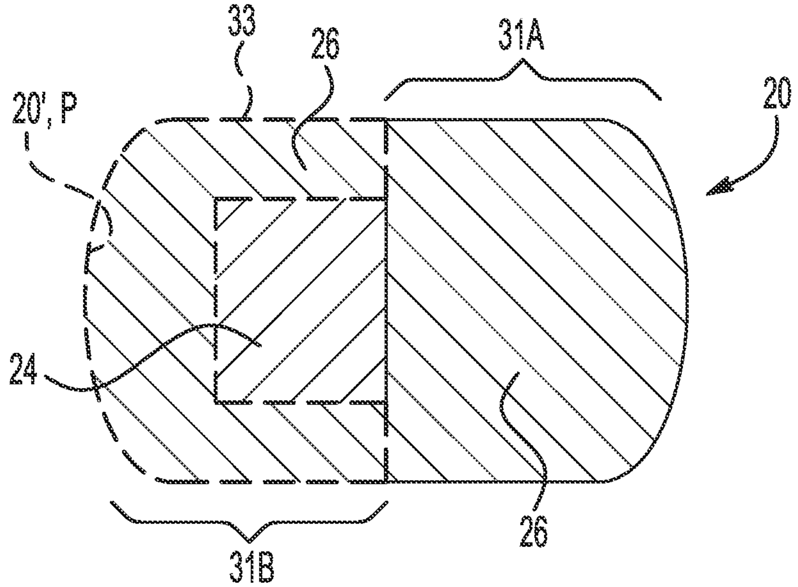
FIG. 8A shows a top view of an example depression with a padlock conformation.
Figure 8B:
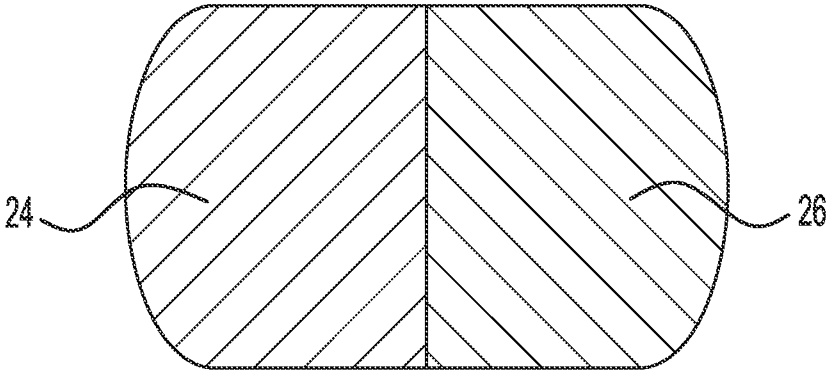
FIG. 8B shows a top view of an example depression without a padlock conformation.

It has been found that some methods used to produce the spatially separate regions where the primer sets (and ultimately the forward and reverse strands) are attached generate a padlock like conformation where, from a top view, one region is surrounded by the other region within the depression. An example of this padlock like conformation is shown in FIG. 8A, which depicts the top view of one depression 20. As shown in FIG. 8A, the depression 20 of the flow cell includes adjacent functionalized layers 24, 26, which define the regions where the different primer sets (not shown) are respectively attached. In this example, the functionalized layer 26 is formed in part 31A of the depression 20, and it is desirable for the other functionalized layer 24 to be formed in the adjacent part 31B of the depression 20. However, as a result of the method used, the functionalized layer 26 is applied along sidewall(s) 20' of the depression 20 in the adjacent part 31B. In the depression 20 (having single depth), the sidewall 20' is a perimeter P of the depression 20. As depicted, the functionalized layer 26 may align the perimeter 20', P and surround the functionalized layer 24, generating the padlock like conformation 33. Forward or reverse strands will form during amplification on the functionalized layer 26 in the padlock like conformation 33, and during sequencing, the signals from these strands may contaminate the signals from the strands formed on the functionalized layer 24.

Some of the methods disclosed herein eliminate the padlock like conformation 33 (e.g., as shown in FIG. 8A) because the functionalized layer 26 is no longer present in the part 31B of the depression 20 (see FIG. 3J, FIG. 3O, FIG. 6I, FIG. 6M, FIG. 6R, FIG. 7I and FIG. 7O). Other of the methods disclosed herein reduce or eliminate the padlock like conformation by generating the functionalized layers 24, 26 on different regions of a protrusion 28 or 28' (see FIG. 4G and FIG. 5E).

Definitions

It is to be understood that terms used herein will take on their ordinary meaning in the relevant art unless specified otherwise. Several terms used herein and their meanings are set forth below.

The singular forms “a”, “an”, and “the” include plural referents unless the context clearly dictates otherwise.

The terms comprising, including, containing and various forms of these terms are synonymous with each other and are meant to be equally broad.

The terms top, bottom, lower, upper, on, etc. are used herein to describe the flow cell and/or the various components of the flow cell. It is to be understood that these directional terms are not meant to imply a specific orientation, but are used to designate relative orientation between components. The use of directional terms should not be interpreted to limit the examples disclosed herein to any specific orientation(s).

The terms first, second, etc. also are not meant to imply a specific orientation or order, but rather are used to distinguish one component from another.

An "acrylamide monomer" is a monomer with the structure

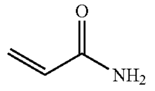

or a monomer including an acrylamide group. Examples of the monomer including an acrylamide group include azido acetamido pentyl acrylamide:

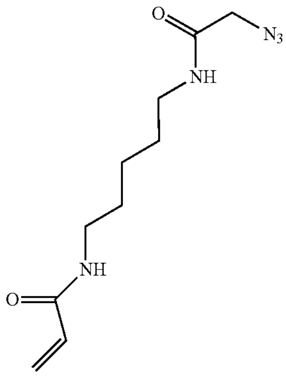 [SMILES: C=CC(=O)NCCCCCNC(=O)CN=[N+]=[N-]]

and N-isopropylacrylamide:

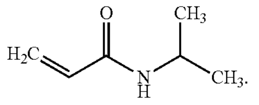

Other acrylamide monomers may be used.

The term "activation," as used herein, refers to a process that generates reactive groups at the surface of a base support or an outermost layer of a multi-layered structure. Activation may be accomplished using silanization or plasma ashing. While activation may be performed in each of the methods disclosed herein, some of the figures do not depict a separate layer. In these instances, it is to be understood that a silanized layer or —OH groups (from plasma ashing) are present to covalently attach the functionalized layers to the underlying support or layer. In other instances, a silanized layer is depicted.

An aldehyde, as used herein, is an organic compound containing a functional group with the structure —CHO, which includes a carbonyl center (i.e., a carbon double-bonded to oxygen) with the carbon atom also bonded to hydrogen and an R group, such as an alkyl or other side chain. The general structure of an aldehyde is:

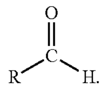

As used herein, "alkyl" refers to a straight or branched hydrocarbon chain that is fully saturated (i.e., contains no double or triple bonds). The alkyl group may have 1 to 20 carbon atoms. Example alkyl groups include methyl, ethyl, propyl, isopropyl, butyl, isobutyl, tertiary butyl, pentyl, hexyl, and the like. As an example, the designation "$C_{1-4}$ alkyl" indicates that there are one to four carbon atoms in the alkyl chain, i.e., the alkyl chain is selected from the group consisting of methyl, ethyl, propyl, iso-propyl, n-butyl, isobutyl, sec-butyl, and t-butyl.

As used herein, "alkenyl" refers to a straight or branched hydrocarbon chain containing one or more double bonds. The alkenyl group may have 2 to 20 carbon atoms. Example alkenyl groups include ethenyl, propenyl, butenyl, pentenyl, hexenyl, and the like.

As used herein, "alkyne" or "alkynyl" refers to a straight or branched hydrocarbon chain containing one or more triple bonds. The alkynyl group may have 2 to 20 carbon atoms.

As used herein, "aryl" refers to an aromatic ring or ring system (i.e., two or more fused rings that share two adjacent carbon atoms) containing only carbon in the ring backbone. When the aryl is a ring system, every ring in the system is aromatic. The aryl group may have 6 to 18 carbon atoms. Examples of aryl groups include phenyl, naphthyl, azulenyl, and anthracenyl.

An "amino" functional group refers to an $—NR_aR_b$ group, where $R_a$ and $R_b$ are each independently selected from hydrogen (e.g., 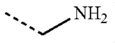), $C_{1-6}$ alkyl, $C_{2-6}$ alkenyl, $C_{2-6}$ alkynyl, $C_{3-7}$ carbocycle, $C_{6-10}$ aryl, 5-10 membered heteroaryl, and 5-10 membered heterocycle, as defined herein.

As used herein, the term "attached" refers to the state of two things being joined, fastened, adhered, connected or bound to each other, either directly or indirectly. For example, a nucleic acid can be attached to a functionalized polymer by a covalent or non-covalent bond. A covalent bond is characterized by the sharing of pairs of electrons between atoms. A non-covalent bond is a physical bond that does not involve the sharing of pairs of electrons and can include, for example, hydrogen bonds, ionic bonds, van der Waals forces, hydrophilic interactions and hydrophobic interactions.

An "azide" or "azido" functional group refers to $—N_3$.

As used herein, a "bonding region" refers to an area of a patterned structure that is to be bonded to another material, which may be, as examples, a spacer layer, a lid, another patterned structure, etc., or combinations thereof (e.g., a spacer layer and a lid, or a spacer layer and another patterned structure). The bond that is formed at the bonding region may be a chemical bond (as described above), or a mechanical bond (e.g., using a fastener, etc.).

As used herein, "carbocycle" means a non-aromatic cyclic ring or ring system containing only carbon atoms in the ring system backbone. When the carbocycle is a ring system, two or more rings may be joined together in a fused, bridged or spiro-connected fashion. Carbocycles may have any degree of saturation, provided that at least one ring in a ring system is not aromatic. Thus, carbocycles include cycloalkyls, cycloalkenyls, and cycloalkynyls. The carbocycle group may have 3 to 20 carbon atoms. Examples of carbocycle rings include cyclopropyl, cyclobutyl, cyclopentyl, cyclohexyl, cyclohexenyl, 2,3-dihydro-indene, bicyclo [2.2.2]octanyl, adamantyl, and spiro[4.4]nonanyl.

As used herein, the term "carboxylic acid" or "carboxyl" as used herein refers to —COOH.

As used herein, "cycloalkylene" means a fully saturated carbocycle ring or ring system that is attached to the rest of the molecule via two points of attachment.

As used herein, "cycloalkenyl" or "cycloalkene" means a carbocycle ring or ring system having at least one double bond, wherein no ring in the ring system is aromatic. Examples include cyclohexenyl or cyclohexene and norbornenyl or norbornene. Also as used herein, "heterocycloalkenyl" or "heterocycloalkene" means a carbocycle ring or ring system with at least one heteroatom in ring backbone, having at least one double bond, wherein no ring in the ring system is aromatic.

As used herein, "cycloalkynyl" or "cycloalkyne" means a carbocycle ring or ring system having at least one triple bond, wherein no ring in the ring system is aromatic. An example is cyclooctyne. Another example is bicyclononyne. Also as used herein, "heterocycloalkynyl" or "heterocycloalkyne" means a carbocycle ring or ring system with at least one heteroatom in ring backbone, having at least one triple bond, wherein no ring in the ring system is aromatic.

The term "depositing," as used herein, refers to any suitable application technique, which may be manual or automated, and, in some instances, results in modification of the surface properties. Generally, depositing may be performed using vapor deposition techniques, coating techniques, grafting techniques, or the like. Some specific examples include chemical vapor deposition (CVD), spray coating (e.g., ultrasonic spray coating), spin coating, dunk or dip coating, doctor blade coating, puddle dispensing, flow through coating, aerosol printing, screen printing, microcontact printing, inkjet printing, or the like.

As used herein, the term "depression" refers to a discrete concave feature in a base support or a layer of a multi-layer stack having a surface opening that is at least partially surrounded by interstitial region(s) of the base support or the layer of the multi-layer stack. Depressions can have any of a variety of shapes at their opening in a surface including, as examples, round, elliptical, square, polygonal, star shaped (with any number of vertices), etc. The cross-section of a depression taken orthogonally with the surface can be curved, square, polygonal, hyperbolic, conical, angular, etc. As examples, the depression can be a well or two interconnected wells. The depression may also have more complex architectures, such as ridges, step features, etc.

The term "each," when used in reference to a collection of items, is intended to identify an individual item in the collection, but does not necessarily refer to every item in the collection. Exceptions can occur if explicit disclosure or context clearly dictates otherwise.

The term "epoxy" (also referred to as a glycidyl or oxirane group) as used herein refers to

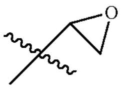 or 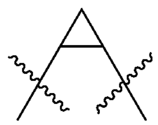 .

As used herein, the term "flow cell" is intended to mean a vessel having a flow channel where a reaction can be carried out, an inlet for delivering reagent(s) to the flow channel, and an outlet for removing reagent(s) from the flow channel. In some examples, the flow cell accommodates the detection of the reaction that occurs in the flow cell. For example, the flow cell can include one or more transparent surfaces allowing for the optical detection of arrays, optically labeled molecules, or the like.

As used herein, a "flow channel" or "channel" may be an area defined between two bonded components, which can selectively receive a liquid sample. In some examples, the flow channel may be defined between two patterned structures, and thus may be in fluid communication with surface chemistry of the patterned structures. In other examples, the flow channel may be defined between a patterned structure and a lid, and thus may be in fluid communication with surface chemistry of the patterned structures.

As used herein, a "functionalized layer" refers to a gel material that is applied over at least a portion of a flow cell substrate. The gel material includes functional group(s) that can attach to primer(s). The functionalized layer may be positioned within a portion of a depression defined in the substrate or may be positioned over a portion of a protrusion on the substrate. The term "functionalized layer" also refers to the gel material that is applied over all or a portion of the substrate, and that is exposed to further processing to define the functionalized layer in the portion of the depression, or the functionalized layer over the portion of the protrusion.

As used herein, "heteroaryl" refers to an aromatic ring or ring system (i.e., two or more fused rings that share two adjacent atoms) that contain(s) one or more heteroatoms, that is, an element other than carbon, including but not limited to, nitrogen, oxygen and sulfur, in the ring backbone. When the heteroaryl is a ring system, every ring in the system is aromatic. The heteroaryl group may have 5-18 ring members.

As used herein, "heterocycle" means a non-aromatic cyclic ring or ring system containing at least one heteroatom in the ring backbone. Heterocycles may be joined together in a fused, bridged or spiro-connected fashion. Heterocycles may have any degree of saturation provided that at least one ring in the ring system is not aromatic. In the ring system, the heteroatom(s) may be present in either a non-aromatic or aromatic ring. The heterocycle group may have 3 to 20 ring members (i.e., the number of atoms making up the ring backbone, including carbon atoms and heteroatoms). In some examples, the heteroatom(s) are O, N, or S.

The term "hydrazine" or "hydrazinyl" as used herein refers to a —$NHNH_2$ group.

As used herein, the term "hydrazone" or "hydrazonyl" as used herein refers to a

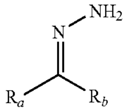

group in which $R_a$ and $R_b$ are each independently selected from hydrogen, $C_{1-6}$ alkyl, $C_{2-6}$ alkenyl, $C_{2-6}$ alkynyl, $C_{3-7}$ carbocycle, $C_{6-10}$ aryl, 5-10 membered heteroaryl, and 5-10 membered heterocycle, as defined herein.

As used herein, "hydroxy" or "hydroxyl" refers to an —OH group.

As used herein, the term “interstitial region” refers to an area, e.g., of a base support or a layer of a multi-layer stack that separates depressions (concave regions) or protrusions (convex regions). For example, an interstitial region can separate one depression of an array from another depression of the array. The two depressions or protrusions that are separated from each other can be discrete, i.e., lacking physical contact with each other. In many examples, the interstitial region is continuous, whereas the depressions or protrusions are discrete, for example, as is the case for a plurality of depressions or protrusions defined in or on an otherwise continuous surface. In other examples, the interstitial regions and the features are discrete, for example, as is the case for a plurality of depressions in the shape of trenches, which are separated by respective interstitial regions. The separation provided by an interstitial region can be partial or full separation. Interstitial regions may have a surface material that differs from the surface material of the depressions or the protrusions. For example, the depressions can have a polymer and first and second primer sets therein, and the interstitial regions can be free of both the polymer and the first and second primer sets.

As used herein, a “negative photoresist” refers to a light-sensitive material in which a portion that is exposed to light of particular wavelength(s) becomes insoluble to a developer. In these examples, the insoluble negative photoresist has less than 5% solubility in the developer. With the negative photoresist, the light exposure changes the chemical structure so that the exposed portions of the material becomes less soluble (than non-exposed portions) in the developer. While not soluble in the developer, the insoluble negative photoresist may be at least 99% soluble in a remover that is different from the developer. The remover may be a solvent or solvent mixture used, e.g., in a lift-off process.

In contrast to the insoluble negative photoresist, any portion of the negative photoresist that is not exposed to light is at least 95% soluble in the developer. In some examples, the portion of the negative photoresist not exposed to light is at least 98%, e.g., 99%, 99.5%, 100%, soluble in the developer.

“Nitrile oxide,” as used herein, means a “$R_aC\equiv N^+O^-$” group in which $R_a$ is defined herein. Examples of preparing nitrile oxide include in situ generation from aldoximes by treatment with chloramide-T or through action of base on imidoyl chlorides [RC(Cl)=NOH] or from the reaction between hydroxylamine and an aldehyde.

“Nitrone,” as used herein, means a

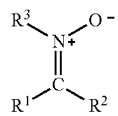

group in which $R^1$, $R^2$, and $R^3$ may be any of the $R_a$ and $R_b$ groups defined herein, except that $R^3$ is not hydrogen (H).

As used herein, a “nucleotide” includes a nitrogen containing heterocyclic base, a sugar, and one or more phosphate groups. Nucleotides are monomeric units of a nucleic acid sequence. In RNA, the sugar is a ribose, and in DNA, the sugar is a deoxyribose, i.e. a sugar lacking a hydroxyl group that is present at the 2' position in ribose. The nitrogen containing heterocyclic base (i.e., nucleobase) can be a purine base or a pyrimidine base. Purine bases include adenine (A) and guanine (G), and modified derivatives or analogs thereof. Pyrimidine bases include cytosine (C), thymine (T), and uracil (U), and modified derivatives or analogs thereof. The C-1 atom of deoxyribose is bonded to N-1 of a pyrimidine or N-9 of a purine. A nucleic acid analog may have any of the phosphate backbone, the sugar, or the nucleobase altered. Examples of nucleic acid analogs include, for example, universal bases or phosphate-sugar backbone analogs, such as peptide nucleic acid (PNA).

Figures 1A, 1B, 1C, 1D:
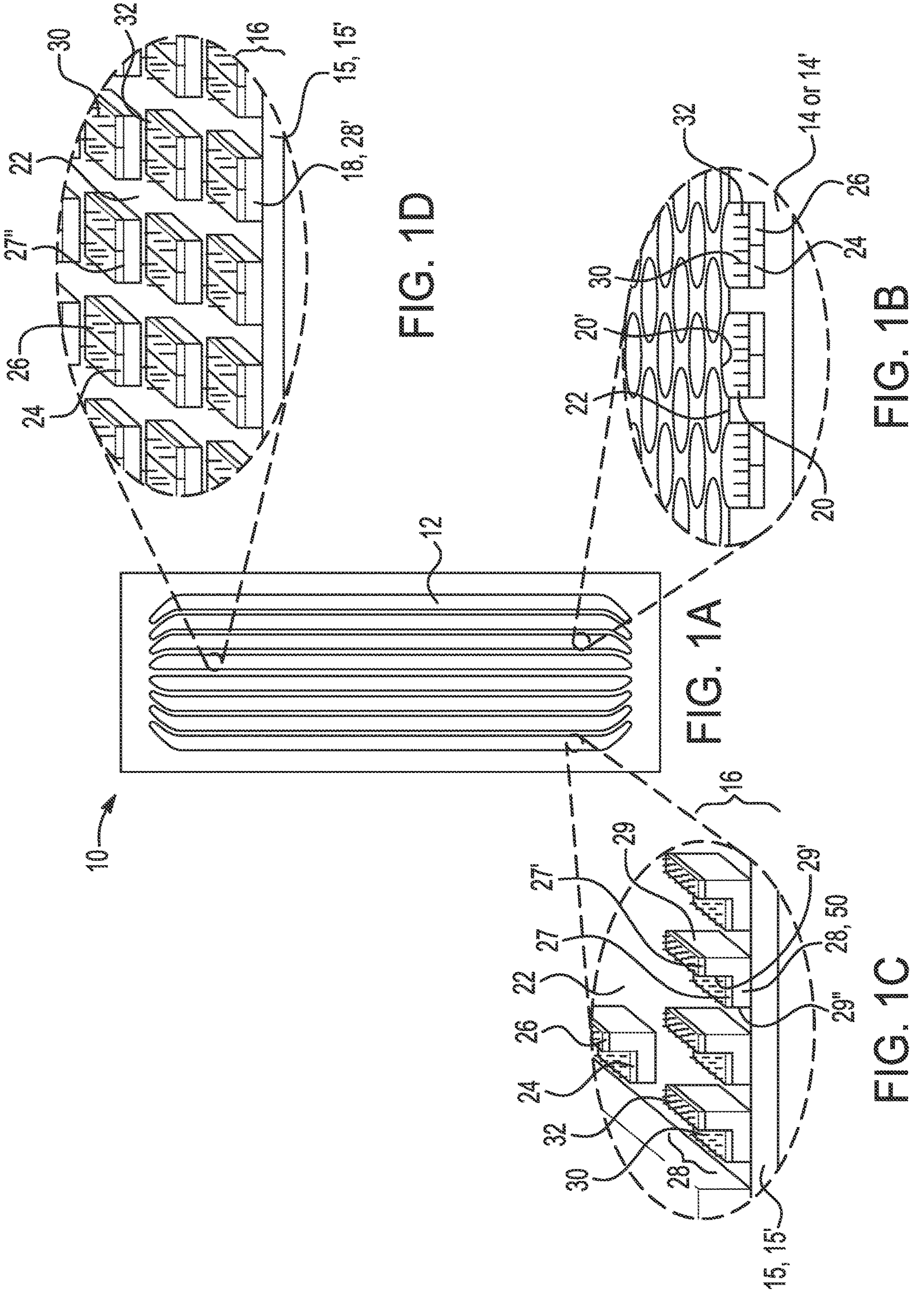
FIG. 1A is a top view of an example flow cell.
FIG. 1B is an enlarged, and partially cutaway view of an example of a flow channel of the flow cell.
FIG. 1C is an enlarged, and partially cutaway view of another example of a flow channel of the flow cell.
FIG. 1D is an enlarged, and partially cutaway view of yet another example of a flow channel of the flow cell.

In some examples, the term “over” may mean that one component or material is positioned directly on another component or material. When one is directly on another, the two are in contact with each other. In FIG. 1D, the resin layer 18 (defining the protrusions 28') may be applied over the base support 15, 15' so that it is directly on and in contact with the base support 15, 15'.

In other examples, the term “over” may mean that one component or material is positioned indirectly on another component or material. By indirectly on, it is meant that a gap or an additional component or material may be positioned between the two components or materials. In FIG. 1D, the functionalized layers 24, 26 are positioned over the base support 15' such that the two are in indirect contact. More specifically, the functionalized layers 24, 26 are indirectly on the base support 15' because the resin layer 18 (defining the protrusions 28') is positioned therebetween.

A “patterned resin” refers to any material that can have depressions and/or protrusions defined therein. Specific examples of resins and techniques for patterning the resins will be described further below.

A “patterned structure” refers to a single layer base support that includes, or a multi-layer stack with a layer that includes surface chemistry in a pattern, e.g., in depressions, on protrusions, or otherwise positioned on the support or layer surface. The surface chemistry may include a functionalized layer and capture/amplification primers. In some examples, the single layer base support or the layer of the multi-layer stack have been exposed to patterning techniques (e.g., etching, lithography, etc.) in order to generate the pattern for the surface chemistry. However, the term “patterned structure” is not intended to imply that such patterning techniques have to be used to generate the pattern. For example, a base support may be a substantially flat surface having a pattern of the functionalized layers thereon. The patterned structure may be generated via any of the methods disclosed herein.

As used herein, the “primer” is defined as a single stranded nucleic acid sequence (e.g., single strand DNA). Some primers, referred to herein as capture and/or amplification primers, serve as a starting point for template amplification and cluster generation. Other primers, referred to herein as sequencing primers, serve as a starting point for DNA synthesis. The 5' terminus of the primer may be modified to allow a coupling reaction with a functional group of a polymer. The primer length can be any number of bases long and can include a variety of non-natural nucleotides. In an example, the sequencing primer is a short strand, ranging from 10 to 60 bases, or from 20 to 40 bases.

As used herein, a “positive photoresist” refers to a light-sensitive material in which a portion that is exposed to light of particular wavelength(s) becomes soluble to a developer. In these examples, any portion of the positive photoresist exposed to light is at least 95% soluble in the developer. In some examples, the portion of the positive photoresist exposed to light is at least 98%, e.g., 99%, 99.5%, 100%, soluble in the developer. With the positive photoresist, the light exposure changes the chemical structure so that the exposed portions of the material become more soluble (than non-exposed portions) in the developer.

In contrast to the soluble positive photoresist, any portion of the positive photoresist not exposed to light is insoluble (less than 5% soluble) in the developer. While not soluble in the developer, the insoluble positive photoresist may be at least 99% soluble in a remover that is different from the developer. In some examples, insoluble positive photoresist is at least 98%, e.g., 99%, 99.5%, 100%, soluble in the remover. The remover may be a solvent or solvent mixture used in a lift-off process.

A "spacer layer," as used herein refers to a material that bonds two components together. In some examples, the spacer layer can be a radiation-absorbing material that aids in bonding, or can be put into contact with a radiation-absorbing material that aids in bonding.

The term "substrate" refers to the single layer base support or a multi-layer structure upon which surface chemistry is introduced. In some examples of the method, a multi-layer stack (similar to a multi-layer structure) is used at the outset and is processed such that one or more layers are removed, and the resulting flow cell includes the surface chemistry supported by the single layer base support.

"Surface chemistry" as defined herein includes the polymeric hydrogel and the primer sets.

The term "tantalum pentoxide" refers to the inorganic compound with the formula $Ta_2O_5$. This compound is transparent, having a transmittance ranging from about 0.25 (25%) to 1 (100%), to wavelengths ranging from about 0.35 μm (350 nm) to at least 1.8 μm (1800 nm). A "tantalum pentoxide base support" or "tantalum pentoxide layer" may comprise, consist essentially of, or consist of $Ta_2O_5$. In examples where it is desirable for the tantalum pentoxide base support or the tantalum pentoxide layer to transmit electromagnetic energy having any of these wavelengths, the base support or layer may consist of $Ta_2O_5$ or may comprise or consist essentially of $Ta_2O_5$ and other components that will not interfere with the desired transmittance of the base support or layer.

A "thiol" functional group refers to —SH.

As used herein, the terms "tetrazine" and "tetrazinyl" refer to six-membered heteroaryl group comprising four nitrogen atoms. Tetrazine can be optionally substituted.

"Tetrazole," as used herein, refer to five-membered heterocyclic group including four nitrogen atoms. Tetrazole can be optionally substituted.

The term "transparent base support" or "transparent layer" refers to a material, e.g., in the form of a substrate or layer, that is transparent to a particular wavelength or range of wavelengths. For example, the material may be transparent to wavelength(s) that are used to chemically change a positive or negative photoresist. Transparency may be quantified using transmittance, i.e., the ratio of light energy falling on a body to that transmitted through the body. The transmittance of a transparent base support or a transparent layer will depend upon the thickness of the base support or layer and the wavelength of light. In the examples disclosed herein, the transmittance of the transparent base support or the transparent layer may range from 0.25 (25%) to 1 (100%). The material of the base support or layer may be a pure material, a material with some impurities, or a mixture of materials, as long as the resulting base support or layer is capable of the desired transmittance. Additionally, depending upon the transmittance of the base support or layer, the time for light exposure and/or the output power of the light source may be increased or decreased to deliver a suitable dose of light energy through the transparent base support and/or layer to achieve the desired effect (e.g., generating a soluble or insoluble photoresist).

Flow Cells

An example of the flow cell for simultaneous paired-end sequencing generally includes a patterned structure, which includes a substrate; two functionalized layers over at least a portion of the substrate; and different primer sets attached to the two functionalized layers.

One example of the flow cell 10 is shown in FIG. 1A from a top view. The flow cell 10 may include two patterned structures bonded together or one patterned structure bonded to a lid. Between the two patterned structures or the one patterned structure and the lid is a flow channel 12. The example shown in FIG. 1A includes eight flow channels 12. While eight flow channels 12 are shown, it is to be understood that any number of flow channels 12 may be included in the flow cell 10 (e.g., a single flow channel 12, four flow channels 12, etc.). Each flow channel 12 may be isolated from another flow channel 12 so that fluid introduced into a flow channel 12 does not flow into adjacent flow channel(s) 12. Some examples of the fluids introduced into the flow channel 12 may introduce reaction components (e.g., DNA sample, polymerases, sequencing primers, nucleotides, etc.), washing solutions, deblocking agents, etc.

The flow channel 12 is at least partially defined by a patterned structure. The patterned structure may include a substrate, such as a single layer base support 14 or 14' (as shown in FIG. 1B), or a multi-layer structure 16 (as shown in FIG. 1C and FIG. 1D). Examples of the multi-layer structure 16 include a base support 15, 15' and at least one other layer thereon. The other layer may be a resin layer shown at reference numerals 18 and 50, a sacrificial layer shown at reference numeral 48, a transparent layer shown at reference numeral 72, or combinations of these layers.

Examples of suitable single layer base supports 14 or base supports 15 for the multi-layer structure 16 include epoxy siloxane, glass, modified or functionalized glass, plastics (including acrylics, polystyrene and copolymers of styrene and other materials, polypropylene, polyethylene, polybutylene, polyurethanes, polytetrafluoroethylene (such as TEFLON® from Chemours), cyclic olefins/cyclo-olefin polymers (COP) (such as ZEONOR® from Zeon), polyimides, etc.), nylon (polyamides), ceramics/ceramic oxides, silica, fused silica, or silica-based materials, aluminum silicate, silicon and modified silicon (e.g., boron doped p+ silicon), silicon nitride ($Si_3N_4$), silicon oxide ($SiO_2$), tantalum pentoxide ($Ta_2O_5$) or other tantalum oxide(s) ($TaO_x$), hafnium oxide ($HfO_2$), carbon, metals, inorganic glasses (e.g., soda lime, borosilicate glass, alkaline earth boroaluminosilicate (CORNING® EAGLE XG® glass wafers (CEXG)), or the like. Any of these base supports 14, 15 may be considered transparent base supports as they can transmit the wavelengths of visible light used in a sequencing operation. In some of the methods disclosed herein, it is desirable for the single layer base support 14 or the base support 15 of the multi-layer structure 16 to also be transparent to the ultraviolet light used to pattern one or more materials (e.g., a photoresist) during the method. These base supports are specifically referred to herein with the reference numeral 14' or 15'.

Some examples of the multi-layer structure 16 include the base support 15, 15' (e.g., glass, silicon, tantalum pentoxide, or any of the other base support materials) and a patterned resin 18 or 50 that defines the protrusions 28, 28', as shown in FIG. 1C and FIG. 1D. It is to be understood that any material that can be selectively deposited, or deposited and patterned to form depressions 20 and/or protrusions 28, 28' and interstitial regions 22 may be used for the patterned resin.

As one example of the patterned resin, an inorganic oxide may be selectively applied to the base support 15, 15' via vapor deposition, aerosol printing, or inkjet printing. Examples of suitable inorganic oxides include tantalum oxide (e.g., $Ta_2O_5$), aluminum oxide (e.g., $Al_2O_3$), silicon oxide (e.g., $SiO_2$), hafnium oxide (e.g., $HfO_2$), etc.

As another example of the patterned resin, a polymeric resin may be applied to the base support 15, 15' and then patterned. Suitable deposition techniques include chemical vapor deposition, dip coating, dunk coating, spin coating, spray coating, puddle dispensing, ultrasonic spray coating, doctor blade coating, aerosol printing, screen printing, microcontact printing, etc. Suitable patterning techniques include photolithography, nanoimprint lithography (NIL), stamping techniques, embossing techniques, molding techniques, microetching techniques, etc. Some examples of suitable resins include a polyhedral oligomeric silsesquioxane resin, a non-polyhedral oligomeric silsesquioxane epoxy resin, a poly(ethylene glycol) resin, a polyether resin (e.g., ring opened epoxies), an acrylic resin, an acrylate resin, a methacrylate resin, an amorphous fluoropolymer resin (e.g., CYTOP® from Bellex), and combinations thereof.

As used herein, the term "polyhedral oligomeric silsesquioxane" (commercially available under the tradename POSS® from Hybrid Plastics) refers to a chemical composition that is a hybrid intermediate (e.g., $RSiO_{1.5}$) between that of silica ($SiO_2$) and silicone ($R_2SiO$). An example of polyhedral oligomeric silsesquioxane may be that described in Kehagias et al., Microelectronic Engineering 86 (2009), pp. 776-778, which is incorporated by reference in its entirety. In an example, the composition is an organosilicon compound with the chemical formula $[RSiO_{3/2}]_n$, where the R groups can be the same or different. Example R groups for polyhedral oligomeric silsesquioxane include epoxy, azide/azido, a thiol, a poly(ethylene glycol), a norbornene, a tetrazine, acrylates, and/or methacrylates, or further, for example, alkyl, aryl, alkoxy, and/or haloalkyl groups.

Figures 3A, 3B, 3C, 3D, 3E, 3F, 3G, 3H:
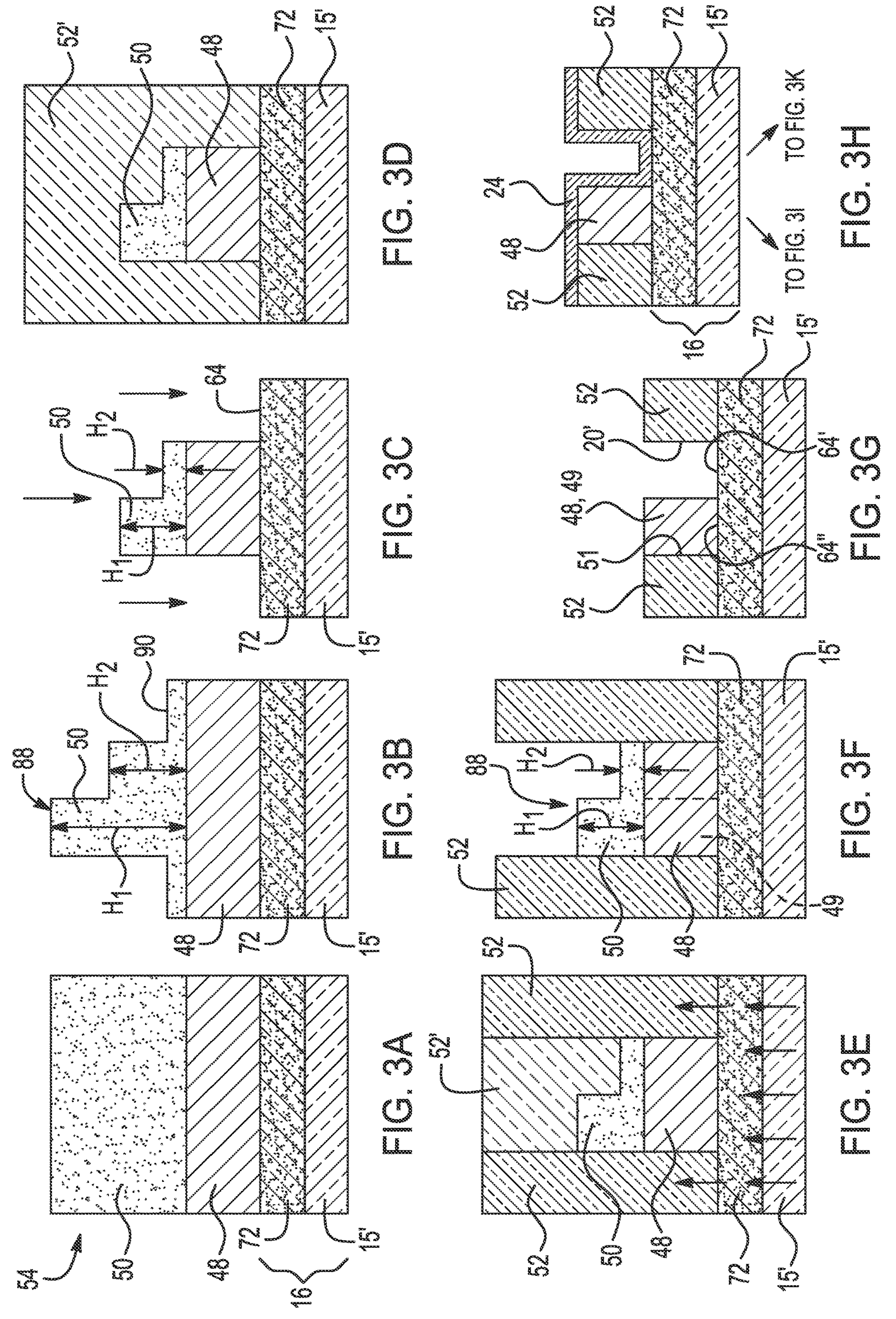

Still other examples of the multi-layer structure 16 include a sacrificial layer 48 over a transparent layer 72 over the transparent base support 15' (see FIG. 3A). In some examples, the transparent layer 72 is capable of transmitting ultraviolet light, and has a transmittance ranging from about 0.5 to about 1, e.g., from about 0.75 to about 1, from about 0.9 to about 0.99. Some examples of suitable materials for the transparent layer 72 include any example resin disclosed herein, tantalum pentoxide, indium tin oxide, titanium dioxide, or other UV transparent materials.

In an example, the single layer base support 14, 14' or the base support 15, 15' of the multi-layered structure 16 may be a circular sheet, a panel, a wafer, a die etc. having a diameter ranging from about 2 mm to about 300 mm, e.g., from about 200 mm to about 300 mm, or may be a rectangular sheet, panel, wafer, die etc. having its largest dimension up to about 10 feet (~3 meters). For example, a die may have a width ranging from about 0.1 mm to about 10 mm. While example dimensions have been provided, it is to be understood that a single layer base support 14, 14' or the base support 15, 15' of the multi-layered structure 16 with any suitable dimensions may be used.

In an example, the flow channel 12 has a substantially rectangular configuration with rounded opposed ends. The length and width of the flow channel 12 may be selected so a portion of the single layer base support 14, 14' or an outermost layer of the multi-layered structure 16 surrounds the flow channel 12 and is available for attachment to a lid (not shown) or another patterned structure.

The depth of the flow channel 12 can be as small as a monolayer thick when microcontact, aerosol, or inkjet printing is used to deposit a separate material that defines the flow channel 12 walls. In some examples, the depth of the flow channel 12 (in μm) is at least about 1, 5, 10, 20, 30, 40, 50, 60, 70, 80, 90, or 100. In some examples, the depth of the flow channel 12 (in μm) is less than about 110, 100, 90, 80, 70, 60, 50, 40, 30, 20, 10, or 5. In some examples, the depth of the flow channel 12 is provided by any two of the above upper and/or lower depths, such as between about 1 and 100, between about 10 and 100, or between about 10 and 30. In still another example, the depth is about 5 μm or less. It is to be understood that the depth of the flow channel 12 may be greater than, less than or between the values specified above.

FIG. 1B, FIG. 1C, and FIG. 1D depict examples of the architecture within the flow channel 12. As shown in FIG. 1B, the architecture may include depressions 20 defined in the single layer base support 14, 14', being of the same depth, and separated by interstitial regions 22. Alternatively, the depressions 20 could be defined in the outermost layer of the multi-layer structure 16. In either example, functionalized layers 24, 26 are formed in each depression 20. As shown in FIG. 1C, the architecture may include multi-step protrusions 28 formed over the base support 15, 15', and functionalized layers 24, 26 formed over the protrusions 28. In this example, the protrusions 28 are formed from the resin layer 50 of the multi-layer structure 16. As shown in FIG. 1D, the architecture may include protrusions 28' formed over the base support 15, 15', and functionalized layers 24, 26 formed over the protrusions 28'. In this example, the protrusions 28' are formed from the resin layer 18 of the multi-layer structure 16. In the examples shown in FIG. 1C and FIG. 1D, the resin layer 18 or 50 is processed to form the protrusions 28, 28' (see FIG. 4 and FIG. 5 series). Alternatively, a single layer base support 14, 14' may be etched or otherwise processed to define the protrusions 28, 28'.

Many different layouts of the depressions 20 and/or protrusions 28, 28' may be envisaged, including regular, repeating, and non-regular patterns. In an example, the depressions 20 and/or protrusions 28, 28' are disposed in a hexagonal grid for close packing and improved density. Other layouts may include, for example, rectilinear (rectangular) layouts, triangular layouts, and so forth. In some examples, the layout or pattern can be an x-y format in rows and columns. In some other examples, the layout or pattern can be a repeating arrangement of the depressions 20 and/or protrusions 28, 28' and the interstitial regions 22. In still other examples, the layout or pattern can be a random arrangement of the depressions 20 and/or protrusions 28, 28' and the interstitial regions 22.

The layout or pattern may be characterized with respect to the density (number) of the depressions 20 and/or protrusions 28, 28' in a defined area. For example, the depressions 20 and/or protrusions 28, 28' may be present at a density of approximately 2 million per $mm^2$. The density may be tuned to different densities including, for example, a density of about 100 per $mm^2$, about 1,000 per $mm^2$, about 0.1 million per $mm^2$, about 1 million per $mm^2$, about 2 million per $mm^2$, about 5 million per $mm^2$, about 10 million per $mm^2$, about 50 million per $mm^2$, or more, or less. It is to be further understood that the density can be between one of the lower values and one of the upper values selected from the ranges above, or that other densities (outside of the given ranges) may be used. As examples, a high density array may be characterized as having the depressions 20 and/or protrusions 28, 28' separated by less than about 100 nm, a medium density array may be characterized as having the depressions 20 and/or protrusions 28, 28' separated by about 400 nm to about 1 μm, and a low density array may be characterized as having the depressions 20 and/or protrusions 28, 28' separated by greater than about 1 μm.

The layout or pattern of the depressions 20 and/or protrusions 28, 28' may also or alternatively be characterized in terms of the average pitch, or the spacing from the center of one depression 20 and/or one protrusion 28, 28' to the center of an adjacent depression 20 and/or protrusion 28, 28' (center-to-center spacing) or from the right edge of one depression 20 and/or one protrusion 28, 28' to the left edge of an adjacent depression 20 and/or protrusion 28, 28' (edge-to-edge spacing). The pattern can be regular, such that the coefficient of variation around the average pitch is small, or the pattern can be non-regular in which case the coefficient of variation can be relatively large. In either case, the average pitch can be, for example, about 50 nm, about 0.1 μm, about 0.5 μm, about 1 μm, about 5 μm, about 10 μm, about 100 μm, or more or less. The average pitch for a particular pattern of can be between one of the lower values and one of the upper values selected from the ranges above. In an example, the depressions 20 have a pitch (center-to-center spacing) of about 1.5 μm. While example average pitch values have been provided, it is to be understood that other average pitch values may be used.

The size of each depression 20 may be characterized by its volume, opening area, depth, and/or diameter or length and width. For example, the volume can range from about $1\times10^{-3}$ $\mu m^3$ to about 100 $\mu m^3$, e.g., about $1\times10^{-2}$ $\mu m^3$, about 0.1 $\mu m^3$, about 1 $\mu m^3$, about 10 $\mu m^3$, or more, or less. For another example, the opening area can range from about $1\times10^{-3}$ $\mu m^2$ to about 100 $\mu m^2$, e.g., about $1\times10^{-2}$ $\mu m^2$, about 0.1 $\mu m^2$, about 1 $\mu m^2$, at least about 10 $\mu m^2$, or more, or less. For still another example, the depth can range from about 0.1 μm to about 100 μm, e.g., about 0.5 μm, about 1 μm, about 10 μm, or more, or less. For another example, the depth can range from about 0.1 μm to about 100 μm, e.g., about 0.5 μm, about 1 μm, about 10 μm, or more, or less. For yet another example, the diameter or each of the length and width can range from about 0.1 μm to about 100 μm, e.g., about 0.5 μm, about 1 μm, about 10 μm, or more, or less.

The height of the internal/side wall 20' that defines the depression 20 may vary depending upon the method used to form the depression 20. In some examples, it is to be understood that the height of the internal/side wall 20' (see FIG. 1B) may vary depending upon the thickness of the sacrificial layer 48, which is used to pattern a cured layer 52 which forms the internal wall 20' (see FIG. 3 series). In some other examples, the height of the internal/side wall 20' will depend upon the depth of the depression portions (reference number 68, 68', see FIG. 6 and FIG. 7 series) formed in a layer that is etched back to form the depression 20 (see, e.g., FIG. 6B and FIG. 6F).

The size of each protrusion 28, 28' may be characterized by its top surface area(s), height(s), and/or diameter (if circular in shape) or length and width. In some examples, the protrusion 28 is a multi-height pad, as shown in FIG. 1C, which includes two top surfaces 27, 27' at different heights with respect to the surface of the base support 15, 15'. The top surfaces 27, 27' are separated by a sidewall 29'. In other examples, the protrusion 28' is a substantially planar pad, as shown in FIG. 1D, which includes a single top surface 27" that is substantially parallel to and positioned at a single height from the surface of the base support 15, 15'. In an example, each of the top surfaces 27, 27' or 27" has a surface area ranging from about $1\times10^{-3}$ $\mu m^2$ to about 100 $\mu m^2$, e.g., about $1\times10^{-2}$ $\mu m^2$, about 0.1 $\mu m^2$, about 1 $\mu m^2$, at least about 10 $\mu m^2$, or more, or less. For still another example, the heights of the protrusion 28 or of the protrusion 28' can range from about 0.1 μm to about 100 μm, e.g., about 0.5 μm, about 1 μm, about 10 μm, or more, or less, as long as the two heights of the protrusion 28 are different. For yet another example, the diameter or length and width of protrusion 28 or 28' can range from about 0.1 μm to about 100 μm, e.g., about 0.5 μm, about 1 μm, about 10 μm, or more, or less.

Each of the architectures also includes the functionalized layers 24, 26. In each example, functionalized layers 24, 26 represent different areas that have different primer sets 30, 32 attached thereto. The primer sets 30, 32 are used in simultaneous paired-end sequencing. It is to be understood that primer set 30 may be attached to functionalized layer 24, or functionalized layer 26, so long as the primer set 32 is attached to the other functionalized layer 26.

In some of the examples disclosed herein, the functionalized layers 24, 26 are chemically the same, and any of the techniques disclosed herein may be used to sequentially immobilize the primer sets 30, 32 to the desired layer 24, 26. In other examples disclosed herein, the functionalized layers 24, 26 are chemically different (e.g., the layers 24, 26 include different functional groups for respective primer set 30, 32 attachment), and any of the techniques disclosed herein may be used to immobilize the primer sets 30, 32 to the respective layers 24, 26. In other examples disclosed herein, the materials applied to form the functionalized layers 24, 26 may have the respective primer sets 30, 32 pre-grafted thereto, and thus the immobilization chemistries of the functionalized layers 24, 26 may be the same or different.

In some examples, the functionalized layers 24, 26 may be any gel material that can swell when liquid is taken up and can contract when liquid is removed, e.g., by drying. In an example, the gel material is a polymeric hydrogel. In an example, the polymeric hydrogel includes an acrylamide copolymer, such as poly(N-(5-azidoacetamidylpentyl)acrylamide-co-acrylamide, PAZAM. PAZAM and some other forms of the acrylamide copolymer are represented by the following structure (I):

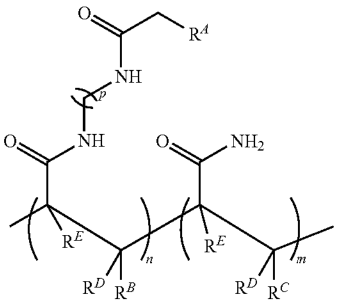

wherein:

$R^A$ is selected from the group consisting of azido, optionally substituted amino, optionally substituted alkenyl, optionally substituted alkyne, halogen, optionally substituted hydrazone, optionally substituted hydrazine, carboxyl, hydroxy, optionally substituted tetrazole, optionally substituted tetrazine, nitrile oxide, nitrone, sulfate, and thiol;

$R^B$ is H or optionally substituted alkyl;

$R^C$, $R^D$, and $R^E$ are each independently selected from the group consisting of H and optionally substituted alkyl;

each of the $-(CH_2)_p-$ can be optionally substituted;

p is an integer in the range of 1 to 50;

n is an integer in the range of 1 to 50,000; and m is an integer in the range of 1 to 100,000.

One of ordinary skill in the art will recognize that the arrangement of the recurring "n" and "m" features in structure (I) are representative, and the monomeric subunits may be present in any order in the polymer structure (e.g., random, block, patterned, or a combination thereof).

The molecular weight of PAZAM and other forms of the acrylamide copolymer may range from about 5 kDa to about 1500 kDa or from about 10 kDa to about 1000 kDa, or may be, in a specific example, about 312 kDa.

In some examples, PAZAM and other forms of the acrylamide copolymer are linear polymers. In some other examples, PAZAM and other forms of the acrylamide copolymer are lightly cross-linked polymers.

In other examples, the gel material may be a variation of the structure (I). In one example, the acrylamide unit may be replaced with N,N-dimethylacrylamide ( 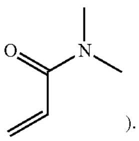 ).

In this example, the acrylamide unit in structure (I) may be replaced with

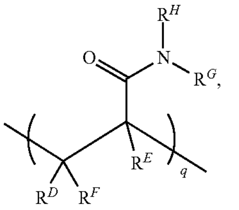, where $R^D$, $R^E$, and $R^F$ are each H or a C1-C6 alkyl, and $R^G$ and $R^H$ are each a C1-C6 alkyl (instead of H as is the case with the acrylamide). In this example, q may be an integer in the range of 1 to 100,000. In another example, the N,N-dimethylacrylamide may be used in addition to the acrylamide unit. In this example, structure (I) may include

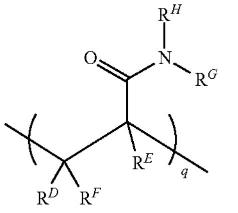

in addition to the recurring "n" and "m" features, where $R^D$, $R^E$, and $R^F$ are each H or a C1-C6 alkyl, and $R^G$ and $R^H$ are each a C1-C6 alkyl. In this example, q may be an integer in the range of 1 to 100,000.

As another example of the polymeric hydrogel, the recurring "n" feature in structure (I) may be replaced with a monomer including a heterocyclic azido group having structure (II):

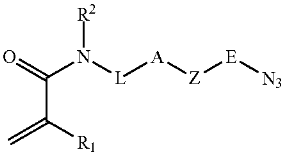

wherein $R^1$ is H or a $C_1$-$C_6$ alkyl; $R^2$ is H or a $C_1$-$C_6$ alkyl; L is a linker including a linear chain with 2 to 20 atoms selected from the group consisting of carbon, oxygen, and nitrogen and 10 optional substituents on the carbon and any nitrogen atoms in the chain; E is a linear chain including 1 to 4 atoms selected from the group consisting of carbon, oxygen and nitrogen, and optional substituents on the carbon and any nitrogen atoms in the chain; A is an N substituted amide with an H or a $C_1$-$C_4$ alkyl attached to the N; and Z is a nitrogen containing heterocycle. Examples of Z include 5 to 10 carbon-containing ring members present as a single cyclic structure or a fused structure. Some specific examples of Z include pyrrolidinyl, pyridinyl, or pyrimidinyl.

As still another example, the gel material may include a recurring unit of each of structure (Ill) and (IV):

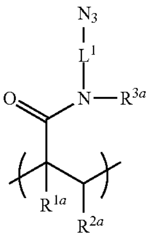

and

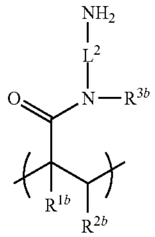

wherein each of $R^{1a}$, $R^{2a}$, $R^{1b}$ and $R^{2b}$ is independently selected from hydrogen, an optionally substituted alkyl or optionally substituted phenyl; each of $R^{3a}$ and $R^{3b}$ is independently selected from hydrogen, an optionally substituted alkyl, an optionally substituted phenyl, or an optionally substituted $C_7$-$C_{14}$ aralkyl; and each $L^1$ and $L^2$ is independently selected from an optionally substituted alkylene linker or an optionally substituted heteroalkylene linker.

It is to be understood that other molecules may be used to form the functionalized layer 24, 26, as long as they are capable of being functionalized with the desired chemistry, e.g., primer set(s) 30, 32. Some examples of suitable materials for the functionalized layer 24, 26 include functionalized silanes, such as norbornene silane, azido silane, alkyne functionalized silane, amine functionalized silane, maleimide silane, or any other silane having functional groups that can respectively attach the desired chemistry. Still other examples of suitable materials for the functionalized layer 24, 26 include those having a colloidal structure, such as agarose; or a polymer mesh structure, such as gelatin; or a cross-linked polymer structure, such as polyacrylamide polymers and copolymers, silane free acrylamide (SFA), or an azidolyzed version of SFA. Examples of suitable polyacrylamide polymers may be synthesized from acrylamide and an acrylic acid or an acrylic acid containing a vinyl group, or from monomers that form [2+2] photo-cycloaddition reactions. Still other examples of suitable materials for the functionalized layer 24, 26 include mixed copolymers of acrylamides and acrylates. A variety of polymer architectures containing acrylic monomers (e.g., acrylamides, acrylates etc.) may be utilized in the examples disclosed herein, such as branched polymers, including dendrimers (e.g., multi-arm or star polymers or star-block polymers), and the like. For example, the monomers (e.g., acrylamide, acrylamide containing the catalyst, etc.) may be incorporated, either randomly or in block, into the branches (arms) of a dendrimer.

The gel material of the functionalized layers 24, 26 may be formed using any suitable copolymerization process, such as nitroxide mediated polymerization (NMP), reversible addition-fragmentation chain-transfer (RAFT) polymerization, etc. The gel material may also be deposited using any of the methods disclosed herein.

The attachment of the functionalized layers 24, 26 to the underlying single base support 14, 14' or layer 18, 50, 52, and/or 72 (e.g., a metal oxide coating, a resin, etc.) of the multi-layer structure 16 may be through covalent bonding. In some instances, the underlying base support 14, 14' or layer 18, 50, 52, and/or 72 may first be activated, e.g., through silanization or plasma ashing. Covalent linking is helpful for maintaining the primer sets 30, 32 in the desired regions throughout the lifetime of the flow cell 10 during a variety of uses.

Each of the architectures also includes the primer sets 30, 32 attached to the respective functionalized layers 24, 26. In an example, the first primer set 30 includes an un-cleavable first primer and a cleavable second primer; and the second primer 32 set including a cleavable first primer and an un-cleavable second primer. FIG. 2A through FIG. 2D depict different configurations of the primer sets 30A, 32A, 30B, 32B, 30C, 32C, and 30D, 32D attached to the functionalized layers 24, 26.

Each of the first primer sets 30A, 30B, 30C, and 30D includes an un-cleavable first primer 34 or 34' and a cleavable second primer 36 or 36'; and each of the second primer sets 32A, 32B, 32C, and 32D includes a cleavable first primer 38 or 38' and an un-cleavable second primer 40 or 40'.

The un-cleavable first primer 34 or 34' and the cleavable second primer 36 or 36' are oligonucleotide pairs, e.g., where the un-cleavable first primer 34 or 34' is a forward amplification primer and the cleavable second primer 36 or 36' is a reverse amplification primer or where the cleavable second primer 36 or 36' is the forward amplification primer and the un-cleavable first primer 34 or 34' is the reverse amplification primer. In each example of the first primer set 30A, 30B, 30C, and 30D the cleavable second primer 36 or 36' includes a cleavage site 42, while the un-cleavable first primer 34 or 34' does not include a cleavage site 42.

The cleavable first primer 38 or 38' and the un-cleavable second primer 40 or 40' are also oligonucleotide pairs, e.g., where the cleavable first primer 38 or 38' is a forward amplification primer and un-cleavable second primer 40 or 40' is a reverse amplification primer or where the un-cleavable second primer 40 or 40' is the forward amplification primer and the cleavable first primer 38 or 38' is the reverse amplification primer. In each example of the second primer set 32A, 32B, 32C, and 32D, the cleavable first primer 38 or 38' includes a cleavage site 42' or 44, while the un-cleavable second primer 40 or 40' does not include a cleavage site 42' or 44.

It is to be understood that the un-cleavable first primer 34 or 34' of the first primer set 30A, 30B, 30C, and 30D and the cleavable first primer 38 or 38' of the second primer set 32A, 32B, 32C, and 32D have the same nucleotide sequence (e.g., both are forward amplification primers), except that the cleavable first primer 38 or 38' includes the cleavage site 42' or 44 integrated into the nucleotide sequence or into a linker 46' attached to the nucleotide sequence. Similarly, the cleavable second primer 36 or 36' of the first primer set 30A, 30B, 30C, and 30D and the un-cleavable second primer 40 or 40' of the second primer set 32A, 32B, 32C, and 32D have the same nucleotide sequence (e.g., both are reverse amplification primers), except that the cleavable second primer 36 or 36' includes the cleavage site 42 integrated into the nucleotide sequence or into a linker 46 attached to the nucleotide sequence.

It is to be understood that when the first primers 34 and 38 or 34' and 38' are forward amplification primers, the second primers 36 and 40 or 36' and 40' are reverse primers, and vice versa.

The un-cleavable primers 34, 40 or 34', 40' may be any primers with a universal sequence for capture and/or amplification purposes, such as P5 and P7 primers. Examples of P5 and P7 primers are used on the surface of commercial flow cells sold by Illumina Inc. for sequencing, for example, on HiSeq™, HiSegX™, MiSeq™, MiSegDX™, MiNISeg™, NextSeq™, NextSegDX™, NovaSeq™, iSEQ™, Genome Analyzer™, and other instrument platforms. In an example, the P5 and P7 primers include the following:

```
P5: 5' → 3'
                         (SEQ. ID. NO. 1)
AATGATACGGCGACCACCGA
P7: 5' → 3'
                         (SEQ. ID. NO. 2)
CAAGCAGAAGACGGCATACGA
```

In some examples, the P5 and P7 primers are un-cleavable primers 34, 40 or 34', 40' because they do not include a cleavage site 42, 42', 44. It is to be understood that any suitable universal sequence can be used as the un-cleavable primers 34, 40 or 34', 40'.

Figure 2A:
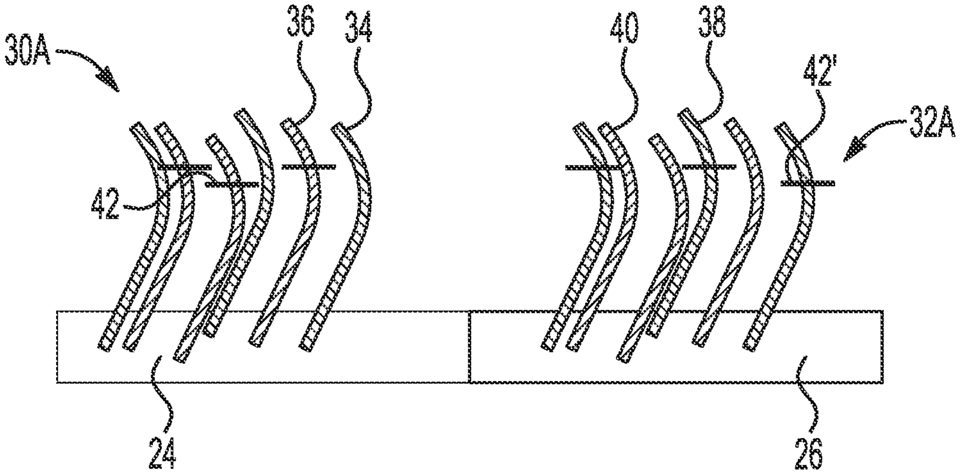
FIG. 2A is a schematic view of an example of a first and second primer set that is used in the flow cells disclosed herein.
Figure 2B:
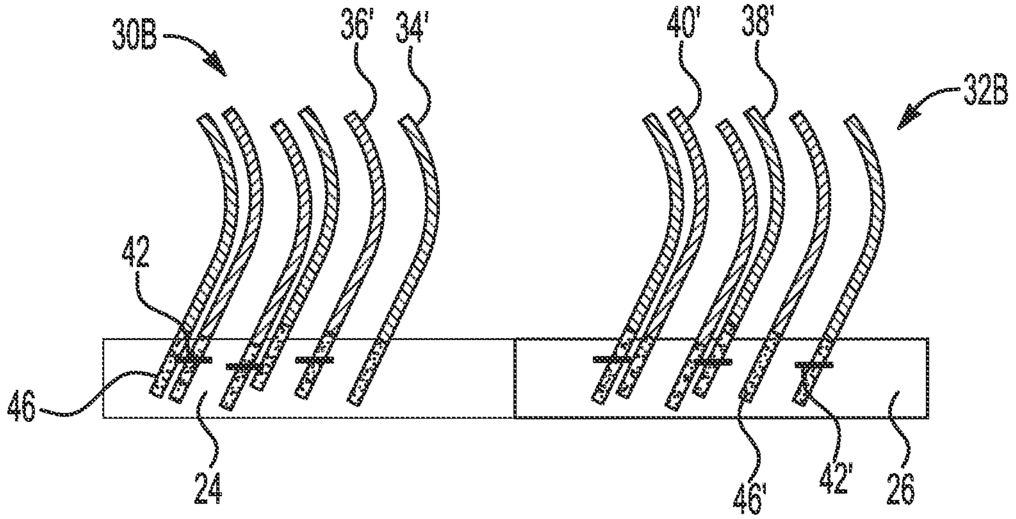
FIG. 2B is a schematic view of another example of a first and second primer set that is used in the flow cells disclosed herein.
Figure 2C:
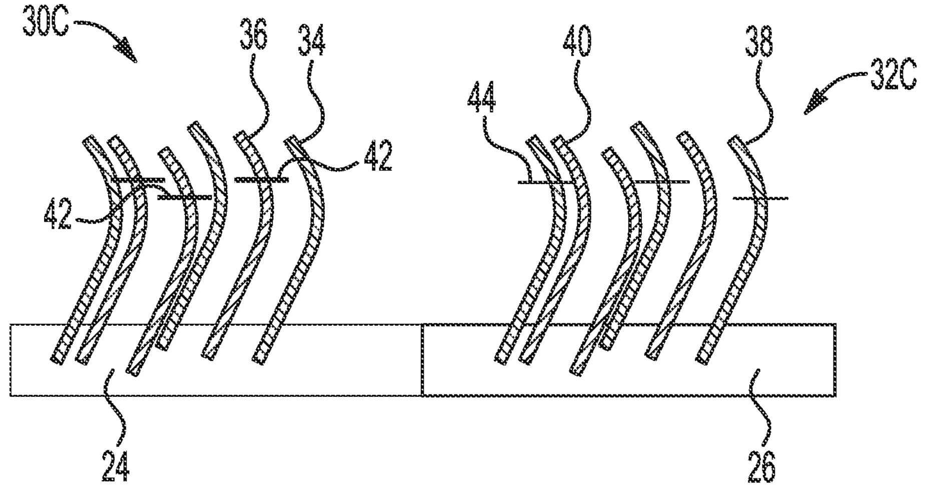
FIG. 2C is a schematic view of yet another example of a first and second primer set that is used in the flow cells disclosed herein.
Figure 2D:
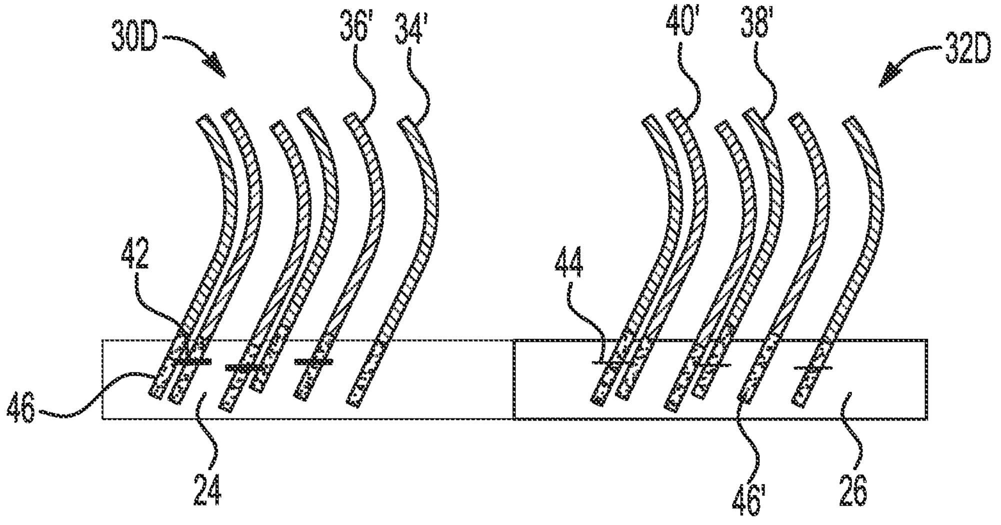
FIG. 2D is a schematic view of yet another example of a first and second primer set that is used in the flow cells disclosed herein.

Examples of cleavable primers 36, 38 or 36', 38' include the P5 and P7 (or other universal sequence) primers with the respective cleavage sites 42, 42', 44 incorporated into the respective nucleic acid sequences (e.g., FIG. 2A and FIG. 2C), or into a linker 46', 46 that attaches the cleavable primers 36, 38 or 36', 38' to the respective functionalized layers 24, 26 (FIG. 2B and FIG. 2D). Examples of suitable cleavage sites 42, 42', 44 include enzymatically cleavable nucleobases or chemically cleavable nucleobases, modified nucleobases, or linkers (e.g., between nucleobases), as described herein. As examples, the P5 sequence may include a uracil base or an allyl T (a thymine nucleotide analog having an allyl functionality) at the $7^{th}$ position from the 3' end, and the P7 sequence may include 8-oxoguanine at the $3^{rd}$ or 5th position from the 3' end.

Each primer set 30A and 32A or 30B and 32B or 30C and 32C or 30D and 32D is attached to a respective functionalized layer 24, 26. In some examples, the functionalized layers 24, 26 have the same surface chemistry, and any of the techniques set forth herein may be used to graft one primer set 30 on the functionalized layer 24 or 26, and another primer set 32 on the other functionalized layer 26 or 24. In other examples, the functionalized layers 24, 26 include different surface chemistries (e.g., functional groups) that can selectively react with the respective primers 34, 36 or 34', 36' or 38, 40 or 38', 40'. In these other examples, the functionalized layer 24 has a first functional group, and the functionalized layer 26 has a second functional group that is different than the first functional group.

As mentioned, FIG. 2A through FIG. 2D depict different configurations of the primer sets 30A, 32A, 30B, 32B, 30C, 32C, and 30D, 32D attached to the functionalized layers 24, 26. More specifically, FIG. 2A through FIG. 2D depict different configurations of the primers 34, 36 or 34', 36' and 38, 40 or 38', 40' that may be used.

In the example shown in FIG. 2A, the primers 34, 36 and 38, 40 of the primer sets 30A and 32A are directly attached to the functionalized layers 24 and 26, for example, without a linker 46, 46'. The functionalized layer 24 may have surface functional groups that can immobilize the terminal groups at the 5' end of the primers 34, 36. Similarly, the functionalized layer 26 may have surface functional groups that can immobilize the terminal groups at the 5' end of the primers 38, 40. In one example, the immobilization chemistry between the functionalized layer 24 and the primers 34, 36 and the immobilization chemistry between the functionalized layer 26 and the primers 38, 40 may be different so that the primers 34, 36 or 38, 40 selectively attach to the desirable layer 24 or 26. For example, the functionalized layer 24 may be an azido silane that can graft an alkyne terminated primer, and the functionalized layer 26 may be an alkyne functionalized silane that can graft an azide terminated primer. For another example, the functionalized layer 24 may be an amine functionalized silane that can graft an NHS-ester terminated primer, and the functionalized layer 26 may be maleimide silane that can graft a thiol terminated primer. In another example, the immobilization chemistry may be the same for layer 24 and layer 26 and the respective primers 34, 36 or 38, 40, and a patterning technique may be used to graft one primer set 30A, 32A at a time. In still another example, the materials applied to form the functionalized layers 24, 26 may have the respective primers 34, 36 or 38, 40 pre-grafted thereto, and thus the immobilization chemistries may be the same or different.

In this example, immobilization may be by single point covalent or by a strong non-covalent attachment to the respective functionalized layer 24, 26 at the 5' end of the respective primers 34 and 36 or 38 and 40.

Examples of terminated primers that may be used include an alkyne terminated primer, a tetrazine terminated primer, an azido terminated primer, an amino terminated primer, an epoxy or glycidyl terminated primer, a thiophosphate terminated primer, a thiol terminated primer, an aldehyde terminated primer, a hydrazine terminated primer, a phosphoramidite terminated primer, a triazolinedione terminated primer, and a biotin-terminated primer. In some specific examples, a succinimidyl (NHS) ester terminated primer may be reacted with an amine at a surface of the functionalized layer 24, 26, an aldehyde terminated primer may be reacted with a hydrazine at a surface of the functionalized layer 24, 26, or an alkyne terminated primer may be reacted with an azide at a surface of the functionalized layer 24, 26, or an azide terminated primer may be reacted with an alkyne or DBCO (dibenzocyclooctyne) at a surface of the functionalized layer 24, 26, or an amino terminated primer may be reacted with an activated carboxylate group or NHS ester at a surface of the functionalized layer 24, 26, or a thiol terminated primer may be reacted with an alkylating reactant (e.g., iodoacetamine or maleimide) at a surface of the functionalized layer 24, 26, a phosphoramidite terminated primer may be reacted with a thioether at a surface of the functionalized layer 24, 26, or a biotin-modified primer may be reacted with streptavidin at a surface of the functionalized layer 24, 26.

Also, in the example shown in FIG. 2A, the cleavage site 42, 42' of each of the cleavable primers 36, 38 is incorporated into the sequence of the primer. In this example, the same type of cleavage site 42, 42' is used in the cleavable primers 36, 38 of the respective primer sets 30A, 32A. As an example, the cleavage sites 42, 42' are uracil bases, and the cleavable primers 36, 38 are P5U and P7U. In this example, the un-cleavable primer 34 of the oligonucleotide pair 34, 36 may be P7, and the un-cleavable primer 40 of the oligonucleotide pair 38, 40 may be P5. Thus, in this example, the first primer set 30A includes P7, P5U and the second primer set 32A includes P5, P7U. The primer sets 30A, 32A have opposite linearization chemistries, which, after amplification, cluster generation, and linearization, allows forward template strands to be formed on one functionalized layer 24 or 26 and reverse strands to be formed on the other functionalized layer 26 or 24.

In the example shown in FIG. 2B, the primers 34', 36' and 38', 40' of the primer sets 30B and 32B are attached to the functionalized layers 24, 26, for example, through linkers 46, 46'. The functionalized layer 24 may have surface functional groups that can immobilize the linker 46 at the 5' end of the primers 34', 36'. Similarly, the functionalized layer 26 may have surface functional groups that can immobilize the linker 46' at the 5' end of the primers 38', 40'. In one example, the immobilization chemistry for the functionalized layer 24 and the linkers 46 and the immobilization chemistry for the functionalized layer 26 and the linkers 46' may be different so that the primers 34', 36' or 38', 40' selectively graft to the desirable functionalized layer 24 or 26. In another example, the immobilization chemistry may be the same for the functionalized layers 24 and 26 and the linkers 46, 46', and any suitable technique disclosed herein may be used to graft one primer set 30B, 32B at a time. In still another example, the materials applied to form the functionalized layers 24 and 26 may have the respective primers 34', 36' and 38', 40' pre-grafted thereto, and thus the immobilization chemistries may be the same or different. Examples of suitable linkers 46, 46' may include nucleic acid linkers (e.g., 10 nucleotides or less) or non-nucleic acid linkers, such as a polyethylene glycol chain, an alkyl group or a carbon chain, an aliphatic linker with vicinal diols, a peptide linker, etc. An example of a nucleic acid linker is a polyT spacer, although other nucleotides can also be used. In one example, the spacer is a 6T to 10T spacer. The following are some examples of nucleotides including non-nucleic acid linkers (where B is the nucleobase and "oligo" is the primer):

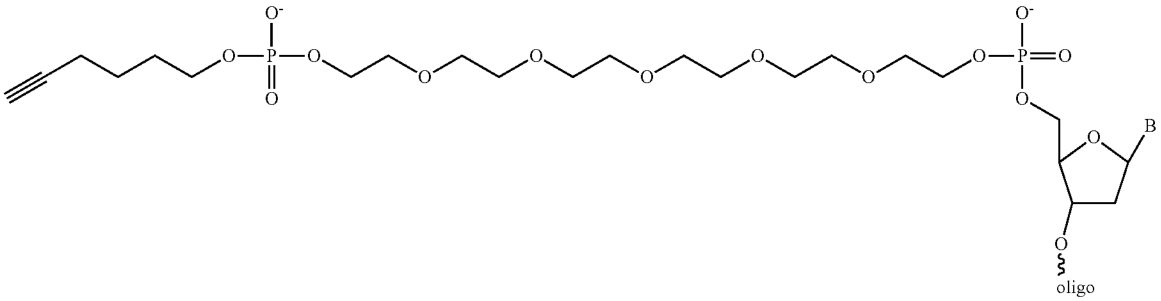

5′ Hexynyl-HEG-oligo

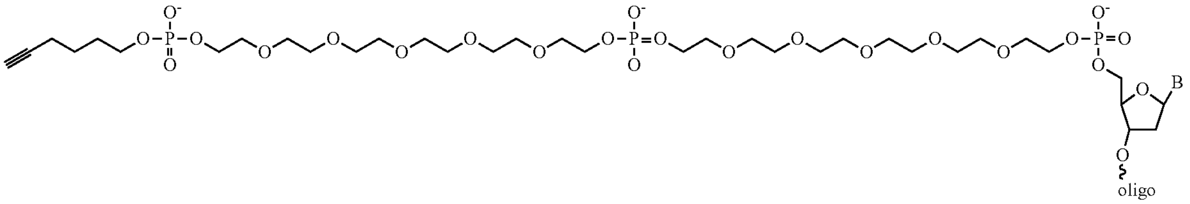

5′ Hexynyl-HEG-HEG-oligo

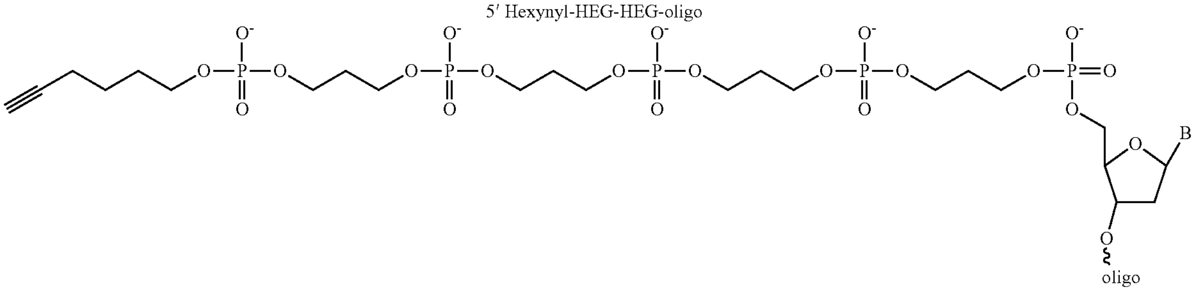

5′ Hexynyl-C3 spacer-C3 spacer-C3 spacer-C3 spacer-oligo

In the example shown in FIG. 2B, the primers 34', 38' have the same sequence (e.g., P5) and the same or different linker 46, 46'. The primer 34' is un-cleavable, whereas the primer 38' includes the cleavage site 42' incorporated into the linker 46'. Also in this example, the primers 36', 40' have the same sequence (e.g., P7) and the same or different linker 46, 46'. The primer 40' in un-cleavable, and the primer 36' includes the cleavage site 42 incorporated into the linker 46. The same type of cleavage site 42, 42' is used in the linker 46, 46' of each of the cleavable primers 36', 38'. As an example, the cleavage sites 42, 42' may be uracil bases that are incorporated into nucleic acid linkers 46, 46'. The primer sets 30B, 32B have opposite linearization chemistries, which, after amplification, cluster generation, and linearization, allows forward template strands to be formed on one functionalized layer 24 or 26 and reverse strands to be formed on the other functionalized layer 26 or 24.

The example shown in FIG. 2C is similar to the example shown in FIG. 2A, except that different types of cleavage sites 42, 44 are used in the cleavable primers 36, 38 of the respective primer sets 30C, 32C. As examples, two different enzymatic cleavage sites may be used, two different chemical cleavage sites may be used, or one enzymatic cleavage site and one chemical cleavage site may be used. Examples of different cleavage sites 42, 44 that may be used in the respective cleavable primers 36, 38 include any combination of the following: vicinal diol, uracil, allyl ether, disulfide, restriction enzyme site, and 8-oxoguanine.

The example shown in FIG. 2D is similar to the example shown in FIG. 2B, except that different types of cleavage sites 42, 44 are used in the linkers 46, 46' attached to the cleavable primers 36', 38' of the respective primer sets 30D, 32D. Examples of different cleavage sites 42, 44 that may be used in the respective linkers 46, 46' attached to the cleavable primers 36', 38' include any combination of the following: vicinal diol, uracil, allyl ether, disulfide, restriction enzyme site, and 8-oxoguanine.

In any of the examples shown in FIG. 2A through FIG. 2D, the attachment of the primers 34, 36 and 38, 40 or 34', 36' and 38', 40' to the functionalized layers 24, 26 leaves a template-specific portion of the primers 34, 36 and 38, 40 or 34', 36' and 38', 40' free to anneal to its cognate template and the 3' hydroxyl group free for primer extension.

Different methods may be used to generate the flow cell architectures disclosed herein. The various methods will now be described.

Methods for Making the Flow Cell Architecture of FIG. 1B

The architecture shown in FIG. 1B may be generated by a variety of methods that utilize backside exposure of a photoresist. Several methods are shown in reference to the FIG. 3 series, the FIG. 6 series, and the FIG. 7 series.

Figures 3I, 3J, 3K, 3L, 3M, 3N, 3O:
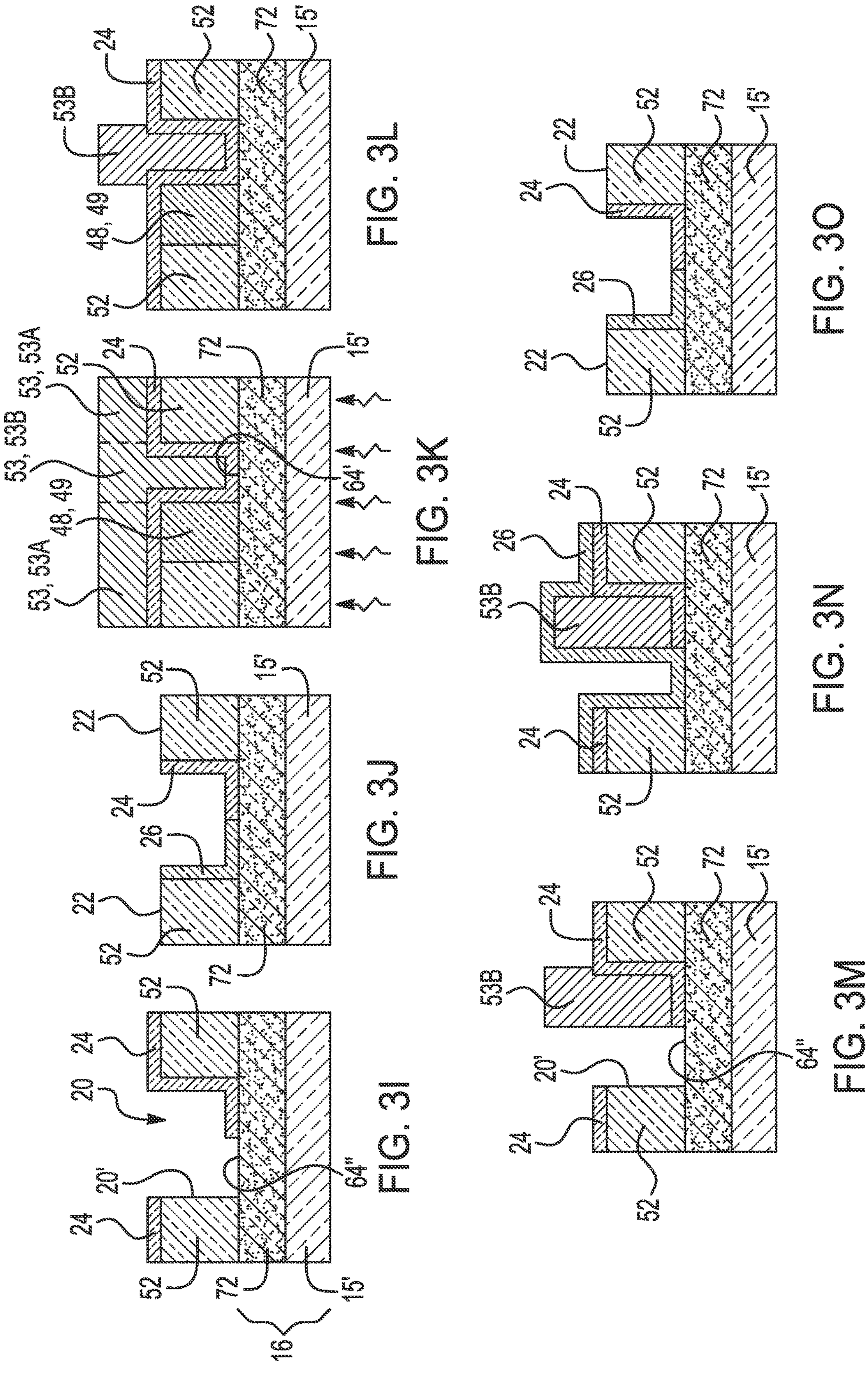

The examples shown in FIG. 3A through FIG. 3O, in FIG. 6A through FIG. 6R and FIG. 7A through FIG. 7O utilize one layer that acts as a photomask.

The examples shown in FIG. 3A through FIG. 3O generally include imprinting a resin layer 50 of a multi-layer stack 54 to form a multi-height convex region 88 (FIG. 3B). The multi-height convex region 88 includes a first region with a first height $H_1$ and a second region with a second height $H_2$ that is smaller than the first height $H_1$, wherein the multi-layer stack 54 may include the resin layer 50 over a sacrificial layer 48 over a transparent substrate (e.g., single layer base support 14' or, as shown in FIG. 3A, the multi-layer structure 16 including the transparent base support 15' and the transparent layer 72). The method further includes selectively etching portions of the multi-layer stack 54 around the multi-height convex region 88 to expose a portion 64 of the transparent substrate (FIG. 3C); and utilizing the multi-layer stack 54 to develop a curable layer 52' through the transparent substrate to define a cured layer 52 over the exposed portion 64 of the transparent substrate (FIG. 3D through FIG. 3F). The method further includes simultaneously etching i) the multi-height convex region 88 to remove the resin layer 50 and a portion of the sacrificial layer 48 underlying the second region of the multi-height convex region 88, thereby exposing a second portion 64' of the transparent substrate and whereby a third portion 64" of the transparent substrate remains covered by a remaining portion of the sacrificial layer 48 (FIG. 3G); and ii) the cured layer 52 such that it is substantially co-planar with the remaining portion of the sacrificial layer 48, thereby forming a depression 20 extending to the second portion 64' of the transparent substrate. The method further includes utilizing the remaining portion of the sacrificial layer 48 to define first and second functionalized layers 24, 26 over different regions of the depression 20.

Prior to utilizing the remaining portion of the sacrificial layer 48 to define first and second functionalized layers 24, 26 over different regions of the depression 20, the method may further include applying the first functionalized layer 24 over the cured layer 52, the remaining portion of the sacrificial layer 48, and the second portion 64' of the transparent substrate (see FIG. 3H).

In one example, the method may then utilize the remaining portion of the sacrificial layer 48 to define the first and second functionalized layers 24, 26 over different regions of the depression 20, which involves: lifting off the remaining portion of the sacrificial layer 48, thereby exposing the third portion 64" of the transparent substrate; applying the second functionalized layer 26 over the third portion 64" of the transparent substrate; and removing the first functionalized layer 24 from the cured layer 52 (see FIG. 3I and FIG. 3J).

in another example, the method may then utilize the remaining portion of the sacrificial layer 48 to define the first and second functionalized layers 24, 26 over different regions of the depression 20, which involves: applying a negative photoresist 53 over the first functionalized layer 24; directing, through the transparent substrate, an ultraviolet light dosage, thereby forming an insoluble negative photoresist 53B over a portion of the first functionalized layer 24 that overlies the second portion 64' of the transparent substrate and a soluble negative photoresist 52A over the cured layer 52 and the remaining portion of the sacrificial layer 48; removing the soluble negative photoresist 52A; and etching the remaining portion of the sacrificial layer 48, thereby exposing the third portion 63" of the transparent substrate. The method may further include, applying the second functionalized layer 26 over the insoluble negative photoresist 53B, the third portion 64" of the transparent substrate, and another portion of the first functionalized layer 24 that overlies the cured layer 52; removing the insoluble negative photoresist 53B; and removing the first and second functionalized layers 24, 26 from the cured layer 52 (see FIG. 3K through FIG. 3O). The method may further include silanizing the second portion 64' of the transparent support prior to applying the first functionalized layer 24 and/or may further comprise silanizing the third portion 64" of the transparent substrate prior to applying the second functionalized layer 26.

Each of the methods and the various steps will now be described in more detail in reference to the respective figures.

FIG. 3A through 3O illustrate two different examples of the method for making the flow cell architecture of FIG. 1B, which includes the functionalized layers 24, 26. One example is shown at FIG. 3A through FIG. 3I. Another example is shown at FIG. 3A through FIG. 3H and FIG. 3K through FIG. 3O.

Each of these methods begins with a multi-layer stack 54 of materials, which includes a resin layer 50 positioned over a sacrificial layer 48 positioned over the transparent substrate, which, as shown in FIG. 3A, is a multi-layer structure 16 including the transparent base support 15' and the transparent layer 72. In these examples, the base support 15' is a transparent material, such as glass or tantalum pentoxide. In these examples, the transparent base support 15' is transparent to ultraviolet wavelengths used in backside exposure. In the example shown in FIG. 3A, the multi-layer structure 16 includes an additional layer, transparent layer 72, such as a tantalum oxide ($TaO_x$), silicon dioxide ($SiO_2$), or another transparent layer supported by the transparent base support 15'.

To generate the multi-layer stack 54, the sacrificial layer 48 is deposited over the transparent layer 72 positioned on the transparent base support 15'. Examples of suitable materials for the sacrificial layer 48 include metals, such as aluminium, copper, gold, etc. In some examples, the metal may be at least substantially pure (<99% pure). In other examples, molecules or compounds of the listed elements may be used as long as the sacrificial layer 48 is opaque (non-transparent or having transmittance less than 0.25) to the light energy used for curable layer 52' and negative photoresist 53 development. For example, oxides of any of the listed metals (e.g., aluminium oxide) may be used, alone or in combination with the listed metal. These materials may be deposited using any suitable technique disclosed herein. The sacrificial layer 48 positioned over transparent layer 72 positioned over the transparent base support 15' is shown in FIG. 3A.

It is to be understood that the thickness of the sacrificial layer 48 may correspond to a depth of the depression 20 that is to be formed, and thus the sacrificial layer 48 protects the sidewalls 20' from contamination that leads to the padlock like conformation. As will be described in reference to FIG. 3G, the cured layer 52 is etched back so that it is substantially co-planar with the sacrificial layer 48. The portion of the cured layer 52 that abuts the sacrificial layer 48 (shown at reference numeral 51 in FIG. 3G) ultimately defines a portion of the depression sidewall 20'. Because the sacrificial layer 48 covers the portion 51 during functionalized layer 24 deposition (FIG. 3H), the functionalized layer 24 does not deposit on the portion 51 and thus does not generate the padlock like conformation. In an example, the thickness of the sacrificial layer 48 may be at least about (in nm) 50, 100, 150, 200, 250, 300, 350, 400, 450, 500, 550, 600, 650, 700, or 750. In an example, the thickness of the sacrificial layer 48 may be less than about (in nm) 800, 750, 700, 650, 600, 550, 500, 450, 400, 350, 300, 250, 200, 150, or 100. In other examples, the thickness of the sacrificial layer 48 may be in a range provided by any two of the upper and/or lower thickness, such as between about 50 nm and 750 nm, between about 100 nm and 500 nm, or between about 200 nm to 350 nm.

The resin layer 50 is then deposited over the sacrificial layer 48, as shown in FIG. 3A. The resin layer 50 may be any of the example resins set forth herein, and may be deposited using any suitable technique disclosed herein. For some deposition techniques, the resin may be mixed in a liquid carrier, such as propylene glycol monomethyl ether acetate (PGMEA), toluene, dimethyl sulfoxide (DMSO), tetrahydrofuran (THF), etc. In one example, the resin layer 50 is a lift-off resist. Examples of suitable lift-off resists include those that are commercially available from Kayaku Advanced Materials, Inc. (formerly MicroChem), which are based on a polymethylglutarimide platform. The lift-off resist may be spun on or otherwise deposited, cured, and subsequently removed at a desirable time in the process.

As shown in FIG. 3B, the resin layer 50 is imprinted to form a multi-height convex region 88 including a first region with a first height $H_1$ and a second region with a second height $H_2$ that is smaller than the first height $H_1$. Any suitable imprinting technique may be used. In one example, a working stamp is pressed into the resin layer 50 while it is soft, which creates an imprint of the working stamp features in the resin layer 50. The resin layer 50 may then be cured with the working stamp in place.

Curing may be accomplished by exposure to actinic radiation, such as visible light radiation or ultraviolet (UV) radiation, when a radiation-curable resin material is used; or by exposure to heat when a thermal-curable resin material is used. Curing may promote polymerization and/or cross-linking. As an example, curing may include multiple stages, including a softbake (e.g., to drive off any liquid carrier that may be used to deposit the resin) and a hardbake. The softbake may take place at a lower temperature, ranging from about 50° C. to about 150° C. The duration of the hardbake may last from about 5 seconds to about 10 minutes at a temperature ranging from about 100° C. to about 300° C. Examples of devices that can be used for softbaking and/or hardbaking include a hot plate, oven, etc.

After curing, the working stamp is released. This creates topographic features in the resin layer 50. In this example method, the working stamp does not extend through the entire depth of the resin layer 50, and thus the underlying sacrificial layer 48 is not exposed after imprinting (as shown in FIG. 3B). The thinnest portions of the resin layer 50 after imprinting are shown at reference numeral 90.

The method proceeds with FIG. 3C. In this example, the multi-layer stack 54 is then selectively etched around the multi-height convex region 88 (at the thinnest portions 90 of the resin layer 50 and extending downward) to expose a portion 64 of the transparent layer 72 positioned over the transparent base support 15'. In this example, etching exposes the portions 64 of the transparent layer 72 positioned over transparent base support 15', and the portions of the multi-layer stack 54 that underlie the multi-height convex region 88 remain unetched. This effectively extends the multi-height convex region 88 down to the transparent layer 72 positioned over the transparent base support 15'.

In this example, the resin layer 50 may be etched, followed by a portion of the sacrificial layer 48. Any exposed areas of these layers 50, 48 around the multi-height convex region 88 may be etched during this process, as indicated by the downward arrow in FIG. 3C. It is to be understood that the entire resin layer 50 is exposed to etching, and thus the first and second heights $H_1$ and $H_2$ are reduced, e.g., by an amount that equates to the thickness of the portions 90. Because the portions 90 (FIG. 3B) of the resin layer 50 around the multi-height convex region 88 are thinner than each of the first and second heights $H_1$ and $H_2$, the sacrificial layer 48 (which acts as an etch stop) underlying these portions 90 will be exposed before the multi-height convex region 88 is etched away.

Different etching techniques may be used for the resin layer 50 (including portions 90) and the underlying sacrificial layer 48. In one example, dry etching is used for the resin layer 50, such as with a $CF_4$ plasma or a mixture of 90% $CF_4$ and 10% $O_2$ plasma, and chlorine-based plasma (e.g., $BCl_3+Cl_2$) is used for sacrificial layer 48. The sacrificial layer 48 effectively acts as an etch stop for the resin layer etching, and the transparent layer 72 effectively acts as an etch stop for the sacrificial layer etching.

The multi-layer stack 54 is then used to develop a curable layer 52' through the transparent substrate (multi-layer stack 16) to define an insoluble cured layer 52 at portion(s) 64 of the transparent layer 72 positioned over transparent base support 15'. Curable layer deposition and development is shown in FIG. 3D to FIG. 3F. The curable layer 52' may be any of the example resins set forth herein or a negative photoresist including the SU-8 Series and the KMPR® Series (both of which are available from Kayaku Advanced Materials, Inc.), the UVN™ Series (available from DuPont), or the NR® series photoresist (available from Futurrex). When the curable layer 52' is used, it is selectively exposed to certain wavelengths of light to form an insoluble cured layer 52, and is exposed to a developer to remove soluble portions (e.g., those portions that are not exposed to the certain wavelengths of light). The type of developer that is used will depend upon the type of curable layer 52' that is used. Examples of suitable developers for a negative photoresist include aqueous-alkaline solutions, such as diluted sodium hydroxide, diluted potassium hydroxide, or an aqueous solution of the metal ion free organic TMAH (tetramethylammoniumhydroxide).

In this example, it is desirable for the insoluble cured layer 52 to remain on the portion(s) 64 of the transparent layer 72 positioned over transparent base support 15', and to be removed from the resin layer 50 (i.e., that remains after etching). As such, in the example shown in FIG. 3D, the light may be directed through the transparent base support 15', as indicated by the upward arrows in FIG. 3E. The curable layer 52' on the portion 64 will be exposed to the light and will become insoluble (at least in the developer used). The sacrificial layer 48 blocks at least 75% of light that is transmitted through the transparent base support 15', thus at least substantially preventing the light from reaching the curable layer 52' that is positioned over the resin layer 50 and the sacrificial layer 48. The portions not exposed to the light energy remain soluble and are removed with the developer.

The multi-layer stack 54 after development of the curable layer 52' is shown in FIG. 3F.

The multi-height convex region 88 is then selectively etched to remove the resin layer 50 and a portion of the sacrificial layer 48 underlying the second region (with height $H_2$) of the multi-height convex region 88, thereby exposing a second portion 64' of the transparent layer 72 positioned over transparent base support 15'. Different etching techniques may be used for the resin layer 50 and the portion of the sacrificial layer 48 underlying the second height $H_2$. In one example, dry etching (e.g., $CF_4$ plasma or a mixture of 90% $CF_4$ and 10% $O_2$ plasma) is used for the resin layer 50, and chlorine-based plasma (e.g., $BCl_3+Cl_2$) is used for sacrificial layer 48. The resin layer 50 may be resistant to the sacrificial layer etchant and the sacrificial layer 48 may be resistant to the resin layer etchant. Additionally, as mentioned herein, the sacrificial layer 48 effectively acts as an etch stop for the resin layer etching, and the transparent layer 72 effectively acts as an etch stop for the sacrificial layer resin etching.

In this example then, the resin layer 50 may be etched until the second region (with height $H_2$) is removed, which will also reduce the first region (with height $H_1$) by the same amount. Then, with the first region of the resin layer 50 still covering a portion of the sacrificial layer 48, the exposed portion of the sacrificial layer 48 (underlying the second region) may be etched until the transparent layer 72 is exposed at portion 64'. This etching process exposes some of the sidewall 20' which will form a portion of the depression 20. Also during this etching process, the portion 49 of the sacrificial layer 48 underlying the first region of the resin layer 50 remains intact.

It is to be understood that the transparent layer 72 may also be selected to be resistant to the resin layer etchant. Thus, after the portion 64' of the transparent layer 72 is exposed, the remainder of the resin layer 50, i.e., the first region with height $H_1$, may be etched again until the remaining portion 49 of the sacrificial layer 48 is exposed. Due, in part, to the height differences of the resin layer 50, the portion 49 of the sacrificial layer 48 underlying the first height $H_1$ remains at least substantially intact after the etching processes are complete.

The cured layer 52 may be selected so that it is resistant to the lift-off process that is to be used to remove the portion 49 of the sacrificial layer 48 (see FIG. 3I and FIG. 3M), and so that it is susceptible to the etchants used for the resin layer 50 and the sacrificial layer 48. Thus, portions of the cured layer 52 may be removed during resin layer etching and sacrificial layer etching. Because it is desirable for the remaining cured layer 52 to be substantially coplanar with the portion 49 of the sacrificial layer 48, the initial thickness of the cured layer 52 may be determined by the rate at which the cured layer 52 is etched during resin layer etching and during sacrificial layer etching.

The multi-layer stack after etching is shown in FIG. 3G. As depicted, a top surface of the etched cured layer 52 is substantially co-planar with a top surface of the remaining portion 49 of the sacrificial layer 48.

As shown at FIG. 3H, the first functionalized layer 24 is then applied over the remaining multi-layer stack. More particularly, the first functionalized layer 24 is applied on the exposed portions 64' of the transparent base support 15', the remaining portion 49 of the sacrificial layer 48, and the cured layer 52. The first functionalized layer 24 may be any of the examples set forth herein and may be applied using any suitable deposition technique.

The application of the first functionalized layer 24 may involve first activating the second portion 64' (at FIG. 3G) to generate surface groups to react with the first functionalized layer 24, and then depositing the first functionalized layer 24. As such, the first functionalized layer 24 covalently attaches to the portion 64'. The covalent attachment of the first functionalized layer 24 to the portion 64' is strong, and thus is not affected by subsequent processing, such as the removal of the sacrificial layer 48 (described in reference to FIG. 3I). Activation may involve plasma ashing or silanization. The exposed surfaces of the cured layer 52 and the sacrificial layer 48 may also be exposed to activation. However, subsequent processing can remove the functionalized layer 24 at these surfaces, thus eliminating the padlock like conformation.

One example of the method then proceeds to FIG. 3I. In this example, the remaining portion 49 of the sacrificial layer 48 is removed to expose the third portion 64" of the transparent substrate, which in this example, is a portion of the surface of the transparent layer 72. For removal, the sacrificial layer 48 may be exposed to a suitable wet lift-off process. As examples, an aluminum sacrificial layer can be removed in acidic or basic conditions, a copper sacrificial layer can be removed using $FeCl_3$, and a copper or gold sacrificial layer can be removed in an iodine and iodide solution.

As shown in FIG. 3I, the wet lift-off process removes i) at least 99% of the sacrificial layer 48 and ii) the first functionalized layer 24 thereon. This process exposes the portion(s) 64" of the transparent layer 72 positioned over transparent base support 15'. This process also exposes the full depression 20, including the portion of the sidewall 20' that had abutted the remaining portion 49 of the sacrificial layer 48.

The second functionalized layer 26 is then applied over the other (third) portion 64" of the transparent layer 72 positioned over transparent base support 15", as shown at FIG. 3J. The second functionalized layer 26 may be applied using any suitable deposition technique, and when the deposition is performed under high ionic strength (e.g., in the presence of 10×PBS, NaCl, KCl, etc.), the second functionalized layer 26 does not deposit on or adhere to the first functionalized layer 24. As such, the portion 64" alone receives the second functionalized layer 26.

The application of the second functionalized layer 26 may involve first activating the third portion 64" (at FIG. 3I) to generate surface groups to react with the second functionalized layer 26, and then depositing the second functionalized layer 26. As such, the second functionalized layer 26 covalently attaches to the portion 64". The covalent attachment of the second functionalized layer 26 to the portion 64" is strong, and thus is not affected by subsequent processing, such as the polishing of the interstitial regions 22 (described in reference to FIG. 3J). Activation may involve plasma ashing or silanization. The functionalized layer 24 is unaffected by this activation process.

In FIG. 3J, the functionalized layer 24 that is positioned over the interstitial regions 22 is removed, e.g., using a polishing process. The polishing process may be performed with a chemical slurry (including, e.g., an abrasive, a buffer, a chelating agent, a surfactant, and/or a dispersant) which can remove the functionalized layer(s) 24 and/or 26 (in this example, the functionalized layer 24) from the interstitial regions 22 without deleteriously affecting the underlying material (cured layer 52) at those regions 22. Alternatively, polishing may be performed with a solution that does not include the abrasive particles.

The chemical slurry may be used in a chemical mechanical polishing system to polish the surface of the interstitial regions 22. The polishing head(s)/pad(s) or other polishing tool(s) is/are capable of polishing functionalized layer(s) 24, 26 that may be present over the interstitial regions 22 while leaving the functionalized layers 24, 26 in the depression(s) 20 at least substantially intact. As an example, the polishing head may be a Strasbaugh ViPRR II polishing head.

Cleaning and drying processes may be performed after polishing. The cleaning process may utilize a water bath and sonication. The water bath may be maintained at a relatively low temperature ranging from about 22° C. to about 30° C. The drying process may involve spin drying, or drying via another suitable technique.

While not shown, the methods described in FIG. 3A through FIG. 3J also includes attaching respective primer sets 30, 32 to the functionalized layers 24, 26. In some examples, the primers 34, 36 or 34', 36' (not shown in FIG. 3A through FIG. 3J) may be pre-grafted to the functionalized layer 24. Similarly, the primers 38, 40 or 38', 40' (not shown in FIG. 3A through FIG. 3J) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 3H). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted after the second functionalized layer 26 is applied (e.g., at FIG. 3J), as long as i) the functionalized layer 26 has different functional groups (than functionalized layer 24) for attaching the primers 38, 40 or 38', 40' or ii) unreacted functional groups of the functionalized layer 24 have been quenched, e.g., using the Staudinger reduction to amines or additional click reaction with a passive molecule such as hexynoic acid.

When grafting is performed during the method, grafting may be accomplished using any suitable grafting technique. As examples, grafting may be accomplished by flow through deposition (e.g., using a temporarily bound lid), dunk coating, spray coating, puddle dispensing, or by another suitable method. Each of these example techniques may utilize a primer solution or mixture, which may include the primer(s) 34, 36 or 34', 36' or 38, 40 or 38', 40', water, a buffer, and a catalyst.

Referring back to FIG. 3H, another example of the method then proceeds to FIG. 3K. This example method involves utilizing the multi-layer stack 54 (having the first functionalized layer 24 applied thereto) to develop a negative photoresist 53 (which may be a second negative photoresist depending upon the type of curable layer 52' that is used) through the second portion 64' of the transparent layer 72 positioned over transparent base support 15' to define an insoluble negative photoresist 53B at the second portion 64' of the transparent layer 72 positioned over transparent base support 15'.

In this example, it is desirable for the insoluble negative photoresist 53B to remain on the portion(s) 64' of the transparent layer 72, and to be removed from the remainder of the multi-layer stack. As such, in the example shown in FIG. 3K, the negative photoresist 53 may be applied to the entire multi-layer stack and then the light may be directed through the transparent base support 15' (as shown by the arrows). The negative photoresist 53 overlying the portion 64' will be exposed to the light and will become insoluble. The sacrificial layer 48 and the cured layer 52 blocks at least 75% of light that is transmitted through the transparent base support 15', thus at least substantially preventing the light from reaching the overlying negative photoresist 53. The portions 53A of the negative photoresist 53 not exposed to the light energy remain soluble and are removed with the developer. The multi-layer stack after the negative photoresist 53 development is shown in FIG. 3L.

In this example, the remaining portion 49 of the sacrificial layer 48 is removed to expose the third portion 64" of the transparent layer 72 positioned over transparent base support 15', as shown in FIG. 3M. For removal, the sacrificial layer 48 may be exposed to a suitable wet lift-off process as described in reference to FIG. 3I. As shown in FIG. 3M, this wet lift-off process removes at least 99% of the sacrificial layer 48. The functionalized layer 24 positioned on the sacrificial layer 48 may also be removed during this process. This process exposes the portion(s) 64" of the transparent layer 72. The insoluble negative photoresist 53B and the underlying first functionalized layer 24 are not affected by the removal of the sacrificial layer 48.

The second functionalized layer 26 is then applied. In these examples, the application of the second functionalized layer 26 may involve activating the portion 64" to generate surface groups to react with the second functionalized layer 26, and depositing the second functionalized layer 26. Activation may involve plasma ashing or silanization. The second functionalized layer 26 is then applied over the activated third portion 64" of the transparent layer 72. The second functionalized layer 26 is also applied over the insoluble negative photoresist 53B and the exposed functionalized layer 24 (as shown in FIG. 3N). The second functionalized layer 26 may be applied using any suitable deposition technique. Because the functionalized layers 24, 26 are subsequently removed from the interstitial regions 22 of the cured layer 52 (FIG. 3O), the high ionic conditions may not be used to keep the functionalized layer 26 from depositing on the functionalized layer 24.

Removal of the insoluble negative photoresist 53B may then be performed. Any suitable remover for the insoluble negative photoresist 53B may be used, such as dimethylsulfoxide (DMSO) with sonication, or acetone, or an NMP (N-methyl-2-pyrrolidone) based stripper. As shown in FIG. 3O, this process removes the insoluble negative photoresist 53B, and the second functionalized layer 26 that overlies the insoluble negative photoresist 53B.

The functionalized layers 24, 26 that are positioned over the interstitial regions 22 of the cured layer 52 are also removed, e.g., using a polishing process. The polishing process may be performed as described herein in reference to FIG. 3J.

It is to be understood that the functionalized layers 24, 26 are covalently attached to the transparent layer 72 of the transparent substrate and thus are not removed during photoresist 53B removal. The functionalized layers 24, 26 remain intact in the depression 20 surrounded by interstitial regions 22 of the cured layer 52.

While not shown, the method described in FIG. 3A through FIG. 3H and FIG. 3K through FIG. 3O also includes attaching respective primer sets 30, 32 to the functionalized layers 24, 26. In some examples, the primers 34, 36 or 34', 36' (not shown in FIG. 3A through FIG. 3H and FIG. 3K through FIG. 3O) may be pre-grafted to the functionalized layer 24. Similarly, the primers 38, 40 or 38', 40' (not shown in FIG. 3A through FIG. 3H and FIG. 3K through FIG. 3O) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 3H). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted after the second functionalized layer 26 is applied (e.g., at FIG. 3N). Alternatively, the primers 38, 40 or 38', 40' may be grafted after the second functionalized layer 26 is applied and the interstitial regions 22 are polished as long as i) the functionalized layer 26 has different functional groups (than functionalized layer 24) for attaching the primers 38, 40 or 38', 40' or ii) unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

Figure 6A:
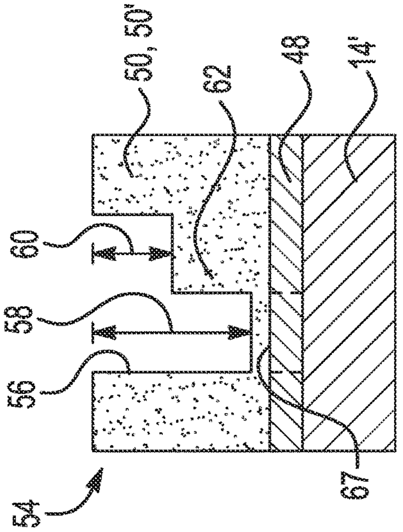
FIG. 6A through FIG. 6I are schematic views that illustrate one example of a method to generate the flow cell architecture shown in FIG. 1B, where
Figure 6B:
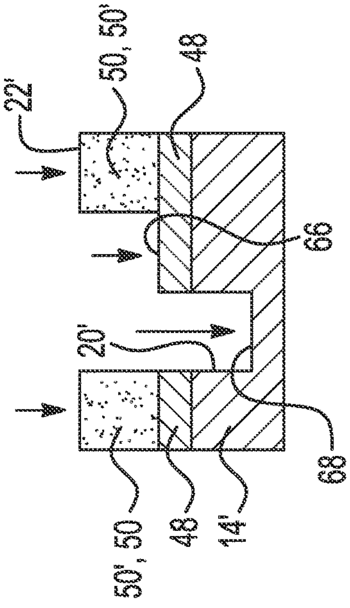
Figure 6C:
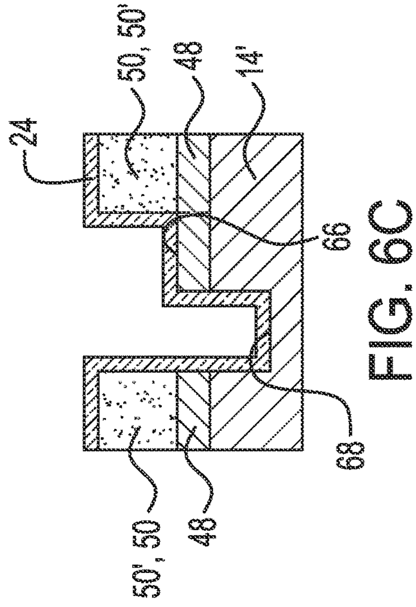
Figure 6D:
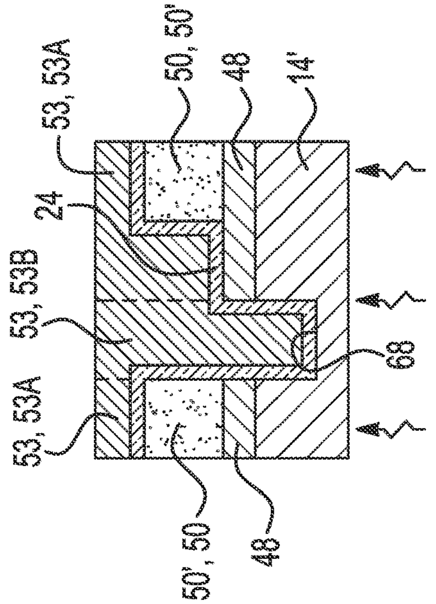
Figure 6E:
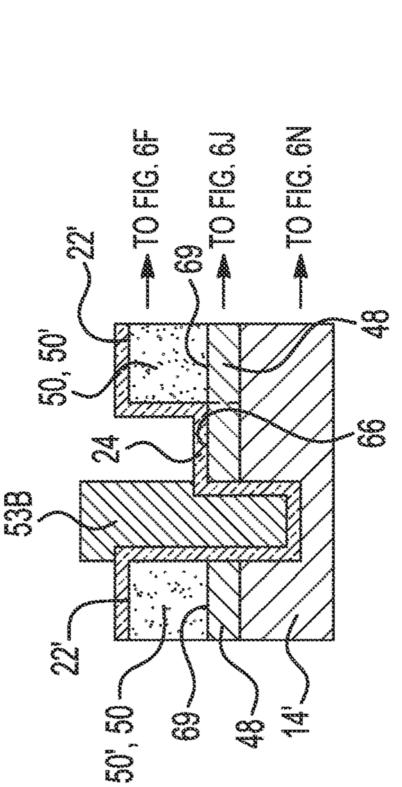
Figure 6F:
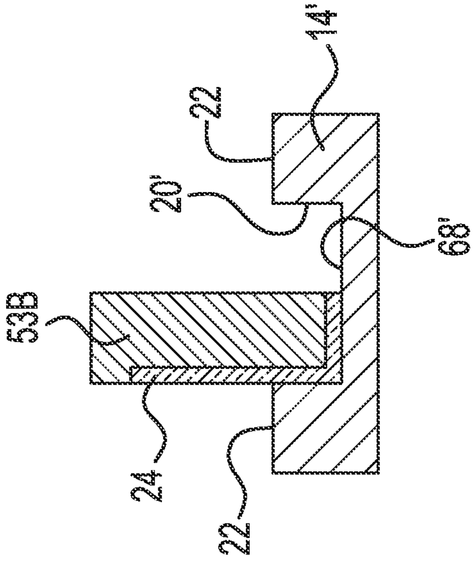
Figure 6G:
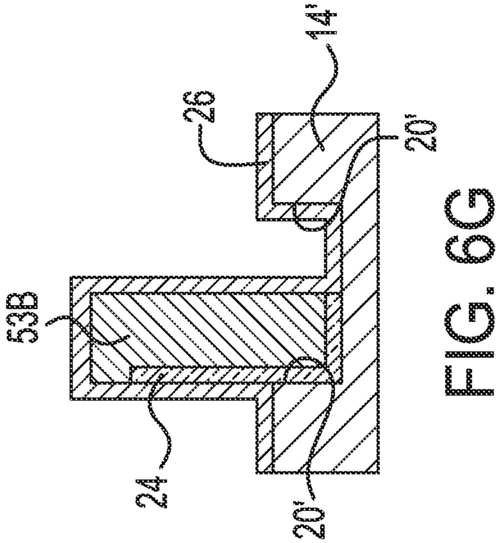
Figure 6H:
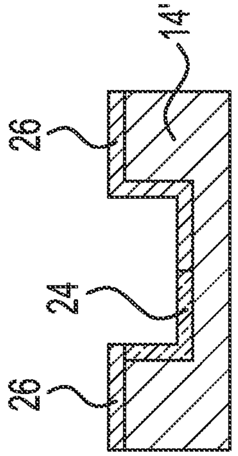
Figure 6I:
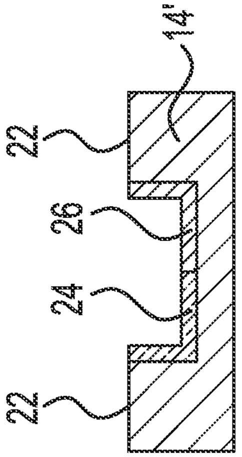
Figure 6J:
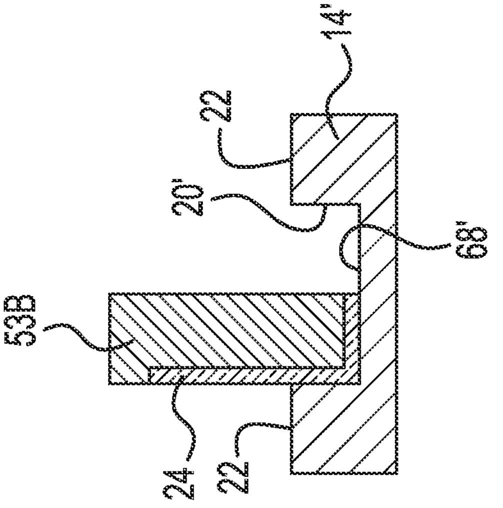
Figure 6K:
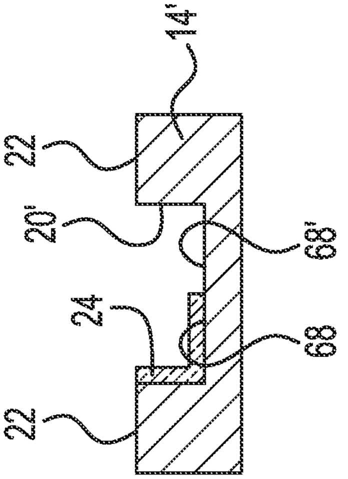
Figure 6L:
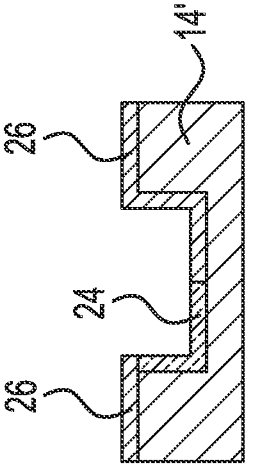
Figure 6M:
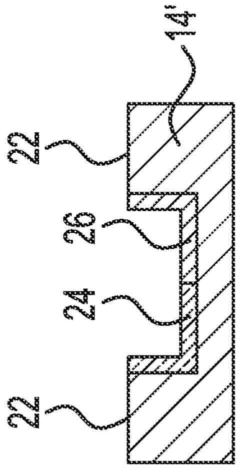
Figure 6P:
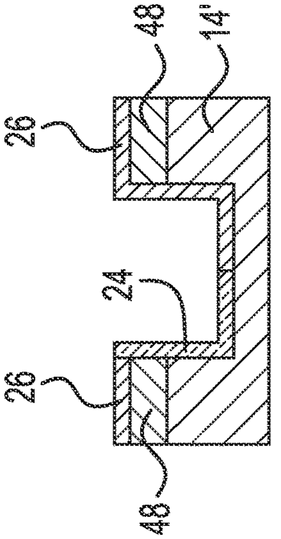
Figure 6O:
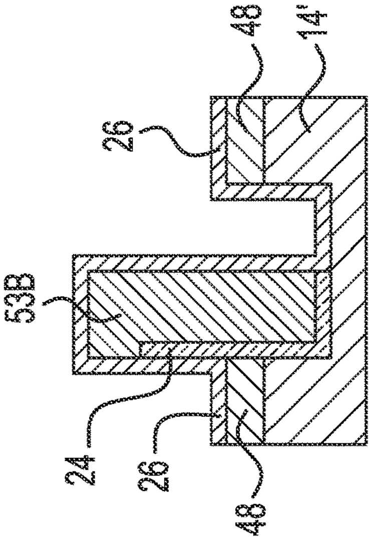
Figure 6N:
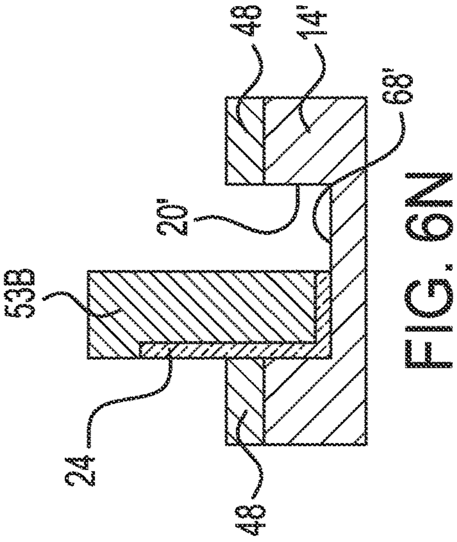
Figure 6R:
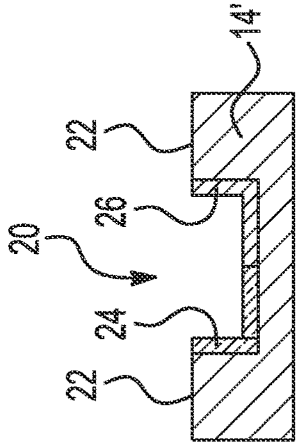

FIG. 6A through 6R illustrates three additional examples of the method for making the flow cell architecture of FIG. 1B, which includes the functionalized layers 24, 26. One example is shown at FIG. 6A through FIG. 6I. Another example is shown at FIG. 6A through FIG. 6E and FIG. 6J through FIG. 6M. Still another example is shown at FIG. 6A through FIG. 6E and FIG. 6N through FIG. 6R.

The examples shown in FIG. 6A through FIG. 6R generally include imprinting a resin layer 50 of a multi-layer stack 54 to form a patterned resin layer 50' including a concave region 56 having a deep portion 58 and a shallow portion 60 defined by a step portion 62 (FIG. 6A). The multi-layer stack 54 may include the resin layer 50 positioned over a sacrificial layer 48 positioned over a transparent base support 14'. The method may further include etching the patterned resin layer 50', thereby extending the deep portion 58 into the transparent base support 14' to create a depression portion 68, removing the step portion 62 to expose a portion of the sacrificial layer 48, and forming interstitial regions 22' of the patterned resin layer 50' that surround the depression portion 68 and the portion 66 of the sacrificial layer 48 (FIG. 6B). The method may also further include utilizing the multi-layer stack 54 to develop a negative photoresist 53 through the transparent base support 14' to define an insoluble negative photoresist 53B over the depression portion 68 (FIG. 6D and FIG. 6E); utilizing the insoluble negative photoresist 53B to create a second depression portion 68' adjacent to the depression portion 68 (FIG. 6F or FIG. 6J or FIG. 6N), to define a first functionalized layer 24 over one of the depression portion 68 or the second depression portion 68' (FIG. 6C), and to define a region of the transparent base support 14' where a second functionalized layer 26 is to be defined, wherein the region corresponds with the other of second depression portion 68' or the depression portion 68; and applying the second functionalized layer 26 over the region (FIG. 6G or FIG. 6L or FIG. 6O). In these example methods, the depression portions 68, 68' together define the depression 20.

Prior to utilizing the multi-layer stack 54 to develop the negative photoresist 53, the method may further comprise applying the first functionalized layer 24 over the depression portion 68, the portion 66 of the sacrificial layer 48, and the interstitial regions 22'; and after utilizing the multi-layer stack 54 to develop the negative photoresist 53, the negative insoluble photoresist 53B may cover a portion of the first functionalized layer 24 over the depression portion 68 (FIG. 6C).

In one example, utilizing the insoluble negative photoresist 53B may involve dry etching i) exposed portions of the first functionalized layer 24, ii) portions of the patterned resin layer 50' underlying the interstitial regions 22', iii) the sacrificial layer 48 to expose the transparent base support 14', and iv) a portion of the transparent base support 14' adjacent to the depression portion 68 to form the second depression portion 68'; wherein the second depression portion 68' is the region where the second functionalized layer 26 is to be defined; and the portion of the first functionalized layer 24 covered by the insoluble negative photoresist 53B remains intact over the depression portion 68 (FIG. 6D and FIG. 6E). After dry etching, new interstitial regions 22 may be formed at portions of the transparent base support 14' that surround the depression portion 68 and the second depression portion 68' (FIG. 6F); and applying the second functionalized layer 26 over the region may involve: depositing the second functionalized layer 26 over the insoluble negative photoresist 53B, over the second depression portion 68', and over the new interstitial regions 22 (FIG. 6G); removing the insoluble negative photoresist 53B, thereby exposing a portion of the first functionalized layer 24 over the depression portion 68 (FIG. 6H); and polishing the second functionalized layer 26 from the new interstitial regions 22 (FIG. 6I).

In another example, utilizing the insoluble negative photoresist 53B may involve dry etching i) exposed portions of the first functionalized layer 24, ii) the sacrificial layer 48 to expose the transparent base support 14', and iii) a portion of the transparent base support 14' adjacent to the depression portion 68 to form the second depression portion 68' (FIG. 6J); wherein the second depression portion 68' is the region where the second functionalized layer 26 is to be defined; and the portion of the first functionalized layer 24 covered by the insoluble negative photoresist 53B may remain intact over the depression portion 68. After dry etching is performed and before the second functionalized layer 26 is applied, the method may further include removing the insoluble negative photoresist 53B, thereby exposing the portion of the first functionalized layer 24 over the depression portion 68 (FIG. 6K). After dry etching, new interstitial regions 22 may be formed at portions of the transparent base support 14' that surround the depression portion 68 and the second depression portion 68' (FIG. 6J); and applying the second functionalized layer 26 over the region may involve: depositing the second functionalized layer 26 over the second depression portion 68' and over the new interstitial regions 22 (FIG. 6L); and polishing the second functionalized layer 26 from the new interstitial regions 22 (FIG. 6M).

Figure 6Q:
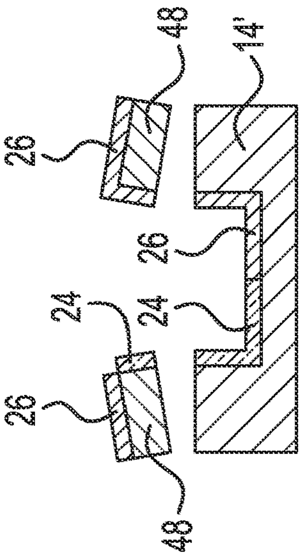

In still another example, utilizing the insoluble negative photoresist 53B may involve dry etching i) exposed portions of the first functionalized layer 24, ii) the portion 66 of the sacrificial layer 48, and iii) a portion of the transparent base support 14' adjacent to the depression portion 68 and underlying the portion of the sacrificial layer to form the second depression portion 68' (FIG. 6N); wherein the second depression portion 68' is the region where the second functionalized layer 26 is to be defined; and the portion of the first functionalized layer 24 covered by the insoluble negative photoresist 53B remains intact over the depression portion 68. The method may then proceed to applying the second functionalized layer 26 over the region which may generally involve: depositing the second functionalized layer 26 over the insoluble negative photoresist 53B, over the second depression portion 68', and over the interstitial regions 22' (FIG. 6O); removing the insoluble negative photoresist 53B, thereby exposing the portion of the first functionalized layer 24 over the depression portion 68 (FIG. 6P); and lifting off remaining portions of the sacrificial layer 48, including portions of the second functionalized layer 26 thereon (FIG. 6Q).

Each of the methods and the various steps will now be described in more detail in reference to the respective figures.

Each of these methods begins with the multi-layer stack 54 of materials, which, in these examples, includes the resin layer 50 positioned over the sacrificial layer 48 positioned over the transparent base support 14'.

To generate this multi-layer stack 54, the sacrificial layer 48 is deposited over the transparent base support 14', and the resin layer 50 is then deposited over the sacrificial layer 48, as shown in FIG. 6A.

In these examples, the transparent base support 14' is a UV transparent material that can be etched in the same manner as the resin layer 50. In one example, the transparent base support 14' and the resin layer 50 are the same type of resin, and may be any example resin disclosed herein. In other examples, the transparent base support 14' may be fused silica, tantalum pentoxide or another transparent layer, with the caveat that it can be etched using the same process as the resin selected for the resin layer 50. As described herein, the transparent base support 14' is transparent to ultraviolet wavelengths used in backside exposure.

Any example of the sacrificial layer 48 described herein may be used in this example method, as long as it is opaque or non-transparent to the light energy being used for backside exposure. In an example, the sacrificial layer 48 may comprise any ultraviolet opaque or non-transparent metal or ultraviolet opaque metal, such as aluminum, copper, chromium, gold, etc.

The resin layer 50 may be any of the example resins set forth herein, and may be deposited using any suitable technique disclosed herein. For some deposition techniques, the resin may be mixed in a liquid carrier, such as propylene glycol monomethyl ether acetate (PGMEA), toluene, dimethyl sulfoxide (DMSO), tetrahydrofuran (THF), etc.

As shown in FIG. 6A, the resin layer 50 is imprinted to form a concave region 56 including a deep portion 58 and a shallow portion 60 defined by a step portion 62. In the concave region 56, it is to be understood that the depth of the deep portion 58 and the depth of the shallow portion 60 are each within the depression depth ranges provided herein, with the caveat that the depth of the deep portion 58 is greater than the depth of the shallow portion 60.

Any suitable imprinting technique may be used. In one example, a working stamp is pressed into the resin layer 50 while it is soft, which creates an imprint of the working stamp features in the resin layer 50. The resin layer 50 may then be cured with the working stamp in place. Curing may be accomplished as described herein in reference to FIG. 3B.

After curing, the working stamp is released. This creates topographic features in the resin layer 50, and thus creates the patterned resin layer 50'. In this example method, the working stamp does not extend through the entire depth of the resin layer 50, and thus the underlying sacrificial layer 48 is not exposed after imprinting (as shown in FIG. 6A).

The multi-layer stack 54 is then selectively etched to create a first depression portion 68 in the transparent base support 14' at the deep portion 58, and to expose a portion 66 of the sacrificial layer 48 at the shallow portion 60. This involves a series of etching processes, as one process is used for the patterned resin layer 50' and transparent base support 14', and another process is used for the sacrificial layer 48.

The initial etching of the patterned resin layer 50' (as it is depicted in FIG. 6A) may involve a dry etching process performed with a mixture of 90% $CF_4$ and 10% $O_2$ plasma. As the portion of the patterned resin layer 50' is thinner at the deep portion 58, the portion 67 of the sacrificial layer 48 at the deep portion 58 will be exposed before the rest of the patterned resin layer 50' is removed. Portion 67 of the sacrificial layer 48 acts as an etch stop, and some of the patterned resin layer 50' remains over the rest of the sacrificial layer 48 (including over portion 66) after this etching process ceases.

The portion 67 of the sacrificial layer 48 may then be etched, e.g., using a chlorine-based plasma (e.g., $BCl_3+Cl_2$). The patterned resin layer 50' remains intact during this etching process, and the surface of the transparent base support 14' (underlying the deep portion 58) acts as an etch stop.

With the surface of the transparent base support 14' exposed at the deep portion 58, both the remaining patterned resin layer 50' and the exposed portion of the transparent base support 14' may be etched simultaneously, as indicated by the downward arrows in FIG. 6B. The simultaneous etching of the remaining patterned resin layer 50' and the transparent base support 14' may involve a dry etching process performed with a mixture of 90% $CF_4$ and 10% $O_2$ plasma. As the portion of the patterned resin layer 50' that underlies the shallow portion 60 is the thinnest of the remaining patterned resin layer 50', the portion 66 of the sacrificial layer 48 underlying the shallow portion 60 will be exposed before the rest of the patterned resin layer 50' is removed. The thickness of the transparent base support 14' that is removed during this process is equivalent to the thickness of the patterned resin layer 50' that is removed from beneath the shallow portion 60. This series of etching techniques forms the depression portion 68.

In FIG. 6C, the first functionalized layer 24 is then applied over the first depression portion 68 of the transparent base support 14' using any suitable deposition technique. In this example, the first functionalized layer 24 is also deposited over the remaining patterned resin layer 50' and over the portion 66 of the sacrificial layer 48 at the shallow portion 60. Any example of the first functionalized layer 24 disclosed herein may be used.

As depicted at FIG. 6D, a negative photoresist 53 may then be applied over the multi-layer stack 54. Any example of the negative photoresist 53 set forth herein may be used. When the negative photoresist 53 is used, it is selectively exposed to certain wavelengths of light to form an insoluble negative photoresist 53B, and is exposed to a developer to remove soluble portions 53A (e.g., those portions that are not exposed to the certain wavelengths of light). In this example, it is desirable for the insoluble negative photoresist 53B to remain on the first functionalized layer 24 over the depression portion 68 of the transparent base support 14' at the deep portion 58, and to be removed from the first functionalized layer 24 on the patterned resin layer 50' and the portion 66 of the sacrificial layer 48 at the shallow portion 60. As such, in the example shown in FIG. 6D, the light may be directed through the backside of the transparent base support 14' as indicated by the arrows. The negative photoresist 53 over the first functionalized layer 24 over the depression portion 68 will be exposed to the light and will become insoluble. The sacrificial layer 48 blocks at least 75% of light that is transmitted through the transparent base support 14', thus at least substantially preventing the light from reaching the negative photoresist 53 that is positioned over the sacrificial layer 48. As such, these portions (53A) remain soluble and are removed with the developer. In this example, the negative photoresist 53 is developed through the transparent base support 14' to define the insoluble negative photoresist 53B in the deep portion 58 and to remove the soluble negative photoresist 53A from the shallow portion 60 and the interstitial regions 22'.

Examples of suitable developers for the negative photoresist 53 include aqueous-alkaline solutions, such as diluted sodium hydroxide, diluted potassium hydroxide, or an aqueous solution of the metal ion free organic TMAH (tetramethylammoniumhydroxide).

The method proceeds with FIG. 6F. In this example, the multi-layer stack 54 is then selectively etched to form a second depression portion 68' in the transparent base support 14'. This involves a series of etching processes, as one process is used for the exposed portions of the functionalized layer 24, another process is used for the patterned resin layer 50' and transparent base support 14', and still another process is used for the sacrificial layer 48. FIG. 6F depicts the structure after such etching processes are performed.

The initial etching of the exposed portions of the functionalized layer 24 may be performed with a 100% $O_2$ plasma. This will expose both the interstitial regions 22' of the remaining patterned resin layer 50' and the portion 66 of the sacrificial layer 48 (at the shallow portion 60).

The portion 66 of the sacrificial layer 48 may then be etched, e.g., using a chlorine-based plasma (e.g., $BCl_3+Cl_2$). The patterned resin layer 50' remains intact during this etching process, and the surface of the transparent base support 14' (underlying the shallow portion 60) acts as an etch stop.

With the surface of the transparent base support 14' exposed at the shallow portion 60, both the remaining patterned resin layer 50' and the exposed portion of the transparent base support 14' may be etched simultaneously. The simultaneous etching of the remaining patterned resin layer 50' and the transparent base support 14' may involve a dry etching process performed with a mixture of 90% $CF_4$ and 10% $O_2$ plasma. The portions 69 (see FIG. 6E) of the sacrificial layer 48 underlying the remaining patterned resin layer 50' will act as an etch stop. Thus, the thickness of the transparent base support 14' that is removed during this process is equivalent to the thickness of the patterned resin layer 50' that is removed from the portions 69 of the sacrificial layer 48.

The portion 69 of the sacrificial layer 48 may then be etched, e.g., using a chlorine-based plasma (e.g., $BCl_3+Cl_2$) or a wet etch with potassium hydroxide (KOH), tetramethylammoniumhydroxide (TMHA), nitric acid, acetic acid, or phosphoric acid. The transparent base support 14' acts as an etch stop and remains intact during this etching process. This series of etching techniques forms the second depression portion 68', as shown in FIG. 6F.

In this example, the series of etching steps form new interstitial regions 22 at portions of the transparent base support 14' that surround depression portion 68 and the second depression portion 68'.

In FIG. 6G, the second functionalized layer 26 is then applied over the second depression portion 68' of the transparent base support 14' using any suitable deposition technique. In this example, the second functionalized layer 26 is also deposited over the insoluble negative photoresist 53B and the new interstitial regions 22. The second functionalized layer 26 may be any of the examples disclosed herein and may be applied using any suitable deposition technique.

At the outset of the method shown in FIG. 6A to FIG. 6I, the transparent base support 14' may be activated using silanization or plasma ashing to generate surface groups that can react with the functionalized layers 24, 26. As such, the functionalized layers 24, 26 covalently attach to the transparent base support 14' in, respectively, the depression portion 68 and the second depression portion 68', and to the sidewalls 20' of the depression 20 formed by the two depression portions 68, 68'.

Removal of the insoluble negative photoresist 53B may then be performed to re-expose the portion of the first functionalized layer 24 over the depression portion 68 of the transparent base support 14'. While the insoluble negative photoresist 53B is not soluble in the developer, it may be soluble (at least 99% soluble) in a remover. Suitable removers include dimethylsulfoxide (DMSO) with sonication, or acetone, or an NMP (N-methyl-2-pyrrolidone) based stripper. As shown in FIG. 6H, this process removes the insoluble negative photoresist 53B and the second functionalized layer 26 that overlies the insoluble negative photoresist 53B.

In FIG. 6I, the functionalized layer 26 that is positioned over the interstitial regions 22 is removed, e.g., using a polishing process. The polishing process may be performed as described herein in reference to FIG. 3J.

While a single set of the functionalized layers 24, 26 is shown in FIG. 6I, it is to be understood that the method described in reference to FIG. 6A through FIG. 6I may be performed to generate an array of depressions 20 (having functionalized layers 24, 26 therein) separated by interstitial regions 22 across the surface of the transparent base support 14'.

While not shown, this method also includes attaching respective primer sets 30, 32 to the functionalized layers 24, 26. In some examples, the primers 34, 36 or 34', 36' (not shown in FIG. 6A through FIG. 6I) may be pre-grafted to the functionalized layer 24. Similarly, the primers 38, 40 or 38', 40' (not shown in FIG. 6A through FIG. 6I) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 6C). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted after the second functionalized layer 26 is applied (e.g., at FIG. 6G). The primers 38, 40 or 38', 40' may also be grafted after the second functionalized layer 26 is applied and the insoluble negative photoresist 53B is removed as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

Referring back to FIG. 6E, where the insoluble negative photoresist 53B has been developed, another example of the method proceeds from FIG. 6J to FIG. 6M.

In FIG. 6J, the multi-layer stack 54 is then selectively etched to form a second depression portion 68' in the transparent base support 14'. Etching of the various layers 24, 50', 14', 48 may be performed as described in reference to FIG. 6E and FIG. 6F.

Removal of the insoluble negative photoresist 53B may then be performed to re-expose the portion of the first functionalized layer 24 over the depression portion 68 of the transparent base support 14' at the deep portion 58. While the insoluble negative photoresist 53B is not soluble in the developer, it may be soluble (at least 99% soluble) in a remover. Suitable removers include dimethylsulfoxide (DMSO) with sonication, or acetone, or an NMP (N-methyl-2-pyrrolidone) based stripper. As shown in FIG. 6K, this process removes the insoluble negative photoresist 53B that overlies the first functionalized layer 24 over the depression portion 68.

In FIG. 6L, the second functionalized layer 26 is then applied over the second depression portion 68' of the transparent base support 14' using any suitable deposition technique. In this example, the second functionalized layer 26 is also deposited over the new interstitial regions 22. In this example, deposition of the second functionalized layer 26 is performed under high ionic strength (e.g., in the presence of 10×PBS, NaCl, KCl, etc.) so that the second functionalized layer 26 does not deposit on or adhere to the first functionalized layer 24. As such, the second functionalized layer 26 does not contaminate the first functionalized layer 24.

At the outset of the method shown in FIG. 6A through FIG. 6E and FIG. 6J through FIG. 6M, the transparent base support 14' may be activated using silanization or plasma ashing to generate surface groups that can react with the functionalized layers 24, 26. As such, the functionalized layers 24, 26 respectively and covalently attach to the depression portion 68 and the second depression portion 68', and to the sidewalls 20' of the depression 20 defined in the transparent base support 14'. The functionalized layer 26 also covalently attaches to the interstitial regions 22.

In FIG. 6M, the functionalized layer 26 that is positioned over the interstitial regions 22 is removed, e.g., using a polishing process. The polishing process may be performed as described herein in reference to FIG. 3J.

While a single set of the functionalized layers 24, 26 is shown in FIG. 6M, it is to be understood that the method described in reference to FIG. 6A through FIG. 6E and FIG. 6J through FIG. 6M may be performed to generate an array of depressions 20 (having functionalized layers 24, 26 therein) separated by interstitial regions 22 across the surface of the transparent base support 14'.

While not shown, this method also includes attaching respective primer sets 30, 32 to the functionalized layers 24, 26. In some examples, the primers 34, 36 or 34', 36' (not shown in FIG. 6A through FIG. 6E and FIG. 6J through FIG. 6M) may be pre-grafted to the functionalized layer 24. Similarly, the primers 38, 40 or 38', 40' (not shown in FIG. 6A through FIG. 6E and FIG. 6J through FIG. 6M) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 6C). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted after the second functionalized layer 26 is applied (e.g., at FIG. 6L or at FIG. 6M), as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

Referring back to FIG. 6E, where the insoluble negative photoresist 53B has been developed, still another example of the method proceeds from FIG. 6N to FIG. 6R.

In FIG. 6N, the multi-layer stack 54 is then selectively etched to form a second depression portion 68' of the transparent base support 14'. This involves a series of etching processes, as one process is used for the exposed portions of the functionalized layer 24, another process is used for the patterned resin layer 50' and transparent base support 14', and still another process is used for the sacrificial layer 48. FIG. 6N depicts the structure after such etching processes are performed.

The initial etching of the exposed portions of the functionalized layer 24 may be performed with a 100% $O_2$ plasma. This will expose both the interstitial regions 22' of the remaining patterned resin layer 50' and the portion 66 of the sacrificial layer 48 (at the shallow portion 60).

The portion 66 of the sacrificial layer 48 may then be etched, e.g., using a chlorine-based plasma (e.g., $BCl_3$+$Cl_2$). The patterned resin layer 50' remains intact during this etching process, and the surface of the transparent base support 14' (underlying the shallow portion 60) acts as an etch stop.

With the surface of the transparent base support 14' exposed at the shallow portion 60, both the remaining patterned resin layer 50' and the exposed portion of the transparent base support 14' may be etched simultaneously. The simultaneous etching of the remaining patterned resin layer 50' and the transparent base support 14' may involve a dry etching process performed with a mixture of 90% $CF_4$ and 10% $O_2$ plasma. The portions 69 of the sacrificial layer 48 underlying the remaining patterned resin layer 50' will act as an etch stop. Thus, the thickness of the transparent base support 14' that is removed during this process is equivalent to the thickness of the patterned resin layer 50' that is removed from the portions 69 of the sacrificial layer 48. This series of etching steps form the second depression portion 68'. The resulting structure is shown in FIG. 6N.

In FIG. 6O, the second functionalized layer 26 is then applied over the second depression portion 68' using any suitable deposition technique. In this example, the second functionalized layer 26 is also deposited over the sacrificial layer 48 and over the insoluble negative photoresist 53B. In this example, the insoluble negative photoresist 53B covers the first functionalized layer 24, and thus the second functionalized layer 26 does not deposit on or adhere to the first functionalized layer 24. As such, the second functionalized layer 26 does not contaminate the first functionalized layer 24.

At the outset of the method shown in FIG. 6A through FIG. 6E and FIG. 6N through FIG. 6R, the transparent base support 14' may be activated using silanization or plasma ashing to generate surface groups that can react with the functionalized layers 24, 26. As such, the functionalized layers 24, 26 respectively and covalently attach to the depression portion 68 and the second depression portion 68', and to the sidewalls 20' of the depression 20 formed by the portions 68, 68'.

Removal of the insoluble negative photoresist 53B may then be performed to re-expose the portion of the first functionalized layer 24 over the depression portion 68 of the transparent base support 14' at the deep portion 58. Any suitable remover for the insoluble negative photoresist 53B may be used. As shown in FIG. 6P, this process removes the insoluble negative photoresist 53B and the second functionalized layer 26 that overlies the insoluble negative photoresist 53B. The functionalized layer 24 that is not covalently attached to the transparent base support 14' may be removed with the insoluble negative photoresist 53B as well.

Lift-off of the remaining sacrificial layer 48 may then be performed. As shown in FIG. 6Q, the lift-off process removes i) at least 99% of the sacrificial layer 48 and ii) the functionalized layers 24, 26 that overlie the sacrificial layer 48. The lift-off process may involve an organic solvent that is capable of dissolving or otherwise lifting off the sacrificial layer 48. As examples, an aluminum sacrificial layer 48 can be removed in acidic (e.g., nitric acid based) or basic (e.g., KOH based) conditions, a copper sacrificial layer 48 can be removed using $FeCl_3$, and a copper, gold or silver sacrificial layer 48 can be removed in an iodine and iodide solution.

This leaves the functionalized layer 24, 26 adjacent to one another on the surface of the transparent base support 14' in the depression 20. The functionalized layer 24, 26 remain intact over the first and second depression portions 68, 68' of the transparent base support 14', in part because the functionalized layers 24, 26 are covalently attached to the transparent base support 14'.

While a single set of the functionalized layers 24, 26 is shown in FIG. 6R, it is to be understood that the method described in reference to FIG. 6A through FIG. 6E and FIG. 6N through FIG. 6R may be performed to generate an array of functionalized layers 24, 26, separated by interstitial regions 22 across the surface of the transparent base support 14'.

While not shown, the methods described in at FIG. 6A through FIG. 6E and FIG. 6N through FIG. 6R also includes attaching respective primer sets 30, 32 to the functionalized layers, 24, 26. In some examples, the primers 34, 36 or 34', 36' (not shown in FIG. 6A through FIG. 6E and FIG. 6N through FIG. 6R) may be pre-grafted to the functionalized layer 24. Similarly, the primers 38, 40 or 38' or 40' (not shown in FIG. 6A through FIG. 6E and FIG. 6N through FIG. 6R) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 6C). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted after the second functionalized layer 26 is applied (e.g., at FIG. 6O or any point thereafter). Alternatively, the primers 38, 40 or 38', 40' may be grafted after the second functionalized layer 26 is applied and after the insoluble negative photoresist 53B is removed as long as i) the functionalized layer 26 has different functional groups (than functionalized layer 24) for attaching the primers 38, 40 or 38', 40' or ii) unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

Figure 7A:
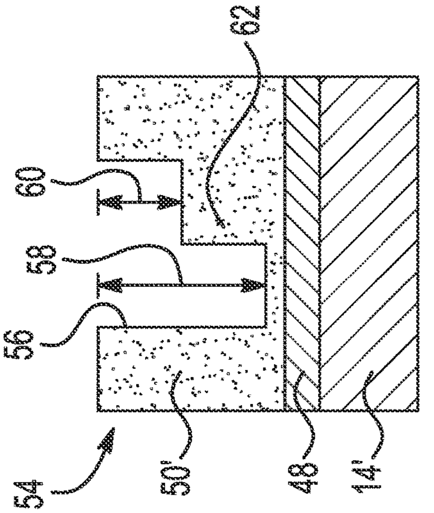
FIG. 7A through FIG. 7I are schematic views that illustrate an example of a method to generate the flow cell architecture shown in FIG. 1B, where
Figure 7B:
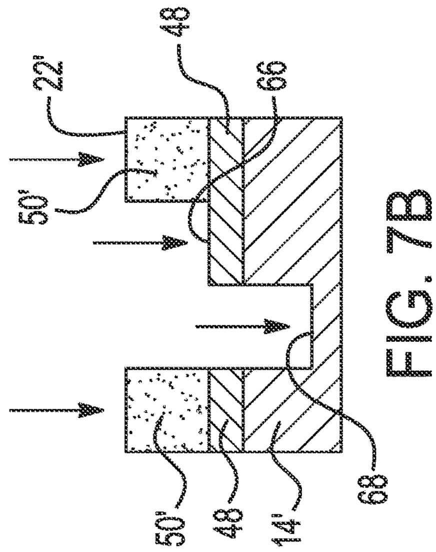
Figure 7C:
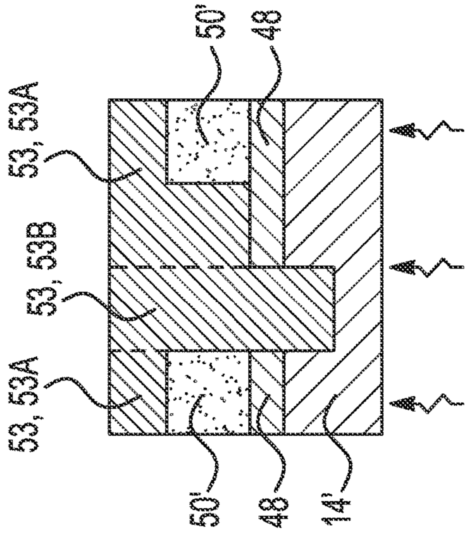
Figure 7D:
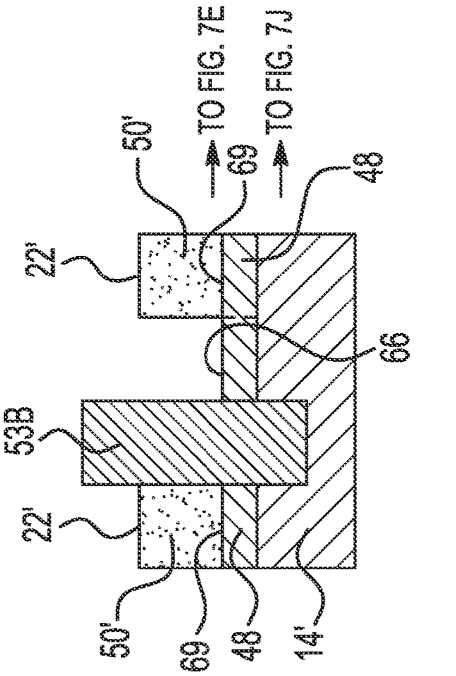
Figure 7E:
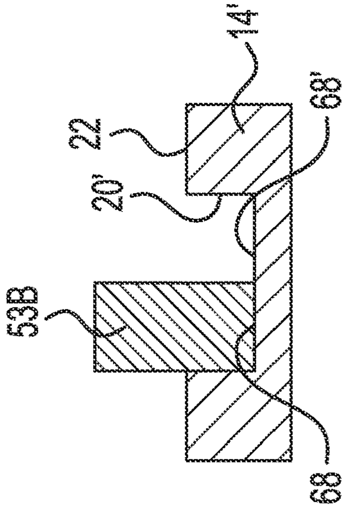
Figure 7F:
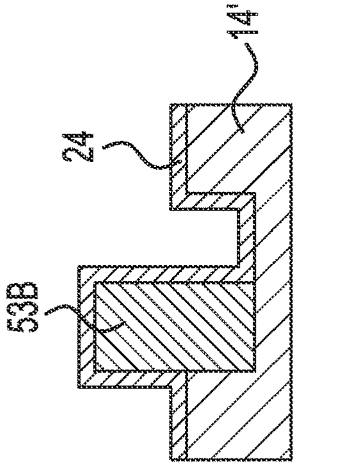
Figure 7G:
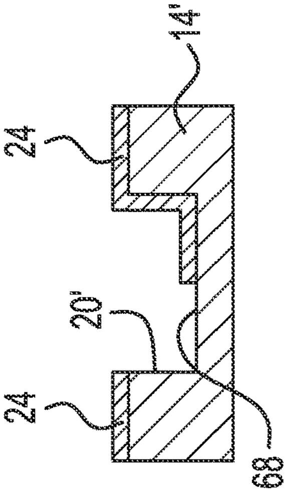
Figure 7H:
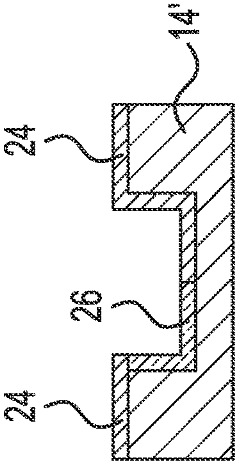
Figure 7I:
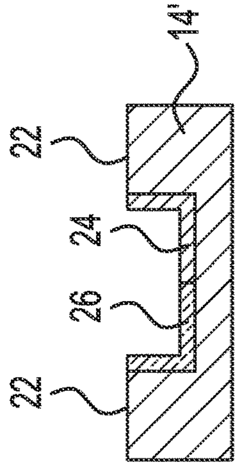
Figure 7J:
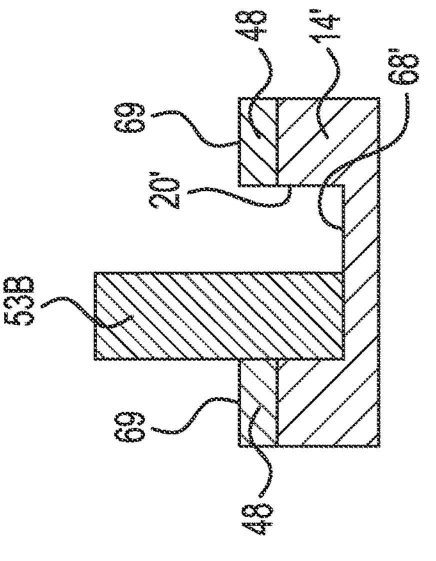
Figure 7K:
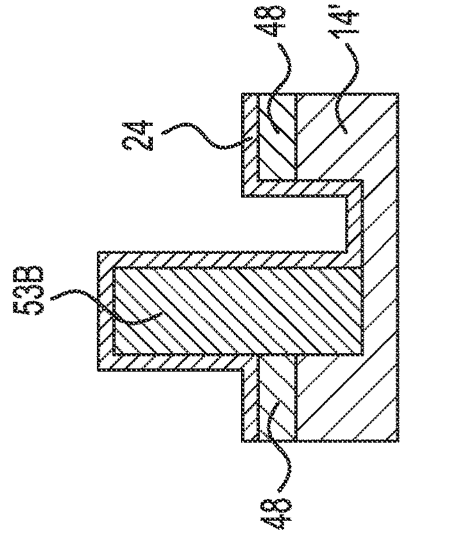
Figure 7L:
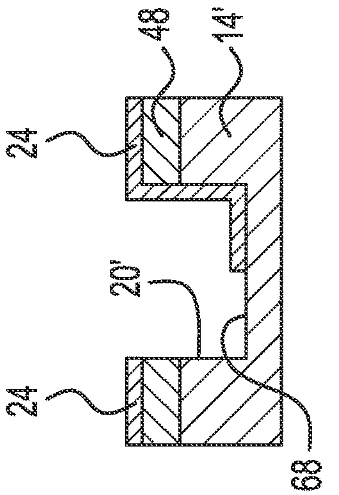
Figure 7M:
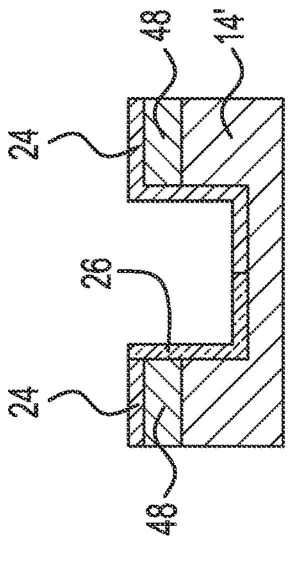
Figure 7N:
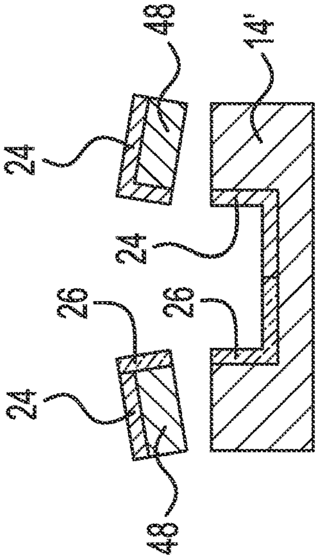
Figure 7O:
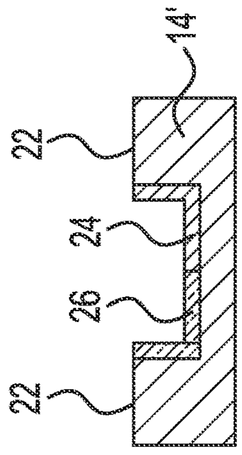

FIG. 7A through FIG. 7O illustrate another two different examples of the method for making the flow cell architecture of FIG. 1B, which includes the functionalized layers 24, 26. One example is shown at FIG. 7A through FIG. 7I. Another example is shown at FIG. 7A through FIG. 7D and FIG. 7J through FIG. 7O.

The examples shown in FIG. 7A through FIG. 7O generally include imprinting a resin layer 50 of a multi-layer stack 54 to form a patterned resin layer 50' including a concave region 56 having a deep portion 58 and a shallow portion 60 defined by a step portion 62 (FIG. 7A). The multi-layer stack 54 may include the resin layer 50 positioned over a sacrificial layer 48 positioned over a transparent base support 14'. The method may further include etching the patterned resin layer 50', thereby extending the deep portion 58 into the transparent base support 14' to create a depression portion 68, removing the step portion 62 to expose a portion of the sacrificial layer 48, and forming interstitial regions 22' of the patterned resin layer 50' that surround the depression portion 68 and the portion of the sacrificial layer 48 (FIG. 7B). The method may further include utilizing the multi-layer stack 54 to develop a negative photoresist 53 through the transparent base support 14' to define an insoluble negative photoresist 53B over the depression portion 68 (FIG. 7C and FIG. 7D); utilizing the insoluble negative photoresist 53B to create a second depression portion 68' adjacent to the depression portion 68 (FIG. 7E or FIG. 7J), to define a first functionalized layer 24 over one of the depression portion 68 or the second depression portion 68' (FIG. 7F or FIG. 7K), and to define a region of the transparent base support 14' where a second functionalized layer 26 is to be defined, wherein the region corresponds with the other of second depression portion 68' or the depression portion 68; and applying the second functionalized layer 26 over the region (FIG. 7H or FIG. 7M). In these example methods, the depression portions 68, 68' together define the depression 20.

In one example, utilizing the insoluble negative photoresist 53B may involve: dry etching i) portions of the patterned resin layer 50' underlying the interstitial regions 22', ii) the sacrificial layer 48 to expose the transparent base support 14', and iii) a portion of the transparent base support 14' adjacent to the depression portion 68 to form the second depression portion 68' (FIG. 7E); applying the first functionalized layer 24 over the insoluble negative photoresist 53B, the second depression portion 68', and the interstitial regions 22 (FIG. 7F); and removing the negative insoluble photoresist 53B and the first functionalized layer 24 thereon to expose the depression portion 68 (FIG. 7G); wherein the depression portion 68 is the region where the second functionalized layer 26 is to be defined (FIG. 7H). The method may further include removing the first functionalized layer 24 from the interstitial regions 22 after the second functionalized layer 26 is applied (FIG. 7I).

In another example, utilizing the insoluble negative photoresist 53B may involve: dry etching i) the portion 66 of the sacrificial layer 48, and ii) a portion of the transparent base support 14' adjacent to the depression portion 68 and underlying the portion of the sacrificial layer to form the second depression portion 68' (FIG. 7J); applying the first functionalized layer 24 over the insoluble negative photoresist 53B, the second depression portion 68', and the interstitial regions 22' (FIG. 7K); and removing the negative insoluble photoresist 53B and the first functionalized layer 24 thereon to expose the depression portion 68 (FIG. 7L); wherein the depression portion 68 is the region where the second functionalized layer 26 is to be defined (FIG. 7M). After the second functionalized layer 26 is applied, the method may further comprise lifting off remaining portions of the sacrificial layer 48, including portions of the patterned resin layer 50' and the first functionalized layer 24 thereon (FIG. 7N).

Each of the methods and the various steps will now be described in more detail in reference to the respective figures.

The FIG. 7 series also begins with a multi-layer stack 54 of materials, which includes a resin layer 50 positioned over a sacrificial layer 48 positioned over the base support 14. To generate this multi-layer stack 54, the sacrificial layer 48 is deposited over the transparent base support 14', and the resin layer 50 is then deposited over the sacrificial layer 48, as shown in FIG. 7A.

In these examples, the transparent base support 14' is a UV transparent material that can be etched in the same manner as the resin layer 50. In one example, the transparent base support 14' and the resin layer 50 are the same type of resin, and may be any example resin disclosed herein. In other examples, the transparent base support 14' may be fused silica, tantalum pentoxide or another transparent layer, with the caveat that it can be etched using the same process as the resin selected for the resin layer 50. As described herein, the transparent base support 14' is transparent to ultraviolet wavelengths used in backside exposure.

Any example of the sacrificial layer 48 described herein may be used in this example method, as long as it is opaque or non-transparent to the light energy being used for backside exposure. In an example, the sacrificial layer 48 may comprise any ultraviolet opaque or non-transparent metal or ultraviolet opaque metal, such as aluminum, copper, gold, etc.

The resin layer 50 may be any of the example resins set forth herein, and may be deposited using any suitable technique disclosed herein. For some deposition techniques, the resin may be mixed in a liquid carrier, such as propylene glycol monomethyl ether acetate (PGMEA), toluene, dimethyl sulfoxide (DMSO), tetrahydrofuran (THF), etc.

As shown in FIG. 7A, the resin layer 50 is imprinted to form a concave region 56 including a deep portion 58 and a shallow portion 60 defined by a step portion 62. Any suitable imprinting technique may be used. In one example, a working stamp is pressed into the resin layer 50 while it is soft, which creates an imprint of the working stamp features in the resin layer 50. The resin layer 50 may then be cured with the working stamp in place. Curing may be accomplished as described herein in reference to FIG. 3B.

After curing, the working stamp is released. This creates topographic features in the resin layer 50, and thus creates patterned resin layer 50'. In this example method, the working stamp does not extend through the entire depth of the resin layer 50, and thus the underlying sacrificial layer 48 is not exposed after imprinting (as shown in FIG. 7A).

The multi-layer stack 54 is then selectively etched to create a depression portion 68 in the transparent base support 14' at the deep portion 58, and expose a portion 66 of the sacrificial layer 48 at the shallow portion 60. This series of etching processes may be performed as described in reference to FIG. 6B. The resulting structure is shown in FIG. 7B.

As depicted at FIG. 7C, a negative photoresist 53 may then be applied over the multi-layer stack 54. Any example of the negative photoresist 53 set forth herein may be used. When the negative photoresist 53 is used, it is selectively exposed to certain wavelengths of light to form an insoluble negative photoresist 53B, and is exposed to a developer to remove soluble portions 53A (e.g., those portions 53A that are not exposed to the certain wavelengths of light). In this example, it is desirable for the insoluble negative photoresist 53B to remain on the depression portion 68 in the transparent base support 14' at the deep portion 58, and to be removed from the patterned resin layer 50' and from the portion 66 of the sacrificial layer 48. As such, in the example shown in FIG. 7C, the light may be directed through the transparent base support 14' as indicated by the arrows. The negative photoresist 53 on the portion 68 will be exposed to the light and will become insoluble. The sacrificial layer 48 blocks at least 75% of light that is transmitted through the transparent base support 14', thus at least substantially preventing the light from reaching the negative photoresist 53 that is positioned over the sacrificial layer 48. As such, these portions remain soluble and are removed with the developer. In this example, the negative photoresist 53 is developed through the transparent base support 14' to define the insoluble negative photoresist 53B in the deep portion 58 and to remove the soluble negative photoresist 53A from the shallow portion 60 and the interstitial regions 22'. The insoluble negative photoresist 53B that is formed is shown in FIG. 7D.

Examples of suitable developers for the negative photoresist 53 include aqueous-alkaline solutions, such as diluted sodium hydroxide, diluted potassium hydroxide, or an aqueous solution of the metal ion free organic TMAH (tetramethylammoniumhydroxide).

The method proceeds with FIG. 7E. In this example, the multi-layer stack 54 is then selectively etched to form a second depression portion 68' in the transparent base support 14'. This involves a series of etching processes, as one process is used for the patterned resin layer 50' and transparent base support 14', and another process is used for the sacrificial layer 48.

The initial etching of the portion 66 of the sacrificial layer 48 may be performed, e.g., using a chlorine-based plasma (e.g., $BCl_3+Cl_2$). The patterned resin layer 50' remains intact during this etching process, and the surface of the transparent base support 14' (underlying the shallow portion 60) acts as an etch stop.

With the surface of the transparent base support 14' exposed at the shallow portion 60, both the remaining patterned resin layer 50' and the exposed portion of the transparent base support 14' may be etched simultaneously. The simultaneous etching of the remaining patterned resin layer 50' and the transparent base support 14' may involve a dry etching process performed with a mixture of 90% $CF_4$ and 10% $O_2$ plasma. The portions 69 (FIG. 7D) of the sacrificial layer 48 underlying the remaining patterned resin layer 50' will act as an etch stop. Thus, the thickness of the transparent base support 14' that is removed during this process is equivalent to the thickness of the patterned resin layer 50' that is removed from the portions 69 of the sacrificial layer 48.

The portions 69 of the sacrificial layer 48 may then be etched, e.g., using a chlorine-based plasma (e.g., $BCl_3+Cl_2$) or a wet etch with potassium hydroxide (KOH), tetramethylammoniumhydroxide (TMHA), nitric acid, acetic acid, or phosphoric acid. The transparent base support 14' acts as an etch stop and remains intact during this etching process. This series of etching techniques forms the second depression portion 68', as shown in FIG. 7E.

In this example, the removal of the patterned resin layer 50' and the remaining sacrificial layer 48 underlying the patterned resin layer 50' forms new interstitial regions 22 at portions of the transparent base support 14' that surround depression portion 68 and the second depression portion 68'.

In FIG. 7F, the first functionalized layer 24 is then applied over the second depression portion 68' in the transparent base support 14' using any suitable deposition technique. In this example, the first functionalized layer 24 is also deposited over the insoluble negative photoresist 53B and the interstitial regions 22. Any example of the first functionalized layer 24 disclosed herein may be used and any suitable deposition technique may be used.

At the outset of the method shown in FIG. 7A to FIG. 7I, the transparent base support 14' may be activated using silanization or plasma ashing to generate surface groups that can react with the functionalized layer 24. As such, the functionalized layer 24 covalently attaches to the second depression portion 68' of the transparent base support 14'.

Removal of the insoluble negative photoresist 53B may then be performed to re-expose the depression portion 68 in the transparent base support 14'. While the insoluble negative photoresist 52 is not soluble in the developer, it may be soluble (at least 99% soluble) in a remover. Suitable removers include dimethylsulfoxide (DMSO) with sonication, or acetone, or an NMP (N-methyl-2-pyrrolidone) based stripper. As shown in FIG. 7G, this process removes the insoluble negative photoresist 53B and the functionalized layer 24 that overlies the insoluble negative photoresist 53B.

As shown in FIG. 7H, the second functionalized layer 26 may then be applied over depression portion 68 in the transparent base support 14'. The second functionalized layer 26 may be applied using any suitable deposition technique. In this example, deposition of the second functionalized layer 26 is performed under high ionic strength (e.g., in the presence of 10×PBS, NaCl, KCl, etc.) so that the second functionalized layer 26 does not deposit on or adhere to the first functionalized layer 24. As such, the second functionalized layer 26 does not contaminate the first functionalized layer 24.

In FIG. 7I, the functionalized layer 24 that is positioned over the interstitial regions 22 is removed, e.g., using a polishing process. The polishing process may be performed as described herein in reference to FIG. 3J. The portions of the layers 24, 26 remain intact in the depression 20 once polishing is finished.

While a single set of the functionalized layers 24, 26 is shown in FIG. 7I, it is to be understood that the method described in reference to FIG. 7A through FIG. 7I may be performed to generate an array of depressions 20 (having functionalized layers 24, 26 therein) separated by interstitial regions 22 across the surface of the transparent base support 14'.

While not shown, this method also includes attaching respective primer sets 30, 32 to the functionalized layers 24, 26. In some examples, the primers 34, 36 or 34', 36' (not shown in FIG. 7A through FIG. 7I) may be pre-grafted to the functionalized layer 24. Similarly, the primers 38, 40 or 38', 40' (not shown in FIG. 7A through FIG. 7I) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 7F). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted after the second functionalized layer 26 is applied (e.g., at FIG. 7H or thereafter), as long as i) the functionalized layer 26 has different functional groups (than functionalized layer 24) for attaching the primers 38, 40 or 38', 40' or ii) any unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

Referring back to FIG. 7D, where the insoluble negative photoresist 53B has been developed and the exposed portion 66 of the sacrificial layer 48 has been removed, another example of the method proceeds from FIG. 7D to FIG. 7J.

This example method involves a series of etching processes, as one process is used for the patterned resin layer 50' and transparent base support 14', and another process is used for the sacrificial layer 48.

The portion 66 of the sacrificial layer 48 is etched first, e.g., using a chlorine-based plasma (e.g., $BCl_3$+$Cl_2$). The patterned resin layer 50' remains intact during this etching process, and the surface of the transparent base support 14' (underlying the shallow portion 60) acts as an etch stop.

With the surface of the transparent base support 14' exposed at the shallow portion 60, both the remaining patterned resin layer 50' and the exposed portion of the transparent base support 14' may be etched simultaneously. The simultaneous etching of the remaining patterned resin layer 50' and the transparent base support 14' may involve a dry etching process performed with a mixture of 90% $CF_4$ and 10% $O_2$ plasma. The portions 69 of the sacrificial layer 48 underlying the remaining patterned resin layer 50' will act as an etch stop. Thus, the thickness of the transparent base support 14' that is removed during this process is equivalent to the thickness of the patterned resin layer 50' that is removed from the portions 69 of the sacrificial layer 48. This series of etching steps form the second depression portion 68', as shown in FIG. 7J In FIG. 7K, the first functionalized layer 24 is then applied over the second depression portion 68' using any suitable deposition technique. In this example, the first functionalized layer 24 is also deposited over the remaining sacrificial layer 48 and over the insoluble negative photoresist 53B.

At the outset of the method shown in FIG. 7A through FIG. 7D and FIG. 7J through FIG. 7O, the transparent base support 14' may be activated using silanization or plasma ashing to generate surface groups that can react with the functionalized layer 24. As such, the functionalized layer 24 covalently attaches to the second depression portion 68' in the transparent base support 14'.

Removal of the insoluble negative photoresist 53B may then be performed to re-expose the first depression portion 68 in the transparent base support 14'. This also exposes some of the depression sidewall 20'. Any suitable remover for the insoluble negative photoresist 53B may be used, such as dimethylsulfoxide (DMSO), or acetone, or an NMP (N-methyl-2-pyrrolidone) based stripper. As shown in FIG. 7L, this process removes the insoluble negative photoresist 53B and the functionalized layer 24 that overlies the insoluble negative photoresist 53B.

As shown in FIG. 7M, the second functionalized layer 26 may then be applied over the depression portion 68 in the transparent base support 14'. Any example of the second functionalized layer 26 may be used, and the second functionalized layer 26 may be applied using any suitable deposition technique. Because the first functionalized layer 24 is exposed, deposition of the second functionalized layer 26 is performed under high ionic strength (e.g., in the presence of 10×PBS, NaCl, KCl, etc.) so that the second functionalized layer 26 does not deposit on or adhere to the first functionalized layer 24. As such, the second functionalized layer 26 does not contaminate the first functionalized layer 24.

Lift-off of the remaining sacrificial layer 48 may then be performed. As shown in FIG. 7N, the lift-off process removes i) at least 99% of the sacrificial layer 48 and ii) and the functionalized layers 24, 26 that overlie the sacrificial layer 48. The lift-off process may involve an organic solvent that is capable of dissolving or otherwise lifting off the sacrificial layer 48. As examples, an aluminum sacrificial layer 48 can be removed in acidic (e.g., nitric acid based) or basic (e.g., KOH based) conditions, a copper sacrificial layer 48 can be removed using $FeCl_3$, and a copper, gold or silver sacrificial layer 48 can be removed in an iodine and iodide solution. The lift-off process exposes the interstitial regions 22 and does not deleteriously affect the first and second functionalized layers 24, 26 in the depression 20.

While a single set of the functionalized layers 24, 26 is shown in FIG. 7O, it is to be understood that the method described in reference to FIG. 7A through FIG. 7D and FIG. 7J through FIG. 7O may be performed to generate an array of functionalized layers 24, 26, separated by interstitial regions 22 across the surface of the transparent base support 14'.

While not shown, the methods described in at FIG. 7A through FIG. 7D and FIG. 7J through FIG. 7O also includes attaching respective primer sets 30, 32 to the functionalized layers, 24, 26. In some examples, the primers 34, 36 or 34', 36' (not shown in FIG. 7A through FIG. 7D and FIG. 7J through FIG. 7O) may be pre-grafted to the functionalized layer 24. Similarly, the primers 38, 40 or 38' or 40' (not shown in FIG. 7A through FIG. 7D and FIG. 7J through FIG. 7O) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 7K). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted after the second functionalized layer 26 is applied (e.g., at FIG. 7M or thereafter), as long as i) the functionalized layer 26 has different functional groups (than functionalized layer 24) for attaching the primers 38, 40 or 38', 40' or ii) unreacted functional groups of the functionalized layer 24 have been quenched, e.g., using the Staudinger reduction to amines or additional click reaction with a passive molecule such as hexynoic acid.

When grafting is performed during the method, grafting may be accomplished using any of the grafting techniques described herein.

Methods for Making the Flow Cell Architecture of FIG. 1C

FIG. 4A through 4G illustrate an example of the method for making the flow cell architecture of FIG. 1C, which includes multi-step protrusions 28 that support the first and second functionalized layers 24, 26.

Figures 4A, 4B, 4C, 4D, 4E, 4F, 4G, 5A, 5B, 5C, 5D, 5E:
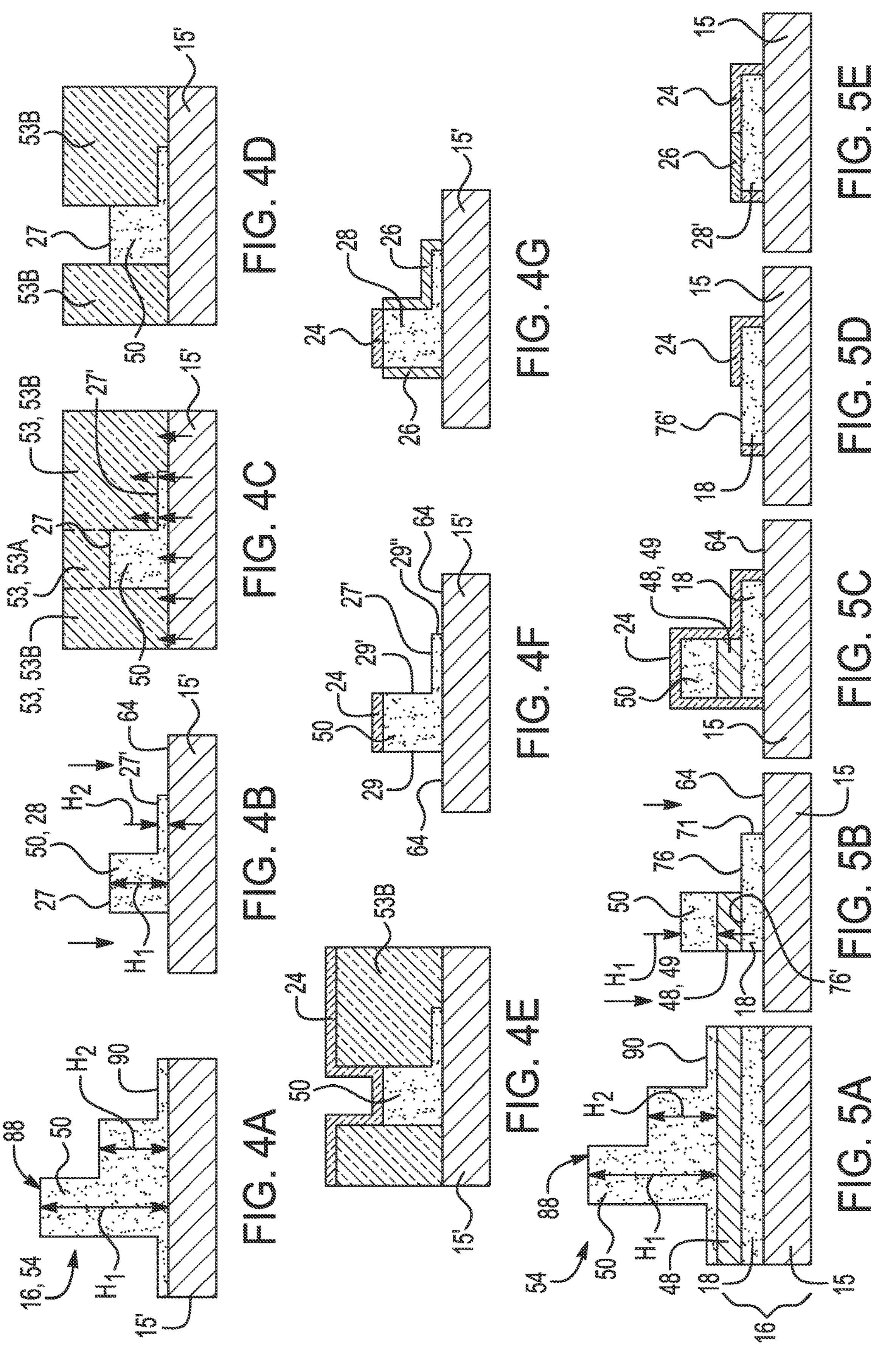
FIG. 4A through FIG. 4G are schematic views that illustrate one example of a method to generate the flow cell architecture shown in FIG. 1C, where
FIG. 5A through FIG. 5E are schematic views that illustrate one example of a method to generate the flow cell architecture shown in FIG. 1D, where

This method begins with a multi-layer stack 54 of materials, which includes a resin layer 50 positioned over a transparent base support 15', as shown in FIG. 4A. In this example, the multi-layer stack 54 is an example of the multi-layer structure 16 because the transparent base support 15' and the multi-step protrusions 28 formed from the resin layer 50 support the surface chemistry in the final flow cell.

The example shown in FIG. 4A through FIG. 4G generally includes imprinting a resin layer 50 of a multi-layer stack 54 to form a multi-height convex region 88 including a first region with a first height $H_1$ and a second region with a second height $H_2$ that is smaller than the first height $H_1$ (FIG. 4A). The multi-layer stack 54 may include the resin layer 50 over base support 15, 15', which in this example is a transparent base support 15'. In this example, the transparent base support 15' is selected so that it does not include surface groups that can react with a first functionalized layer 24 or a second functionalized layer 26. The method may further include utilizing the resin layer 50 to define the first functionalized layer 24 over a first portion of the resin layer 50 (FIG. 4E) or over a first portion of a second resin layer 18 positioned between the resin layer 50 and the base support 15, 15' (which is described in the FIG. 5 series); and applying the second functionalized layer 26 over a second portion of the resin layer 50 (FIG. 4G) or over a second portion of the second resin layer 18 positioned between the resin layer 50 and the base support 15, 15' (which is described in the FIG. 5 series).

In the example set forth in the FIG. 4 series, the multi-layer stack 54 may include the resin layer 50 positioned in direct contact with the transparent base support 15'. The resin layer 50 may be used to define the first functionalized layer 24 over the first portion (e.g., at surface 27 in FIG. 4D) of the resin layer 50. The method may further include utilizing the resin layer 50 to define the first functionalized layer 24 over the first portion of the resin layer 50, which may involve: etching the resin layer 50 to reduce the first height $H_1$ of the first region and the second height $H_2$ of the second region of the multi-height convex region 88 and to expose the transparent base support 15' around the multi-height convex region (FIG. 4B); developing a negative photoresist 53 through the base support 15' to define an insoluble negative photoresist 53B over the exposed base support 15' and over the second region (with height $H_2$) and to define a soluble negative photoresist 53A over the first region (with height $H_1$) (FIG. 4C); removing the soluble negative photoresist 53A to expose the first region (FIG. 4D); applying the first functionalized layer 24 over the first region and over the insoluble negative photoresist 53B, wherein the first region is the first portion (FIG. 4E); and removing the insoluble negative photoresist 53B and the first functionalized layer 24 thereon (FIG. 4F). Removing the insoluble negative photoresist 53B may expose the second portion (with height $H_2$) of the resin layer 50; and the second functionalized layer 26 may be applied over the second portion of the resin layer 50 (FIG. 4G).

To generate this multi-layer stack 54 (or multi-layer structure 16), the resin layer 50 is deposited over the base support 15, which, in this example, is the transparent base support 15' (i.e., is transparent to ultraviolet wavelengths used in backside exposure). Any transparent base support 15' may be used (e.g., glass, modified or functionalized glass, etc.) in the method shown in FIG. 4A through 4G.

The resin layer 50 may be any of the example resins set forth herein, and may be deposited using any suitable technique disclosed herein. For some deposition techniques, the resin may be mixed in a liquid carrier, such as propylene glycol monomethyl ether acetate (PGMEA), toluene, dimethyl sulfoxide (DMSO), tetrahydrofuran (THF), etc. In one example, the resin layer 50 is a lift-off resist. Examples of suitable lift-off resists include those that are commercially available from Kayaku Advanced Materials, Inc. (formerly MicroChem), which are based on a polymethylglutarimide platform. The lift-off resist may be spun on or otherwise deposited, cured, and subsequently removed at a desirable time in the process.

As shown in FIG. 4A, the resin layer 50 is imprinted to form a multi-height convex region 88 including a first region with a first height $H_1$ and a second region with a second height $H_2$ that is smaller than the first height $H_1$. Any suitable imprinting technique may be used. In one example, a working stamp and curing may be used as described in reference to FIG. 3B. In this example method, the working stamp does not extend through the entire depth of the resin layer 50, and thus the underlying transparent base support 15' is not exposed after imprinting, as shown in FIG. 4A. Portions 90 of the resin layer 50 around the multi-height convex region 88 are thinner than each of the first and second heights $H_1$ and $H_2$.

At FIG. 4B, the resin layer 50 (i.e., the multi-height convex region 88 and the portions 90) is etched to expose the transparent base support 15' beneath the portions 90. The transparent base support 15' acts as an etch stop. In this example, etching exposes the portions 64 of the transparent base support 15', and the portion of the transparent base support 15' that underlies the multi-height convex region 88 remains unetched. This effectively extends the multi-height convex region 88 down to the transparent base support 15' and forms the multi-step protrusion 28 including surface 27 at the first region and surface 27' at the second region. It is to be understood that because the entire resin layer 50 is exposed to etching, the first and second heights $H_1$ and $H_2$ are reduced, e.g., by an amount that equates to the thickness of the portions 90. Because the portions 90 of the resin layer 50 around the multi-height convex region 88 are thinner than each of the first and second heights $H_1$ and $H_2$, the transparent base support 15' underlying these portions 90 will be exposed, and etching will be stopped, before the multi-height convex region 88 is etched away. Dry etching techniques, such as with a $CF_4$ plasma or a mixture of 90% $CF_4$ and 10% 02 plasma, may be used.

The multi-layer stack 54 is then used to develop a negative photoresist 53 through the transparent base support 15' to define an insoluble negative photoresist 53B at the portion(s) 64 of the transparent base support 15' and over the second region (with height $H_2$), e.g., over surface 27'.

Negative photoresist deposition and development is shown in FIG. 4C and FIG. 4D, and may be performed as described herein in reference to FIG. 3D. Any example negative photoresist 53 may be used, and any deposition technique may be used to deposit the negative photoresist 53 over the multi-layer stack 54 shown in FIG. 4C. In this example, it is desirable for the insoluble negative photoresist 53B to remain on the portion(s) 64 of the transparent base support 15' and over the second region $H_2$ (at surface 27'), and to be removed from the first region (from surface 27) of the multi-height convex 88/protrusion 28. As such, in the example shown in FIG. 4C, the light may be directed through the transparent base support 15'. The negative photoresist 53 on the portion 64 and on the second region $H_2$ will be exposed to the light and will become insoluble. The first region $H_1$ of the multi-height convex 88 after etching can be configured to block at least 75% of light that is transmitted through the transparent base support 15', thus at least substantially preventing the light from reaching the negative photoresist 53 that is positioned over the first region $H_1$ (over surface 27 of the protrusion 28'). It will be understood that due to the varying heights of the multi-height convex 88/protrusion 28', the negative photoresist 53 over the first portion (e.g., first region $H_1$) will not be exposed to the light such that the negative photoresist 53 will remain soluble (53A), whereas the negative photoresist 53 over the second region (e.g., second region $H_2$) will be exposed to the light and become insoluble (53B). The portions not exposed to the light energy (i.e., over first region $H_1$) remain soluble and are removed with the developer. The multi-layer stack 54 after negative photoresist 53 development is shown in FIG. 4D.

As shown at FIG. 4E, the first functionalized layer 24 is then applied over the multi-layer stack 54. More particularly, the first functionalized layer 24 is applied over a top surface 27 of the first portion of the resin layer 50 and over the insoluble negative photoresist 53B. The first functionalized layer 24 may be applied using any suitable deposition technique.

Removal of the insoluble negative photoresist 53B may then be performed to re-expose the second portion of the resin layer 50 (i.e., second region with height $H_2$) and portion(s) 64 of the transparent base support 15'. The insoluble negative photoresist 53B may be removed using any suitable remover as described herein. As shown in FIG. 4F, this process removes the insoluble negative photoresist 53B and the functionalized layer 24 that overlies the insoluble negative photoresist 53B.

As shown in FIG. 4G, the second functionalized layer 26 may then be applied over the top surface 27' of the second portion of the resin layer 50. As depicted in FIG. 4F and FIG. 4G, the protrusion 28 includes sidewalls, such as one (reference numeral 29) positioned between the top surface 27 of the first region of the resin layer 50 and the portion 64 of the transparent base support 15', and another one (reference numeral 29") positioned between the top surface 27' of the second region of the resin layer 50 and the portion 64 of the transparent base support 15'. The protrusion 28 also includes a sidewall 29' that is positioned between the higher top surface 27 and the lower top surface 27' of the respective first and second regions of the resin layer 50. The second functionalized layer 26 covalently attaches to the second region of the resin layer 50 at the top surface 27', and can also covalently attach to other exposed sidewall(s) 29, 29" of the resin layer 50/protrusion 28. This configuration may reduce, but not eliminate the padlock like conformation.

The second functionalized layer 26 does not attach (e.g., covalently bond) to the exposed portions 64 of the transparent base support 15' because the transparent base support 15' does not include surface groups that can react with the second functionalized layer 26. As such, the second functionalized layer 26 that gets deposited on the portions 64 can be readily washed away. The second functionalized layer 26 may be applied using any suitable deposition technique performed under high ionic strength (e.g., in the presence of 10×PBS, NaCl, KCl, etc.). Under high ionic strength, the second functionalized layer 26 does not deposit on or adhere to the first functionalized layer 24. As such, the second functionalized layer 26 does not contaminate the first functionalized layer 24.

The resulting structure includes the multi-height protrusion 28, which in this example includes the resin layer 50. This multi-height protrusion 28 supports the functionalized layers 24, 26.

While a single multi-height protrusion 28' is shown in FIG. 4G, it is to be understood that the method may generate an array of multi-height protrusion 28' across the transparent base support 15'.

While not shown, the method described in reference to FIG. 4A through FIG. 4G also includes attaching respective primer sets 30, 32 to the functionalized layers 24, 26. In some examples, the primers 34, 36 or 34', 36' (not shown in FIG. 4A through FIG. 4G) may be pre-grafted to the functionalized layer 24. Similarly, the primers 38, 40 or 38', 40' (not shown in FIG. 4A through FIG. 4G) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 4E). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted after the second functionalized layer 26 is applied (e.g., at FIG. 4G), as long as i) the second functionalized layer 26 has different functional groups (than the first functionalized layer 24) for attaching the primers 38, 40 or 38', 40' or ii) any unreacted functional groups of the first functionalized layer 24 have been quenched, e.g., using the Staudinger reduction to amines or additional click reaction with a passive molecule such as hexynoic acid.

When grafting is performed during the method, grafting may be accomplished using any suitable grafting techniques.

Methods for Making the Flow Cell Architecture of FIG. 1D

FIG. 5A through 5E illustrate an example of the method for making the flow cell architecture of FIG. 1D, which includes a protrusion 28' that supports the first and second functionalized layers 24, 26.

Similar to some of the other methods disclosed herein, this method also begins with a multi-layer stack 54 of materials, which includes a resin layer 50 positioned over a sacrificial layer 48, which is positioned over a second resin layer 18, which is positioned over the base support 15. In this example, the multi-layer stack 54 includes an example of the multi-layer structure 16 because the base support 15 and the protrusions 28' formed from the second resin layer 18 support the surface chemistry in the final flow cell.

The example shown in FIG. 5A through FIG. 5E generally includes imprinting a resin layer 50 of a multi-layer stack 54 to form a multi-height convex region 88 including a first region with a first height $H_1$ and a second region with a second height $H_2$ that is smaller than the first height $H_1$ (FIG. 5A). The multi-layer stack 54 may include the resin layer 50 over a base support 15 that does not include surface groups that can react with a first functionalized layer 24 or a second functionalized layer 26. The method further includes utilizing the resin layer 50 to define the first functionalized layer 24 over a first portion of the resin layer 50 (as previously described in the FIG. 4 series) or over a first portion of a second resin layer 18 positioned between the resin layer 50 and the base support 15 (FIG. 5D); and applying the second functionalized layer 26 over a second portion of the resin layer 50 (as previously described in the FIG. 4 series) or over a second portion of the second resin layer 18 positioned between the resin layer 50 and the base support 15 (FIG. 5E).

In this example, the multi-layer stack 54 may include the resin layer 50 positioned over the sacrificial layer 48 positioned over the second resin layer 18 positioned over the base support 15. The resin layer 50 may be used to define the first functionalized layer 24 over the first portion 76 of the second resin layer 18. The method may further include utilizing the resin layer 50 to define the first functionalized layer 24 over the first portion 76 of the second resin layer 18 and may involve: selectively etching portions of the multi-layer stack 54 around the multi-height convex region 88 to expose the base support 15 (FIG. 5B); selectively etching the multi-height convex region 88 to remove the second region and a portion of the sacrificial layer 48 underlying the second region, thereby exposing the first portion 76 of the second resin layer 18 and whereby a second portion 76' of the second resin layer 18 may remain covered by a second portion 49 of the sacrificial layer 48 and the first region of the multi-height convex region 88 (FIG. 5B). The method may also include applying the first functionalized layer 24 over the first portion 76 of the second resin layer 18 and the first region of the multi-height convex region 88 (FIG. 5C); and lifting off the second portion 49 of the sacrificial layer 48, whereby the first region of the multi-height convex region 88 and the first functionalized layer 24 over the first region may be removed. In these examples, lifting off the second portion 49 of the sacrificial layer 48 may expose the second portion 76' of the second resin layer 18 (FIG. 5D); and the second functionalized layer 26 may be applied over the second portion 76' of the second resin layer 18 (FIG. 5E).

To generate this multi-layer stack 54, the second resin layer 18 is deposited over the base support 15. The sacrificial layer 48 may then be deposited over the second resin layer 18, and the resin layer 50 is then deposited over the sacrificial layer 48. The resin layer 50 positioned over the sacrificial layer 48 positioned over the second resin layer 18 positioned over the base support 15 is shown in FIG. 5A.

Any base support 15 may be used in the method shown in FIG. 5A through 5E. In these examples, the base support 15 may or may not be UV transparent.

Any example of the sacrificial layer 48 may be used (e.g. aluminum, copper, gold, poly(methyl methacrylate) (PMMA), a lift-off resist (LOR), etc.) and it may be deposited using any suitable technique disclosed herein.

The resin layer 50 and second resin layer 18 may be any of the example resins set forth herein, and may be deposited using any suitable technique disclosed herein. For some deposition techniques, the resin may be mixed in a liquid carrier, such as propylene glycol monomethyl ether acetate (PGMEA), toluene, dimethyl sulfoxide (DMSO), tetrahydrofuran (THF), etc. The second resin layer 18 may be deposited and cured. The resin layer 50 is deposited and imprinted as described herein.

As shown in FIG. 5A, the resin layer 50 is imprinted to form a multi-height convex region 88 including a first region with a first height $H_1$ and a second region with a second height $H_2$ that is smaller than the first height $H_1$. Any suitable imprinting technique may be used. In one example, a working stamp and curing may be used as described in reference to FIG. 3B. In this example method, the working stamp does not extend through the entire depth of the resin layer 50, and thus the underlying sacrificial layer 48 is not exposed after imprinting, as shown in FIG. 5A, where portions 90 of the resin layer 50 around the multi-height convex region 88 are thinner than each of the first and second heights $H_1$ and $H_2$.

At FIG. 5B, the multi-layer stack 54 is selectively etched around the multi-height convex region 88 to expose the base support 15. In this example, etching exposes the portions 64 of the base support 15, and portions of the multi-layer stack that underlie the multi-height convex region 88 remain unetched. This effectively extends the multi-height convex region 88 down to the base support 15.

In this example, some of the resin layer 50 may be etched, followed by a portion of the sacrificial layer 48, and then some more of the resin layer 50 and a portion of the second resin layer 18. Any exposed areas of the layers around the around the multi-height convex region 88 may be etched during this process, as indicated by the downward arrows in FIG. 5B.

It is to be understood that the entire resin layer 50 may be exposed to etching, and thus the first and second heights $H_1$ and $H_2$ may be reduced, e.g., by the thickness of the portions 90. However, because the portions 90 of the resin layer 50 around the multi-height convex region 88 are thinner than each of the first and second heights $H_1$ and $H_2$, the sacrificial layer 48 (which acts as an etch stop) underlying these portions 90 will be exposed before the multi-height convex region 88 is etched away.

Once the portions of the sacrificial layer 48 that underlie the portions 90 are exposed, they may be etched. Sacrificial layer 48 etching may take place until the second resin layer 18 (underling the portions 90) is exposed. Then, the resin layer 50 and the second resin layer 18 may be etched until portions 64 of the base support 15 are exposed. Due to the height differences of the resin layer 50, the portion of the sacrificial layer 48 underlying the first height $H_1$ remains at least substantially intact after the second round of resin 50, 18 etching is complete. The multi-layer stack resulting from these etching processes is also shown in FIG. 5B.

Different etching techniques may be used for the resin layers 18 and 50 (including portions 90) and the underlying sacrificial layer 48. In one example, dry etching (e.g., with a mixture of 90% $CF_4$ and 10% $O_2$ plasma) is used for the resin layer 50 or the resin layers 18 and 50, and chlorine-based plasma (e.g., $BCl_3$+$Cl_2$) is used for the sacrificial layer 48. The sacrificial layer 48 effectively acts as an etch stop for the resin layer 50 etching, the second resin layer 18 effectively acts as an etch stop for the sacrificial layer 48 etching, and the base support 15 effectively acts as an etch stop for the second resin layer 18 etching.

During the etching processes, the second region (with height $H_2$) of the resin layer 50 and a portion of the sacrificial layer 48 underlying the second region are removed, thereby exposing a portion 76 of the second resin layer 18. The multi-layer stack resulting from this etching process is also shown in FIG. 5B.

As shown at FIG. 5C, the first functionalized layer 24 is then applied over the multi-layer stack. More particularly, the first functionalized layer 24 is applied to the remaining resin layer 50 positioned over the remaining sacrificial layer 48 positioned over the second resin layer 18 (i.e., the first region of the multi-height convex 88), and over the exposed portion 76 of the second resin layer 18. The first functionalized layer 24 covalently attaches to the exposed portion 76 and can also covalently attach to other exposed surfaces 71 (e.g., exterior sidewalls) of the second resin layer 18. The first functionalized layer 24 does not attach (e.g., covalently bond) to the exposed portions 64 of the base support 15 because the base support 15 does not include surface groups that can react with the first functionalized layer 24. During the formation of the multi-layer stack 54 (e.g., at FIG. 5A), the second resin layer 18 may be activated using silanization to generate surface groups that can react with the functionalized layers 24 and 26. As such, the functionalized layer 24 covalently attaches to the portion 76 of the second resin layer 18, and can also covalently attach to other exposed surfaces 71 (e.g., exterior sidewalls) of the second resin layer 18.

The first functionalized layer 24 may be applied using any suitable deposition technique. Because the functionalized layer 24 does not covalently attach to the exposed portions 64 of the base support 15, the functionalized layer 24 can be washed away from the portions 64 without deleteriously affecting the covalently bound functionalized layer 24.

The sacrificial layer 48 may then be exposed to a wet lift-off process. As shown in FIG. 5D, this lift-off process removes i) at least 99% of the sacrificial layer 48, ii) the remaining resin layer 50, and iii) the first functionalized layer 24 thereon. This process exposes other portion(s) 76' of the second resin layer 18. The first functionalized layer 24 covalently attaches to the portion 76 and exposed surfaces 71 (e.g., exterior sidewalls) of the second resin layer 18, and thus is not deleteriously affected during removal of the sacrificial layer 48.

The second functionalized layer 26 is then applied over the other (second) portion 76' of the second resin layer 18, as shown at FIG. 5E. The second functionalized layer 26 may be applied using any suitable deposition technique, and when the deposition is performed under high ionic strength (e.g., in the presence of 10×PBS, NaCl, KCl, etc.), the second functionalized layer 26 does not deposit on or adhere to the first functionalized layer 24. As such, the portion 76' receives the second functionalized layer 26.

The resulting structure includes the protrusion 28, which in this example includes the second resin layer 18. This protrusion 28 supports the functionalized layers 24, 26.

While not shown, the method described in reference to FIG. 5A through FIG. 5E also includes attaching respective primer sets 30, 32 to the functionalized layers 24, 26. In some examples, the primers 34, 36 or 34', 36' (not shown in FIG. 5A through FIG. 5E) may be pre-grafted to the functionalized layer 24. Similarly, the primers 38, 40 or 38', 40' (not shown in FIG. 5A through FIG. 5E) may be pre-grafted to the functionalized layer 26. In these examples, additional primer grafting is not performed.

In other examples, the primers 34, 36 or 34', 36' are not pre-grafted to the functionalized layer 24. In these examples, the primers 34, 36 or 34', 36' may be grafted after the functionalized layer 24 is applied (e.g., at FIG. 5C). In these examples, the primers 38, 40 or 38', 40' may be pre-grafted to the second functionalized layer 26. Alternatively, in these examples, the primers 38, 40 or 38', 40' may not be pre-grafted to the second functionalized layer 26. Rather, the primers 38, 40 or 38', 40' may be grafted after the second functionalized layer 26 is applied (e.g., at FIG. 5E), as long as i) the second functionalized layer 26 has different functional groups (than the first functionalized layer 24) for attaching the primers 38, 40 or 38', 40' or ii) any unreacted functional groups of the first functionalized layer 24 have been quenched, e.g., using the Staudinger reduction to amines or additional click reaction with a passive molecule such as hexynoic acid.

When grafting is performed during the method, grafting may be accomplished using any suitable grafting techniques.

In each of the examples disclosed herein, surface activation may be performed (e.g., to the base support 14, 14', or to the other (e.g., resin) layer 18) prior to the application of the functionalized layers 24, 26. When the functionalized layers 24, 26 are different functionalized silane materials, surface activation may not be performed depending upon the underlying base support 14, 14', 15, 15' or other layer 18, 72, etc.

Any of the methods described herein may be performed as a roll to roll process. As used herein, "roll to roll" refers to the manipulation of an elongated substrate as it is transferred from one spool to another. The various processes of the methods disclosed herein, e.g., patterning, etching, etc. may be performed between spools. An example roll to roll process involves the surface of the substrate being continuously patterned with micro-scale or nano-scale patterns as the surface moves past a patterning device while being unspooled from one roll and spooled onto another roll.

ADDITIONAL NOTES

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

Reference throughout the specification to “one example”, “another example”, “an example”, and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

It is to be understood that the ranges provided herein include the stated range and any value or sub-range within the stated range, as if such values or sub-ranges were explicitly recited. For example, a range of about 400 nm to about 1 μm (1000 nm), should be interpreted to include not only the explicitly recited limits of about 400 nm to about 1 μm, but also to include individual values, such as about 708 nm, about 945.5 nm, etc., and sub-ranges, such as from about 425 nm to about 825 nm, from about 550 nm to about 940 nm, etc.

Furthermore, when “about” and/or “substantially” are/is utilized to describe a value, they are meant to encompass minor variations (up to +/−10%) from the stated value.

While several examples have been described in detail, it is to be understood that the disclosed examples may be modified. Therefore, the foregoing description is to be considered non-limiting.

What is claimed is:

1. A method, comprising:

imprinting a resin layer of a multi-layer stack to form a multi-height convex region including a first region with a first height and a second region with a second height that is smaller than the first height, wherein the multi-layer stack includes the resin layer over a sacrificial layer over a transparent substrate;

selectively etching portions of the multi-layer stack around the multi-height convex region to expose a portion of the transparent substrate;

utilizing the multi-layer stack to develop a curable layer through the transparent substrate to define a cured layer over the exposed portion of the transparent substrate;

simultaneously etching i) the multi-height convex region to remove the resin layer and a portion of the sacrificial layer underlying the second region of the multi-height convex region, thereby exposing a second portion of the transparent substrate and whereby a third portion of the transparent substrate remains covered by a remaining portion of the sacrificial layer, and ii) the cured layer such that it is substantially co-planar with the remaining portion of the sacrificial layer, thereby forming a depression extending to the second portion of the transparent substrate; and utilizing the remaining portion of the sacrificial layer to define first and second functionalized layers over different regions of the depression.

2. The method as defined in claim 1, wherein a thickness of the sacrificial layer corresponds to a depth of the depression.

3. The method as defined in claim 1, further comprising silanizing the second portion of the transparent substrate prior to utilizing the remaining portion of the sacrificial layer to define the first and second functionalized layers over different regions of the depression.

4. The method as defined in claim 1, wherein prior to utilizing the remaining portion of the sacrificial layer to define the first and second functionalized layers over different regions of the depression, the method further comprises applying the first functionalized layer over the cured layer, the remaining portion of the sacrificial layer, and the second portion of the transparent base support.

5. The method as defined in claim 4, wherein utilizing the remaining portion of the sacrificial layer to define the first and second functionalized layers over different regions of the depression involves:

lifting off the remaining portion of the sacrificial layer, thereby exposing the third portion of the transparent base support;

applying the second functionalized layer over the third portion of the transparent base support; and removing the first functionalized layer from the cured layer.

6. The method as defined in claim 5, further comprising silanizing the third portion of the transparent base support prior to applying the second functionalized layer.

7. The method as defined in claim 4, wherein utilizing the remaining portion of the sacrificial layer to define the first and second functionalized layers over different regions of the depression involves:

applying a negative photoresist over the first functionalized layer;

directing, through the transparent base support, an ultraviolet light dosage, thereby forming an insoluble negative photoresist over a portion of the first functionalized layer that overlies the second portion of the transparent base support and a soluble negative photoresist over the cured layer and the remaining portion of the sacrificial layer;

removing the soluble negative photoresist;

etching the remaining portion of the sacrificial layer, thereby exposing the third portion of the transparent base support;

applying the second functionalized layer over the insoluble negative photoresist, the third portion of the transparent base support, and another portion of the first functionalized layer that overlies the cured layer;

removing the insoluble negative photoresist; and removing the first and second functionalized layers from the cured layer.

8. The method as defined in claim 7, further comprising silanizing the third portion of the transparent base support prior to applying the second functionalized layer.

* * * * *

```
SEQUENCE LISTING

Sequence total quantity: 2
SEQ ID NO: 1            moltype = DNA  length = 20
FEATURE                 Location/Qualifiers
source                  1..20
                        mol_type = other DNA
                        organism = synthetic construct
SEQUENCE: 1
aatgatacgg cgaccaccga                                                20

SEQ ID NO: 2            moltype = DNA  length = 21
FEATURE                 Location/Qualifiers
source                  1..21
                        mol_type = other DNA
                        organism = synthetic construct
SEQUENCE: 2
caagcagaag acggcatacg a                                              21
```